United States Patent
Chittibabu et al.

(10) Patent No.: US 6,913,713 B2
(45) Date of Patent: Jul. 5, 2005

(54) PHOTOVOLTAIC FIBERS

(75) Inventors: Kethinni Chittibabu, Nashua, NH (US); Robert Eckert, Lexington, MA (US); Russell Gaudiana, Merrimack, NH (US); Lian Li, North Chelmsford, MA (US); Alan Montello, West Newbury, MA (US); Edmund Montello, Rockport, MA (US); Paul Wormser, Harvard, MA (US)

(73) Assignee: Konarka Technologies, Inc., Lowell, MA (US)

( * ) Notice: Subject to any disclaimer, the term of this patent is extended or adjusted under 35 U.S.C. 154(b) by 34 days.

(21) Appl. No.: 10/351,607

(22) Filed: Jan. 24, 2003

(65) Prior Publication Data

US 2005/0040374 A1 Feb. 24, 2005

Related U.S. Application Data

(63) Continuation-in-part of application No. 10/057,394, filed on Jan. 25, 2002, now Pat. No. 6,706,963.
(60) Provisional application No. 60/400,289, filed on Jul. 31, 2002, provisional application No. 60/368,832, filed on Mar. 29, 2002, provisional application No. 60/353,138, filed on Feb. 1, 2002, and provisional application No. 60/351,691, filed on Jan. 25, 2002.

(51) Int. Cl.[7] .......................... H01B 1/00; H01L 31/00; H01M 6/00; B32B 19/00

(52) U.S. Cl. ................ 252/501.1; 252/507; 252/511; 252/301.16; 136/251; 136/257; 136/259; 257/43; 257/451; 205/57; 205/122; 429/111; 428/357; 428/369

(58) Field of Search .................. 252/501.1, 507, 252/511, 301.16, 502; 136/251, 259, 263, 257; 257/43, 431, 40; 205/57, 122; 429/111; 428/357, 369

(56) References Cited

U.S. PATENT DOCUMENTS

| | | |
|---|---|---|
| 3,037,122 A | 5/1962 | Strother |
| 3,069,487 A | 12/1962 | Strother |
| 3,206,831 A | 9/1965 | Strother |
| 3,206,832 A | 9/1965 | Strother |
| 3,679,949 A | 7/1972 | Uekusa et al. |
| 3,969,163 A | 7/1976 | Wakefield |
| 3,984,256 A | 10/1976 | Fletcher et al. |
| 4,080,488 A | 3/1978 | Chen et al. |
| 4,385,102 A | 5/1983 | Fitzky et al. |
| 4,436,558 A | 3/1984 | Russak |
| 4,492,743 A | 1/1985 | Howe |
| 4,684,537 A | 8/1987 | Graetzel et al. |
| 4,872,925 A | 10/1989 | McMaster |
| 4,913,744 A | 4/1990 | Hoegl et al. |
| 4,927,721 A | 5/1990 | Gratzel et al. |
| 5,084,365 A | 1/1992 | Gratzel et al. |
| 5,178,685 A | 1/1993 | Borenstein et al. |
| 5,331,183 A * | 7/1994 | Sariciftci et al. ............. 257/40 |
| 5,350,644 A | 9/1994 | Graetzel et al. |
| 5,385,614 A | 1/1995 | Albright et al. |
| 5,437,736 A * | 8/1995 | Cole ........................ 136/259 |

(Continued)

FOREIGN PATENT DOCUMENTS

| | | |
|---|---|---|
| DE | 42 21 084 A1 | 1/1994 |
| DE | G 93 08 513.3 | 3/1994 |
| EP | 0 739 020 A2 | 10/1996 |

(Continued)

OTHER PUBLICATIONS

Baps et al, "Ceramic based Solar Cells in fiber Form", Euro Ceramics 7th conference, Brugge, Belgium, Sep. 9–13, 2001, vol. 206–213, pp. 937–940.*

(Continued)

*Primary Examiner*—Mark Kopec
(74) *Attorney, Agent, or Firm*—Fish & Richardson P.C.

(57) ABSTRACT

Photovoltaic materials and methods of photovoltaic cell fabrication provide a photovoltaic cell in the form of a fiber. These fibers may be formed into a flexible fabric or textile.

30 Claims, 28 Drawing Sheets

U.S. PATENT DOCUMENTS

| | | | |
|---|---|---|---|
| 5,441,827 A | 8/1995 | Gratzel et al. | |
| 5,454,879 A | 10/1995 | Bolger | |
| 5,454,880 A | 10/1995 | Sariciftci et al. | |
| 5,463,057 A | 10/1995 | Graetzel et al. | |
| 5,474,621 A | 12/1995 | Barnard | |
| 5,482,570 A | 1/1996 | Saurer et al. | |
| 5,525,440 A | 6/1996 | Kay et al. | |
| 5,569,561 A | 10/1996 | Exnar et al. | |
| 5,637,156 A | 6/1997 | Kubota et al. | |
| 5,641,362 A | 6/1997 | Meier | |
| 5,728,487 A | 3/1998 | Gratzel et al. | |
| 5,789,592 A | 8/1998 | Gratzel et al. | |
| 5,830,597 A | 11/1998 | Hoffmann et al. | |
| 5,881,083 A | 3/1999 | Diaz-Garcia et al. | |
| 5,885,368 A | 3/1999 | Lupo et al. | |
| 5,902,416 A | 5/1999 | Kern et al. | |
| 5,906,004 A | 5/1999 | Lebby et al. | |
| 5,986,206 A | 11/1999 | Kambe et al. | |
| 6,013,871 A | 1/2000 | Curtin | |
| 6,024,807 A * | 2/2000 | Pappas et al. | 148/513 |
| 6,043,428 A | 3/2000 | Han et al. | |
| 6,067,184 A | 5/2000 | Bonhote et al. | |
| 6,067,313 A | 5/2000 | Cafarella et al. | |
| 6,069,313 A | 5/2000 | Kay | |
| 6,075,203 A | 6/2000 | Wang et al. | |
| 6,080,690 A | 6/2000 | Lebby et al. | |
| 6,084,176 A | 7/2000 | Shiratsuchi et al. | |
| 6,121,540 A | 9/2000 | Takeda et al. | |
| 6,130,378 A | 10/2000 | Hatano et al. | |
| 6,175,075 B1 | 1/2001 | Shiotsuka et al. | |
| 6,232,547 B1 | 5/2001 | Meissner et al. | |
| 6,239,355 B1 | 5/2001 | Salafsky | |
| 6,245,988 B1 | 6/2001 | Gratzel et al. | |
| 6,278,056 B1 | 8/2001 | Sugihara et al. | |
| 6,281,429 B1 | 8/2001 | Takada et al. | |
| 6,288,324 B1 | 9/2001 | Komori et al. | |
| 6,288,325 B1 | 9/2001 | Jansen et al. | |
| 6,288,326 B1 | 9/2001 | Hayashi et al. | |
| 6,291,763 B1 * | 9/2001 | Nakamura | 136/256 |
| 6,310,282 B1 | 10/2001 | Sakurai et al. | |
| 6,335,480 B1 | 1/2002 | Bach et al. | |
| 6,350,946 B1 | 2/2002 | Miyake et al. | |
| 6,376,765 B1 | 4/2002 | Wariishi et al. | |
| 6,384,321 B1 | 5/2002 | Mikoshiba et al. | |
| 6,426,827 B1 | 7/2002 | Bonhote et al. | |
| 6,580,027 B2 * | 6/2003 | Forrest et al. | 136/263 |
| 2001/0004901 A1 | 6/2001 | Yamanaka et al. | |
| 2001/0027806 A1 | 10/2001 | Yamanaka et al. | |
| 2001/0032665 A1 | 10/2001 | Han et al. | |
| 2003/0056821 A1 | 3/2003 | Chittibabu et al. | |
| 2003/0127130 A1 | 7/2003 | Murai et al. | |

FOREIGN PATENT DOCUMENTS

| | | |
|---|---|---|
| EP | 195 28 401 A1 | 2/1997 |
| EP | 0901175 | 9/1998 |
| EP | 1 033 762 A2 | 9/2000 |
| EP | 1087412 A2 | 3/2001 |
| EP | 1 089 305 A2 | 4/2001 |
| EP | 1 209 708 A1 | 5/2002 |
| JP | 59-125670 | 7/1984 |
| JP | 59-144177 | 8/1984 |
| JP | 2000-294306 A | 10/2000 |
| WO | WO91/16719 | 10/1991 |
| WO | WO 93/18532 | 9/1993 |
| WO | WO 96/00198 | 1/1996 |
| WO | WO 96/29715 | 9/1996 |
| WO | WO 00/42674 | 7/2000 |
| WO | WO 00/76660 A1 | 12/2000 |
| WO | WO 01/25316 A1 | 4/2001 |

OTHER PUBLICATIONS

O'Regan and Gratzel, "A Low–Cost, High–Efficiency Solar Cell Based on Dye–Sensitized Colloidal $TiO_2$ Films," *Nature* 353, 737–739 (1991).

Fan and Bard, "Spectral Sensitization of the Heterogeneous Photocatalytic Oxidation of Hydroquinone in Aqueous Solutions at Phthalocyanine—Coated $TiO_2$ Powders," *American Chemical Society* 101, 6139–6140 (1979).

Borgarello et al., "Sustained Water Cleavage by Visible Light," *Journal of American Society* 103, 6324–6329 (1981).

Duonghong et al., Integrated Systems for Water Clevage by Visible Light: Sensitization of $TiO_2$ Particles by Surface Derivation with Ruthenium Complexes,: *Helvetica Chimica Acta* 67, 1012–118 (1984).

Moser and Gratzel, "Photosensitized Electron Injection in Colloidal Semiconductors," *Journal American Chemistry Society* 106, 6557–6564 (1984).

Kalyanasundaram et al., "Sensitization of $TiO_2$ in the Visible Light Region Using Zinc Porphyrins," *J. Phys. Chem.* 91, 2342–2347 (1987).

Argazzi et al., "Light–induced charge separation across Ru(II)–modified nanocrystalline $TiO_2$ interfaces with phenothiazin donors," *J. Phys. Chem. B* 101, 2591–2597 (1997).

Bonhote et al., "Efficient lateral electron transport inside a monolayer of atomic amines anchored on nanocrystalline metal oxide films," *J. Phys. Chem. B* 102, 1498–1507 (1998).

Bonhote et al., "Long–lived photoinduced charge separation and redox–type photochromism on mesoporous oxide films sensitized by molecular dyads," *J. Am. Chem. Soc.* 121, 132401336 (1991).

Patent Cooperation Treaty (PCT) International Search Report; International Application No. PCT/US03/02094; mailed Sep. 23, 2003.

Patent Cooperatioin Treaty (PCT) International Search Report; International Application No. PCT/US03/02261; mailed Sep. 26, 2003.

Baps et al., "Ceramic Based Solar Cells in Fiber Form," *Key Engineering Materials*, 206–213, 2002, pp. 937–940.

Blum et al., "Nanocomposites by Covalent Bonding between Inorganic Nanoparticles and Polymers," *Materials Research Society Symposium Proceedings*, 676, 2001, pp. Y1.8.1–Y1.8.6.

Kang et al., "Enhanced Stability of Photocurrent–Voltage Curves in Ru(II)–Dye–Sensitized Nanocrystalline $TiO_2$ Electrodes with Carboxylic Acids," *Journal of The Electrochemical Society*, 147, (8), 2000, pp. 3049–3053.

Mosurkal et al., "Rod–like Dinuclear Ruthenium Complexes for Dye–sensitized Photovoltaics," *Materials Research Society Symposium Proceedings*, 708, 2002, pp. 367–373.

Nazeeruddin et al., "Conversion of Light into Electricity with Trinuclear Ruthenium Complexes Adsorbed on Textured $TiO_2$ Films," *Helvetica Chimica Acta*, 73, 1990, pp. 1788–1803.

Zuo et al., "Photo–rechargable battery with $TiO_2$/ carbon fiber electrodes prepared by laser deposition," *Solar Energy Materials & Solar Cells*, 62, 2000, pp. 133–142.

Annex to Form PCT/ISA/206; International Application No. PCT/US03/02355.

Annex to Form PCT/ISA/206; International Application No. PCT/US03/02263.

* cited by examiner

PHOTOVOLTAIC FIBERS

CROSS-REFERENCE TO RELATED APPLICATION

This application is a continuation-in-part of U.S. patent application Ser. No. 10/057,394 filed on Jan. 25, 2002, now U.S. Pat No. 6,706,963 the entire disclosure of which is herein incorporated by reference. This application also claims the benefits of and priority to U.S. Provisional Patent Application Ser. No. 60/351,691 filed on Jan. 25, 2002, to U.S. Provisional Patent Application Ser. No. 60/353,138 filed on Feb. 1, 2002, to U.S. Provisional Patent Application Ser. No. 60/368,832 filed on Mar. 29, 2002, and to U.S. Provisional Patent Application Ser. No. 60/400,289 filed on Jul. 31, 2002, all of which are owned by the assignee of this instant application and the disclosures of which are incorporated herein by reference in their entireties.

FIELD OF THE INVENTION

The invention relates generally to the field of photovoltaic devices, and more specifically to photovoltaic fibers.

BACKGROUND OF THE INVENTION

Thin film solar cells that are composed of percolating networks of liquid electrolyte and dye-coated sintered titanium dioxide were developed by Dr. Michael Grätzel and coworkers at the Swiss Federal Institute of Technology. These photovoltaic devices fall within a general class of cells referred to as dye sensitized solar cells ("DSSCs"). Conventionally, fabrication of DSSCs requires a high temperature sintering process (> about 400° C.) to achieve sufficient interconnectivity between the nanoparticles and enhanced adhesion between the nanoparticles and a transparent substrate. Although the photovoltaic cells of Grätzel are fabricated from relatively inexpensive raw materials, the high temperature sintering technique used to make these cells limits the cell substrate to rigid transparent materials, such as glass, and consequently limits the manufacturing to a batch process. Furthermore, the rigid substrate precludes the incorporation of these DSSCs into flexible coverings for commercial, industrial, agricultural, and/or military applications.

SUMMARY OF THE INVENTION

The invention, in one embodiment, addresses the deficiencies of the prior art by providing a photovoltaic cell that may be fabricated as, or on, a flexible fiber. In addition, the invention provides photovoltaic cells and methods of photovoltaic cell fabrication that facilitate the manufacture of photovoltaic materials as fibers by a continuous manufacturing process. In accordance with the invention, flexible photovoltaic fibers may be incorporated into a flexible fabric or textile.

In one aspect, the invention provides a photovoltaic material including a fiber core having an outer surface, a light-transmissive electrical conductor, a photosensitized nanomatrix material, and a charge carrier material, where the photosensitized nanomatrix material and the charge carrier material are disposed between the outer surface of the fiber core and the light-transmissive electrical conductor. In one embodiment of the photovoltaic material, the fiber core has a glass transition temperature of less than about 300° C. In another embodiment, the fiber core has a glass transition temperature in the range from about 25° C. to about 150° C. In various embodiments of the photovoltaic material, the fiber core includes flexible polymeric material (e.g., polyethylene terephthalate), flax, cotton, wool, silk, nylon, and/or combinations thereof. In various embodiments, the photosensitized nanomatrix material includes nanoparticles or a heterojunction composite material. The photosensitized nanomatrix material may include one or more types of interconnected metal oxide nanoparticles, and may also include a photosensitizing agent. The photosensitizing agent may be a dye or an organic molecule, such as, for example, a xanthine, cyanine, merocyanine, phthalocyanine, or pyrrole. In one embodiment, the charge carrier material includes an electrolyte or a redox system.

In one embodiment of this aspect of the invention, the photovoltaic material includes a catalytic media disposed between the outer surface and the light-transmissive electrical conductor. The catalytic media may be, for example, platinum. In another embodiment, the photosensitized nanomatrix material includes particles with an average size in the range of about 2 nm to about 100 nm, e.g. in the range of about 10 nm to about 40 nm. In one embodiment of the photovoltaic material, the fiber core is substantially electrically insulative. In another embodiment, the fiber core is substantially electrically conductive. The photovoltaic material may include an inner electrical conductor disposed on the outer surface of the fiber core. In one embodiment, the invention provides an article of manufacture that includes the photovoltaic material. In another embodiment, a flexible fabric is manufactured from the photovoltaic material.

In another aspect, the invention provides a photovoltaic material including a fiber core having an outer surface, a glass transition temperature less than about 300° C., and a photoconversion material disposed on the outer surface of the fiber core. In one embodiment, the photoconversion material includes a photosensitized nanomatrix material and a charge carrier material. The photoconversion material may have an inner electrical conductor disposed on the outer surface of the fiber core.

In another aspect, the invention provides a photovoltaic material including (1) a fiber core having an outer surface and a diameter of less than about 500 μm and (2) a photoconversion material disposed on the outer surface of the fiber core. In one embodiment of the photovoltaic material, the fiber core has a diameter of less than about 250 μm. In another embodiment, the fiber core has a diameter of less than about 125 μm. The fiber core may have a glass transition temperature of less than about 300° C. In one embodiment, the photoconversion material includes a photosensitized nanomatrix material and a charge carrier material. The photoconversion material may also have an inner electrical conductor disposed on the outer surface of the fiber core.

In another aspect, the invention provides a photovoltaic material including a fiber core having an outer surface, a photoconversion material disposed on the outer surface, and an electrical conductor circumferentially covering the photoconversion material. In one embodiment of the photovoltaic material, the fiber core has a glass transition temperature of less than about 300° C. In another embodiment, the photoconversion material includes a photosensitized nanomatrix material and a charge carrier material. The photoconversion material may also include an inner electrical conductor disposed on the outer surface of the fiber core. In a further aspect, the invention provides a method of forming a photovoltaic fiber. The method includes providing a fiber core having an outer surface, applying a photosensitized nanomatrix material to the outer surface of the fiber core, and disposing the photosensitized nanomatrix material-coated fiber core, a charge carrier material, and a counter electrode within a protective layer to form a photovoltaic fiber. The disposing step may include inserting the photosensitized nanomatrix material coated-fiber core, the charge carrier material, and the counter electrode into the protective layer to form the photovoltaic fiber and/or coating the protective layer over the photosensitized nanomatrix material coated-fiber core, the charge carrier material, and the counter electrode to form the photovoltaic fiber.

In another aspect, the invention provides a photovoltaic fiber including a fiber core having an outer surface, a photosensitized nanomatrix material applied to the outer surface of the fiber core, and a protective layer. The photosensitized nanomatrix material-coated fiber core, a charge carrier material, and a counter electrode are disposed within the protective layer. In one embodiment, the fiber core is substantially electrically conductive. Alternatively, the fiber core may be substantially electrically insulative and include an inner electrical conductor disposed on the electrically insulative fiber core. In one embodiment, the protective layer includes a flexible polymeric material. The photosensitized nanomatrix material may include nanoparticles such as, for example, titanium oxides, zirconium oxides, zinc oxides, tungsten oxides, niobium oxides, lanthanum oxides, tin oxides, terbium oxides, tantalum oxides, and combinations thereof. In one embodiment, the counter electrode is platinum. The charge carrier material may be a redox electrolyte.

Other aspects and advantages of the invention will become apparent from the following drawings, detailed description, and claims, all of which illustrate the principles of the invention, by way of example only.

BRIEF DESCRIPTION OF THE DRAWINGS

The foregoing and other objects, features, and advantages of the invention described above will be more fully understood from the following description of various illustrative embodiments, when read together with the accompanying drawings. In the drawings, like reference characters generally refer to the same parts throughout the different views. The drawings are not necessarily to scale, and emphasis instead is generally placed upon illustrating the principles of the invention.

DESCRIPTION OF THE ILLUSTRATIVE EMBODIMENTS

A. Photovoltaic Fibers

FIGS. 1A–1D depict various illustrative embodiments of photovoltaic fibers 100a, 100b, 100c, and 100d (collectively "100") that each include an electrically conductive fiber core 102, a significantly light transmitting electrical conductor 106, and a photoconversion material 110, which is disposed between the electrically conductive fiber core 102 and the significantly light transmitting electrical conductor 106. As used herein, the term "significantly light transmitting electrical conductor" refers to an electrical conductor adapted for transmitting at least about 60% of the visible light incident on the conductor in the wavelength region of operation.

Figure 1B:
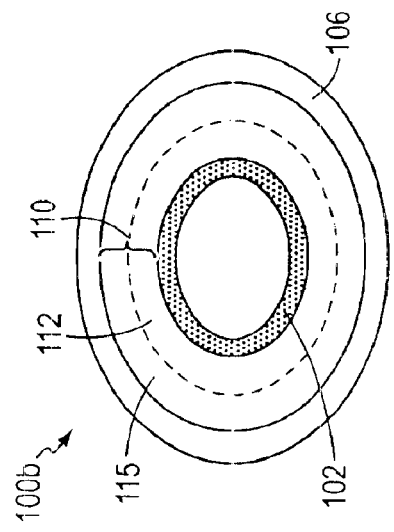
FIGS. 1A–1D show cross-sectional views of various illustrative embodiments of a photovoltaic material including an electrically conductive fiber core, according to the invention.
Figure 1D:
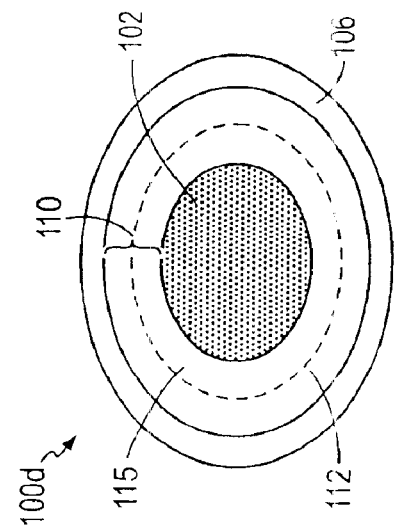
Figure 1A:
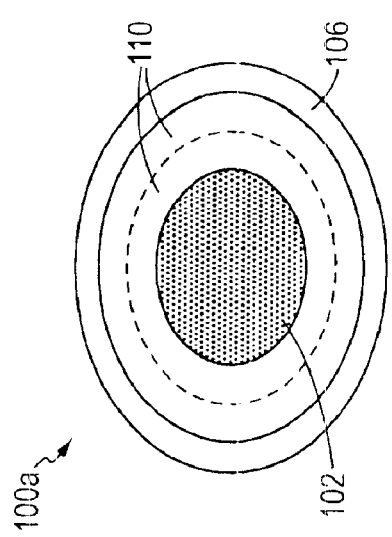
Figure 1C:
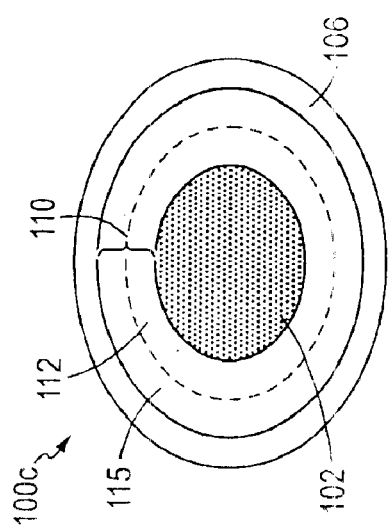

The electrically conductive fiber core 102 may take many forms. In the embodiment illustrated in FIG. 1A, the electrically conductive fiber core 102 is substantially solid. FIG. 1B depicts an electrically conductive fiber core 102 that is substantially hollow. According to the illustrative embodiments of FIGS. 1C–1D, the photoconversion material 110 includes a photosensitized nanomatrix material 112 and a charge carrier material 115. The charge carrier material 115 may form a layer, be interspersed with the photosensitized nanomatrix material 112, or be a combination of both. Referring to FIG. 1C, the photosensitized nanomatrix material 112 is adjacent to the electrically conductive fiber core 102. Referring to FIG. 1D, the charge carrier material 115 is adjacent to the electrically conductive fiber core 102.

FIGS. 2A–2D depict various illustrative embodiments of photovoltaic fibers 200a, 200b, 200c, and 200d (collectively "200") that each include an electrically conductive fiber core 202, a significantly light transmitting electrical conductor 206, and a photoconversion material 210, which is disposed between the electrically conductive fiber core 202 and the significantly light transmitting electrical conductor 206. The electrically conductive fiber core 202 may be substantially solid or substantially hollow. According to the illustrative embodiments of FIGS. 2A–2D, the photoconversion material 210 includes a photosensitized nanomatrix material 212 and a charge carrier material 215. The charge carrier material 215 may form a layer, be interspersed with the photosensitized nanomatrix material 212, or be a combination of both. The photovoltaic fibers 200 also include a catalytic media 221 disposed adjacent to the charge carrier material 215 to facilitate charge transfer or current flow from the significantly light transmitting electrical conductor 206 and the electrically conductive fiber core 202 to the charge carrier material 215.

Figure 2B:
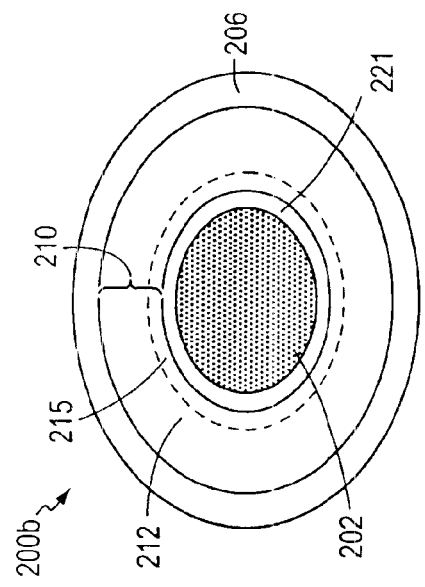
FIGS. 2A–2D depict cross-sectional views of various illustrative embodiments of a photovoltaic material including an electrically conductive fiber core and a catalytic media layer, according to the invention.
Figure 2D:
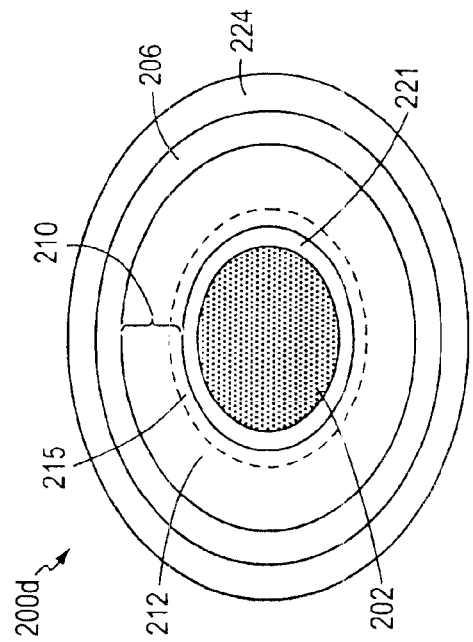
Figure 2A:
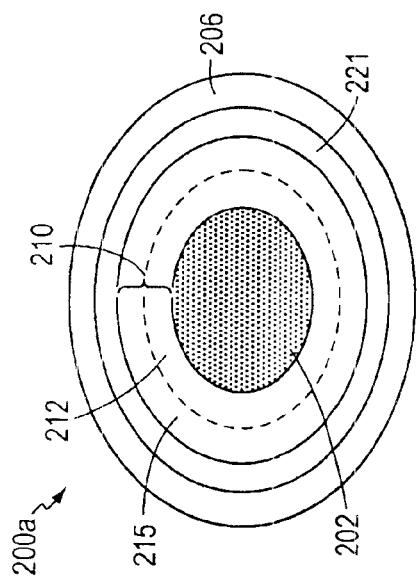
Figure 2C:
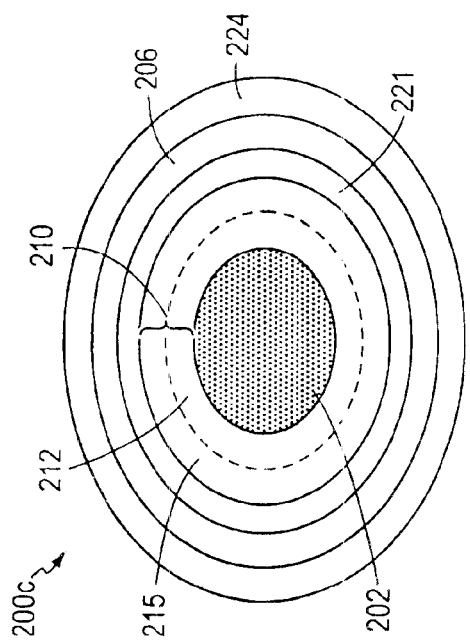

The photovoltaic fiber 200a depicted in FIG. 2A shows that the photoconversion material 210 is disposed between the catalytic media 221 and the electrically conductive fiber core 202. In this illustrative embodiment, the photosensitized nanomatrix material 212 is adjacent to the electrically conductive fiber core 202. In the photovoltaic fiber 200b illustrated in FIG. 2B, the catalytic media 221 is disposed between the electrically conductive fiber core 202 and the photoconversion material 210. In FIG. 2C, the photovoltaic fiber 200c includes the photovoltaic fiber 200a with a protective layer 224 disposed on at least a portion of the significantly light transmitting electrical conductor 206. In FIG. 2D, the photovoltaic fiber 200d includes the photovoltaic fiber 200b with a protective layer 224 disposed on at least a portion of the significantly light transmitting electrical conductor 206.

Although the electrically conductive fiber cores 102 and 202 and resultant photovoltaic fibers 100 and 200 illustrated in FIGS. 1 and 2 appear to have substantially circular cross-sections, their cross-sections are not limited to being substantially circular. Other suitable cross-sectional shapes for the electrically conductive fiber cores 102 and 202 and photovoltaic fibers 100 and 200 include, for example, those that are substantially square, rectangular, elliptical, triangular, trapezoidal, polygonal, arcuate, and even irregular shapes. In addition, the electrically conductive fiber cores 102 and 202 may be single-stranded fibers or a multi-stranded fibers (e.g., twisted fibers).

According to the illustrative embodiments of the invention, the electrically conductive fiber cores 102 and 202 may have a wide range of thicknesses. Fiber thickness may be chosen, for example, based on desired strength, flexibility, current carrying capacity, voltage carrying capacity, cost, ease of fabrication into a fabric, and appearance, among other factors. The thicknesses of the electrically conductive fiber cores 102 and 202 may range from that of a microscopic thread (about 100 Å) to that of a human hair (about 125 $\mu$m) to that of a rope (about 1 cm). In other illustrative embodiments, the thicknesses of the electrically conductive fiber cores 102 and 202 are between about 1 $\mu$m and about 10 $\mu$m. In another class of illustrative embodiments, the electrically conductive fiber cores 102 and 202 are between about 75 $\mu$m and about 1000 $\mu$m thick.

Many materials are suitable for use as the electrically conductive fiber core 102 and 202. These materials include, for example, metals, metal oxides, conductive polymers, and filled polymers. Suitable metals include, but are not limited to, copper, silver, gold, platinum, nickel, palladium, iron, titanium, and alloys thereof. Suitable metal oxides include, but are not limited to, indium tin oxide (ITO), a fluorine-doped tin oxide, tin oxide, zinc oxide, and the like. Suitable conductive polymers include, but are not limited to, polyaniline and polyacetylene doped with arsenic pentaflouride. Filled polymers include, but are not limited to, fullerene-filled polymers and carbon-black-filled polymers.

In various illustrative embodiments, the photovoltaic fibers 100 and 200 are incorporated into a flexible fabric in a manner further described below. The materials of the electrically conductive fiber cores 102 and 202 may be selected to produce a colored or colorless fiber. Therefore, the colors of the flexible fabric are created by selecting the electrically conductive fiber cores 102 and 202 from a variety of available colors. The electrically conductive fiber cores 102 and 202 may also be transparent, semi-transparent, or opaque. For example, the electrically conductive fiber cores 102 and 202 may be transparent and significantly light transmitting and/or guide light to their respective photoconversion materials 110 and 210.

FIGS. 3A–3D depict various illustrative embodiments of photovoltaic fibers 300a, 300b, 300c, and 300d (collectively "300") that each include an electrically insulative fiber core 302, an inner electrical conductor 304 disposed on the outer surface of the electrically insulative fiber core 302, a significantly light transmitting electrical conductor 306, and a photoconversion material 310 disposed between the inner electrical conductor 304 and the significantly light transmitting electrical conductor 306.

Figure 3B:
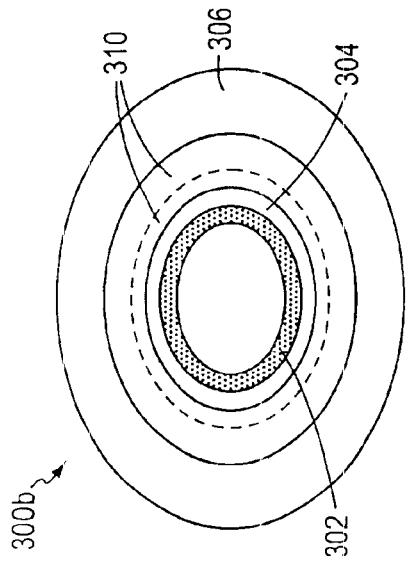
FIGS. 3A–3D depict cross-sectional views of various illustrative embodiments of a photovoltaic material including an electrically insulative fiber core, according to the invention.
Figure 3D:
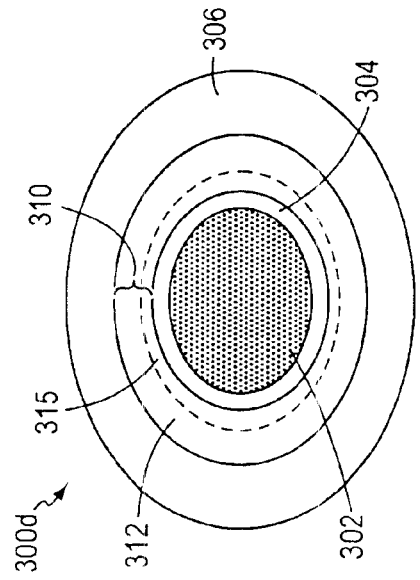
Figure 3A:
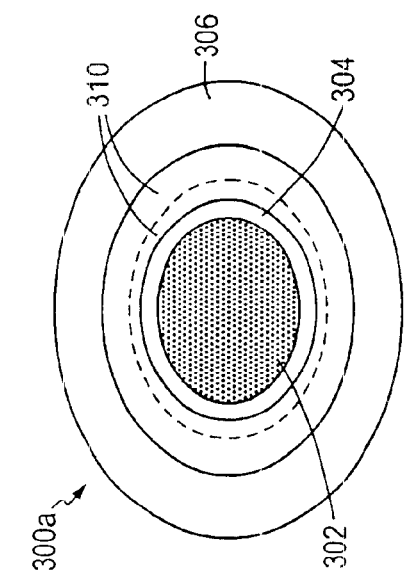
Figure 3C:
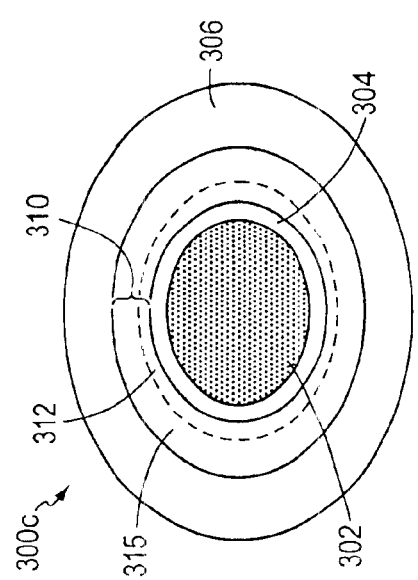

The electrically insulative fiber core 302 may take many forms. In FIG. 3A, the electrically insulative fiber core 302 is substantially solid. FIG. 3B depicts an electrically insulative fiber core 302 that is substantially hollow. According to the illustrative embodiments of FIGS. 3C–3D, the photoconversion material 310 includes a photosensitized nanomatrix material 312 and a charge carrier material 315. The charge carrier material 315 may form a layer, be interspersed with the photosensitized nanomatrix material 312, or be a combination of both. Referring to FIG. 3C, the photosensitized nanomatrix material 312 is adjacent to the inner electrical conductor 304. Referring to FIG. 3D, the charge carrier material 315 is adjacent to the inner electrical conductor 304.

FIGS. 4A–4D depict various illustrative embodiments of photovoltaic fibers 400a, 400b, 400c, and 400d (collectively "400") that each include an electrically insulative fiber core 402, an inner electrical conductor 404 disposed on the outer surface of the electrically insulative fiber core 402, a significantly light transmitting electrical conductor 406, and a photoconversion material 410 disposed between the inner electrical conductor 404 and the significantly light transmitting electrical conductor 406. The electrically insulative fiber core 402 may be substantially solid or substantially hollow. According to the illustrative embodiments of FIGS. 4A–4D, the photoconversion material 410 includes a photosensitized nanomatrix material 412 and a charge carrier material 415. The charge carrier material 415 may form a layer, be interspersed with the photosensitized nanomatrix material 412, or be a combination of both. The photovoltaic fibers 400 also include a catalytic media 421 adjacent to the charge carrier material 415 to facilitate charge transfer or current flow from the significantly light transmitting electrical conductor 406 and the electrically insulative fiber core 402 to the charge carrier material 415.

Figure 4B:
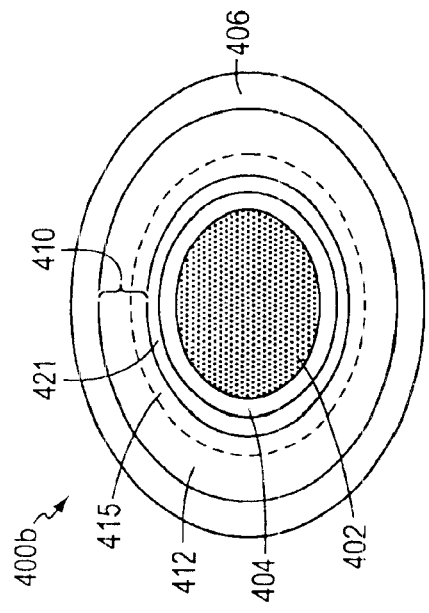
FIGS. 4A–4D show cross-sectional views of various illustrative embodiments of a photovoltaic material including an electrically insulative fiber core and a catalytic media layer, according to the invention.
Figure 4D:
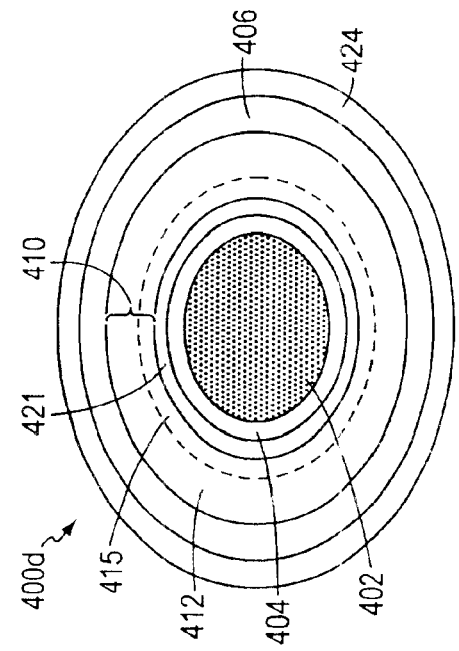
Figure 4A:
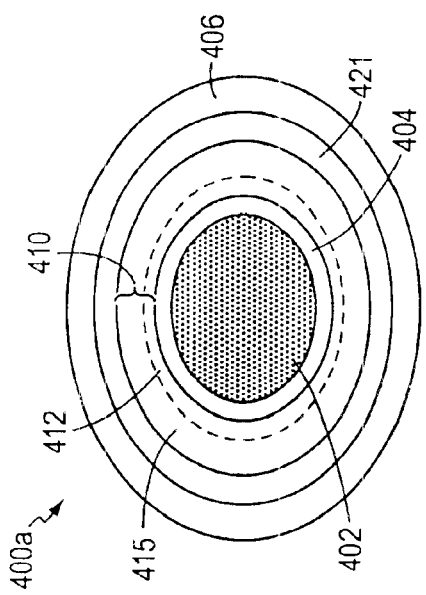
Figure 4C:
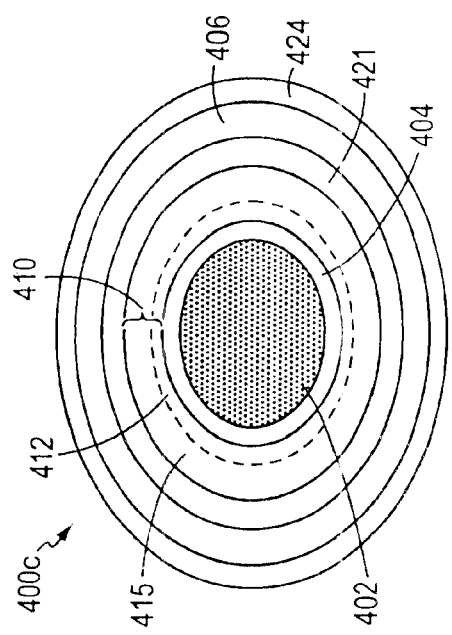

In the photovoltaic fiber 400a depicted in FIG. 4A, the photoconversion material 410 is displaced between the catalytic media 421 and the inner electrical conductor 404. In this illustrative embodiment, the photosensitized nanomatrix material 412 is adjacent to the inner electrical conductor 404. The photovoltaic fiber 400b illustrated in FIG. 4B depicts that the catalytic media 421 is disposed between the inner electrical conductor 404 and the photoconversion material 410. In FIG. 4C, the photovoltaic fiber 400c includes the photovoltaic fiber 400a with a protective layer 424 disposed on at least a portion of the significantly light transmitting electrical conductor 406. In FIG. 4D, the photovoltaic fiber 400d includes the photovoltaic fiber 400b with a protective layer 424 disposed on at least a portion of the significantly light transmitting electrical conductor 406.

Although the electrically insulative fiber cores 302 and 402 and resultant photovoltaic fibers 300 and 400 illustrated in FIGS. 3 and 4 appear to have substantially circular cross-sections, their cross-sections are not limited to being substantially circular. Other suitable cross-sectional shapes for the electrically insulative fiber cores 302 and 402 and photovoltaic fibers 300 and 400 include, for example, those that are substantially square, rectangular, elliptical, triangular, trapezoidal, polygonal, arcuate, and even irregular shapes. In addition, the electrically insulative fiber cores 302 and 402 may be single-stranded fibers or a multi-stranded fibers (e.g., twisted fibers).

According to the illustrative embodiments of the invention, the electrically insulative fiber cores 302 and 402 may have a wide range of thicknesses. Fiber thickness may be chosen, for example, based on desired strength, flexibility, current carrying capacity, voltage carrying capacity, cost, ease of fabrication into a fabric, and appearance, among other factors. The thicknesses of the electrically insulative fiber cores 302 and 402 may range from that of a microscopic thread (about 100 Å) to that of a human hair (about 125 $\mu$m) to that of a rope (about 1 cm). In other illustrative embodiments; the thicknesses of the electrically insulative fiber cores 302 and 402 are between about 1 $\mu$m and about 10 $\mu$m. In another class of illustrative embodiments, the electrically insulative fiber cores 302 and 402 are between about 75 $\mu$m and about 1000 $\mu$m thick.

Many materials are suitable for use as the electrically insulative fiber cores 302 and 402. These materials include, for example, glass, traditional textile fibers, and insulative polymers and plastics. Suitable traditional textile fibers include, but are not limited to, flax, cotton, wool, silk, nylon, and combinations thereof. Suitable insulative polymers and plastics include, but are not limited to, polyaramides (e.g., the KEVLAR material available from DuPont), nylons, polyethylene terephthalate (PET), polyimide, polyethylene naphthalate (PEN), polymeric hydrocarbons, cellulosics, or combinations thereof.

In various illustrative embodiments, the photovoltaic fibers 300 and 400 are incorporated into a flexible fabric in a manner described in more detail below. The materials of the electrically insulative fiber cores 302 and 402 may be selected to produce a colored or colorless fiber. Therefore, the colors of the flexible fabric are created by selecting the electrically insulative fiber cores 302 and 402 from a variety of available colors. The electrically insulative fiber cores 302 and 402 may also be transparent, semi-transparent, or opaque. For example, the electrically insulative fiber cores 302 and 402 may be transparent and significantly light transmitting and/or guide light to their respective photoconversion materials 310 and 410.

The inner electrical conductors 304 and 404 may include any suitable conductive material. In various illustrative embodiments, the inner electrical conductors 304 and 404 are significantly light transmitting. Suitable materials for the inner electrical conductors 304 and 404 include, but are not limited to, copper, silver, gold, platinum, nickel, palladium, iron, alloys thereof, ITO, and conductive polymers such as polyaniline and aniline. In various illustrative embodiments, the inner electrical conductors 304 and 404 are between about 0.5 $\mu$m and about 5 $\mu$m thick. Preferably, the inner electrical conductors 304 and 404 are between about 0.5 $\mu$m and about 1 $\mu$m thick.

In various illustrative embodiments, the photovoltaic fibers 100, 200, 300 and 400 include the electrically conductive fiber cores 102 and 202 or the electrically insulative fiber cores 302 and 402 with glass transition temperatures in the range between about 10 CC and about 300° C. For example, one suitable material for the electrically insulative fiber cores 302 and 402 is PET, which has a glass transition temperature of about 45° C. However, it should be recognized that not all materials suitable for the photovoltaic fibers 100, 200, 300 and 400 have a glass transition temperature. For those materials, the significant temperature is (1) the degree at which the interconnection of the materials forming the photoconversion materials 110, 210, 310 and 410 is disrupted and/or (2) the degree at which the electrical connection between the photoconversion materials 110, 210, 310 and 410 and (i) the electrically conductive fiber cores 102 and 202, (ii) the inner electrical conductors 304 and 404, and/or (iii) the significantly light transmitting electrical conductors 106, 206, 306 and 406 is disrupted.

Referring to the illustrative embodiments shown in FIGS. 1–4, the significantly light transmitting electrical conductors 106, 206, 306 and 406 include transparent materials, such as, for example, ITO, a fluorine-doped tin oxide, tin oxide, zinc oxide, and the like. The significantly light transmitting electrical conductors 106, 206, 306 and 406 may be colored or colorless. Preferably, the significantly light transmitting electrical conductors 106, 206, 306 and 406 are clear and transparent. Moreover, the significantly light transmitting electrical conductors 106, 206; 306 and 406 are preferably formed on their respective photoconversion materials 110, 210, 310 and 410, such that the resultant photovoltaic fibers 100, 200, 300 and 400 are flexible. In various illustrative embodiments, the significantly light transmitting electrical conductors 106, 206, 306 and 406 are less than about 1 $\mu$m thick. The significantly light transmitting electrical conductors 106, 206, 306 and 406 may range from between about 100 nm to about 500 nm thick. In other illustrative embodiments, the significantly light transmitting electrical conductors 106, 206, 306 and 406 are between about 150 nm and about 300 nm thick.

In various illustrative embodiments, the photoconversion materials 110, 210, 310 and 410 are between about 1 $\mu$m and about 5 $\mu$m thick. In other illustrative embodiments, the photoconversion material 110, 210, 310 and 410 are between about 5 $\mu$m and about 20 $\mu$m thick. In various illustrative embodiments, the photoconversion materials 110 and 310 include a heterojunction composite material. Suitable heterojunction composite materials include fullerenes (e.g., $C_{60}$), fullerene particles, or carbon nanotubes. The heterojunction composite material may be dispersed in polythiophene or some other hole transport material. In various illustrative embodiments, the heterojunction composite material includes individual fullerenes and/or fullerene particles that have an average size of between about 14 nm and about 500 nm. Other examples of suitable heterojunction composite materials are composites including conjugated polymers, such as polythiophene and polyquinoline, and composites of conjugated polymers, such as polyphenylene vinylene, in conjunction with non-polymeric materials.

In various illustrative embodiments, long-range order is not required of the photosensitized nanomatrix materials 112, 212, 312 and 412. For example, the photosensitized nanomatrix materials 112, 212, 312 and 412 need not be crystalline, nor must the particles or phase regions be arranged in a regular, repeating, or periodic array. In various illustrative embodiments, the nanomatrix materials 112, 212, 312 and 412 may be between about 0.5 $\mu$m and about 20 $\lambda$m thick.

In various illustrative embodiments, the photosensitized nanomatrix materials 112, 212, 312 and 412 are photosensitized by a photosensitizing agent. The photosensitizing agent facilitates conversion of incident visible light into electricity to produce the desired photovoltaic effect. It is believed that the photosensitizing agent absorbs incident light resulting in the excitation of electrons in the photosensitizing agent. The energy of the excited electrons is then transferred from the excitation levels of the photosensitizing agent into a conduction band of the photosensitized nanomatrix material 112, 212, 312 or 412. This electron transfer results in an effective separation of charge and the desired photovoltaic effect. Accordingly, the electrons in the conduction bands of the nanomatrix materials 112, 212, 312 and 412 are made available to drive an external load, which may be electrically connected to the photovoltaic fibers 100, 200, 300 and 400.

The photosensitizing agent may be sorbed (either chemisorbed and/or physisorbed) on the photosensitized nanomatrix material 112, 212, 312, and 412. The photosensitizing agent may be sorbed on a surface of the photosensitized nanomatrix material 112, 212, 312 and 412, throughout the photosensitized nanomatrix material 112, 212, 312 and 412, or both. The photosensitizing agent is selected based on, for example, its ability to absorb photons in the wavelength region of operation, its ability to produce free electrons (or holes) in the conduction bands of the photosensitized nanomatrix materials 112, 212, 312 and 412, and its effectiveness in complexing with or sorbing to the photosensitized nanomatrix materials 112, 212, 312 and 412. Suitable photosensitizing agents may include, for example, dyes having functional groups, such as carboxyl and/or hydroxyl groups, that can chelate to the nanoparticles. Examples of suitable dyes include, but are not limited to, porphyrins, phthalocyanines, merocyanines, cyanines, squarates, eosins, xanthines, pyrroles, and metal-containing, such as cis-bis(isothiocyanato)bis(2,2'-bipyridyl-4,4'-dicarboxylato)-ruthenium(II) ("N3 dye"); tris(isothiocyanato)-ruthenium (II)-2,2':6',2"-terpyridine-4,4',4"-tricarboxylic acid; cis-bis(isothiocyanato)bis(2,2'-bipyridyl-4,4'-dicarboxylato)-ruthenium(II) bis-tetrabutylammonium; cis-bis(isocyanato)(2,2'-bipyridyl-4,4' dicarboxylato) ruthenium(II); and tris(2,2'-bipyridyl-4,4'-dicarboxylato) ruthenium (II) dichloride, all of which are available from Solaronix.

Preferably, the photosensitized nanomatrix materials 112, 212, 312 and 412 include one or more types of interconnected metal oxide nanoparticles. Suitable nanoparticle materials include, but are not limited to, the oxides, sulfides, selenides, and tellurides of titanium, zirconium, zinc, lanthanum, niobium, strontium, tantalum, tin, terbium, and tungsten, or one or more combinations thereof. For example, $TiO_2$, $SrTiO_3$, $CaTiO_3$, $ZrO_2$, $WO_3$, $La_2O_3$, $Nb_2O_5$, sodium titanate, and potassium niobate are suitable nanoparticle materials. In various illustrative embodiments, the photosensitized nanomatrix materials 112, 212, 312 and 412 include nanoparticles with an average size between about 2 nm and about 100 nm. In other illustrative embodiments, the photosensitized nanomatrix materials 112, 212, 312 and 412 include nanoparticles with an average size between about 10 nm and about 40 nm. Preferably, the nanoparticles are titanium dioxide particles with an average particle size of about 20 nm.

The charge carrier material 115, 215, 315 and 415 portions of the photoconversion materials 110, 210, 310 and 410 may be any material that facilitates the transfer of electrical charge from a ground potential or a current source to its respective photosensitized nanomatrix material 112, 212, 312 or 412 (and/or a photosensitizing agent of the photosensitized nanomatrix materials 112, 212, 312 and 412). A general class of suitable charge carrier materials 115, 215, 315 and 415 may include, but are not limited to, solvent-based liquid electrolytes, polyelectrolytes, polymeric electrolytes, solid electrolytes n-type and p-type conducting polymers, and gel electrolytes. Generally, the charge carrier materials 115, 215, 315 and 415 are between about 2 $\mu$m and about 20 $\mu$m thick.

In various illustrative embodiments, the charge carrier materials 115, 215, 315 and 415 may include a redox system. Suitable redox systems include, for example, organic and/or inorganic redox systems. More particularly, the redox system may be, for example, cerium(III) sulfate/cerium(IV), sodium bromide/bromine, lithium iodide/iodine, $Fe^{2+}/Fe^{3+}$, $Co^{2+}/Co^{3+}$, and/or viologens.

The charge carrier materials 115, 215, 315 and 415 also may include a polymeric electrolyte. In various illustrative embodiments, the polymeric electrolyte includes poly(vinyl imidazolium halide) and/or poly(vinyl pyridinium salts). In other illustrative embodiments, the charge carrier materials 115, 215, 315 and 415 include a solid electrolyte. The solid electrolyte may include lithium iodide, pyridinium iodide, and/or substituted imidazolium iodide.

According to various illustrative embodiments, the charge carrier materials 115, 215, 315 and 415 may include a polymeric polyelectrolyte. The polyelectrolyte may include between about 5% and about 100% (e.g., 5–60%, 5–40%, or 5–20%) by weight of a polymer, e.g., an ion-conducting polymer; about 5% to about 95%, e.g., about 35–95%, 60–95%, or 80–95%, by weight of a plasticizer; and about 0.05 M to about 10 M of a redox electrolyte, e.g., about 0.05 M to about 10 M, e.g., 0.05–2 M, 0.05–1 M, or 0.05–0.5 M, of organic or inorganic iodides, and about 0.01 M to about 1 M, e.g., 0.05–5 M, 0.05–2 M, or 0.05–1 M, of iodine. The ion-conducting polymer may include, for example, polyethylene oxide (PEO), polyacrylonitrile (PAN), polymethylmethacrylate (acrylic) (PMMA), polyethers, and polyphenols. Examples of suitable plasticizers include, but are not limited to, ethyl carbonate, propylene carbonate, mixtures of carbonates, organic phosphates, and dialkylphthalates.

In various illustrative embodiments, the catalytic media 221 and 421 are in electrical contact with their respective charge carrier materials 215 and 415. The catalytic media 221 and 421 may include, for example, ruthenium, osmium, cobalt, rhodium, iridium, nickel, palladium or platinum. Preferably, the catalytic media 221 and 421 also include titanium, or another suitable metal, to facilitate adhesion of the catalytic media to the significantly light transmitting electrical conductors 206 and 406, the electrically conductive fiber core 202, or the inner electrical conductor 404 disposed on the electrically insulative fiber core 402. Preferably, the titanium is deposited in regions and as a layer about 10 Å thick. In various illustrative embodiments, the catalytic media 221 and 421 include a platinum layer between about 13 Å and about 35 Å thick. In other illustrative embodiments, the catalytic media 221 and 421 include a platinum layer between about 15 Å and about 50 Å thick. In still other illustrative embodiments, the catalytic media 221 and 421 include a platinum layer between about 50 Å and about 800 Å thick. Preferably, the catalytic media 221 and 421 are a platinum layer about 25 Å thick.

In various illustrative embodiments, the protective layers 224 and 424 include any suitably light transmitting material. Suitable materials for the protective layers 224 and 424 include, but are not limited to, mylar polyacrylates, polystyrenes, polyureas, polyurethane, epoxies, and the like. Preferably, the protective layers 224 and 424 have thicknesses greater than about 1 $\mu$m.

Figure 5:
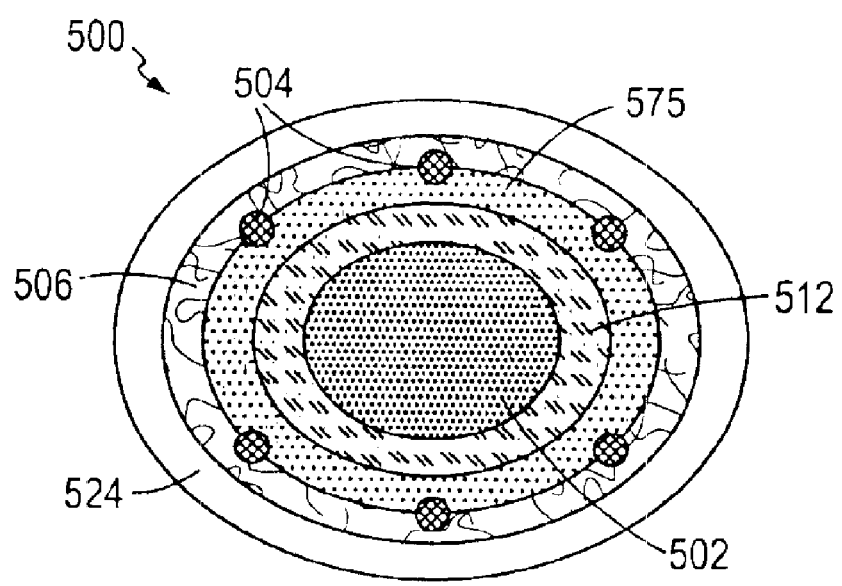
FIG. 5 depicts a cross-sectional view of one illustrative embodiment of a photovoltaic material including an electrically conductive fiber core and wires imbedded in the electrical conductor, according to the invention.

FIG. 5 depicts a photovoltaic material 500 that includes a fiber 502, one or more wires 504 that are imbedded in a significantly light transmitting electrical conductor 506, a photosensitized nanomatrix material 512, a charge carrier material 515, and a protective layer 524. The wires 504 may also be partially imbedded in the charge carrier material 515 to, for example, facilitate electrical connection of the photovoltaic material 500 to an external load, to reinforce the significantly light transmitting electrical conductor 506, and/or to sustain the flexibility of the photovoltaic material 500. Preferably, the wire 504 is an electrical conductor and, in particular, a metal electrical conductor. Suitable wire 504 materials include, but are not limited to, copper, silver, gold, platinum, nickel, palladium, iron, and alloys thereof. In one illustrative embodiment, the wire 504 is between about 0.5 $\mu$m and about 100 $\mu$m thick. In another illustrative embodiment, the wire 504 is between about 1 $\mu$m and about 10 $\mu$m thick.

Figure 6B:
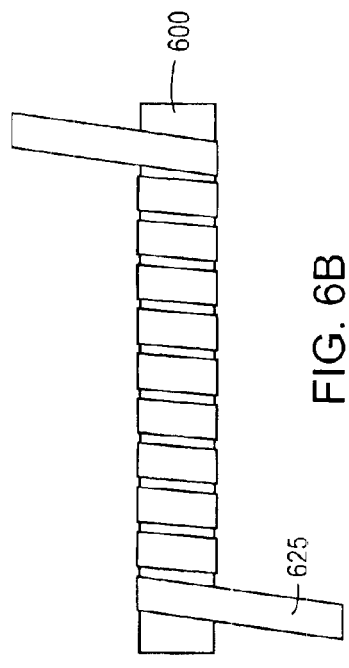
FIGS. 6A and 6B depict the formation of a flexible fiber including a photovoltaic cell, according to an illustrative embodiment of the invention.
Figure 6A:
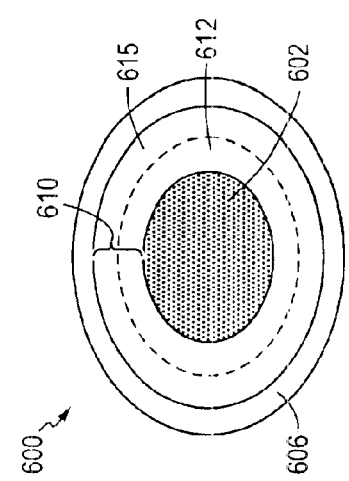

FIGS. 6A and 6B show a method of forming a photovoltaic material 600 that has an electrically conductive fiber core 602, a significantly light transmitting electrical conductor 606, and a photoconversion material 610, which is disposed between the electrically conductive fiber core 602 and the significantly light transmitting electrical conductor 606. According to the method, the outer surface of the conductive fiber core 602 is coated with titanium dioxide nanoparticles. The nanoparticles are then interconnected by, for example, sintering, or preferably by contacting the nanoparticles with a reactive polymeric linking agent such as, for example, poly(n-butyl titanate), which is described in more detail below. The interconnected titanium dioxide nanoparticles are then contacted with a photosensitizing agent, such as, for example, a 3×10$^{-4}$ M N3-dye solution for 1 hour, to form a photosensitized nanomatrix material 612. A charge carrier material 615 that includes a gelled electrolyte is then coated on the photosensitized nanomatrix material 612 to complete the photoconversion material 610.

Referring to FIG. 6B, a strip 625 of transparent polymer from about 2.5 $\mu$m to about 6 $\mu$m thick, coated with a layer of ITO that in turn has been platinized, is wrapped in a helical pattern about the photovoltaic material 600 with the platinized side of the strip 625 in contact with the charge carrier material 615. In this illustrative embodiment, the strip 625 of transparent polymer is the significantly light transmitting electrical conductor 606. In other illustrative embodiments, the significantly light transmitting electrical conductor 606 is formed using the materials described above with regard to FIGS. 1–4.

Figure 6C:
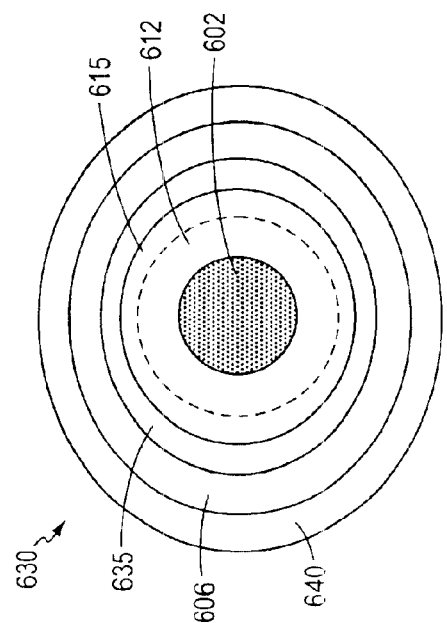
FIG. 6C shows a cross-sectional view of an exemplary photovoltaic material formed using the method depicted in FIGS. 6A and 6B.

FIG. 6C shows a cross-sectional view of an illustrative embodiment of a completed photovoltaic material 630 that has a photoconversion material 610 disposed between the conductive fiber core 602 and the significantly light transmitting electrical conductor 606. The photovoltaic material 630 also includes a catalytic media 635 in contact with the charge carrier material 615 and a protective transparent polymer layer 640 disposed on the significantly light transmitting electrical conductor 606.

In another embodiment of the method illustrated in FIGS. 6A and 6B, the electrically conductive fiber core 602 is replaced with an electrically insulative fiber core that has been coated with a layer of platinum to form an inner electrical conductor. The subsequent formation of a photoconversion material 610 and helical wrapping with strip 625 then proceeds as described above to form the photovoltaic material.

Figure 7:
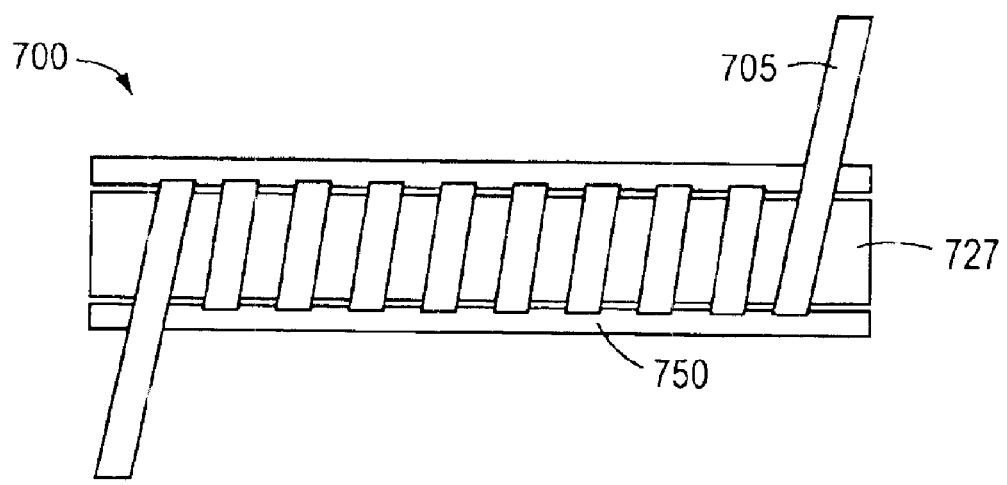
FIG. 7 shows an exemplary embodiment of a photovoltaic cell in the form of a fiber, according to an illustrative embodiment of the invention.

Referring to FIG. 7, in another illustrative embodiment, a photovoltaic material 700 is formed by wrapping a platinum or platinized wire 705 around a core 727 including a photoconversion material disposed on either an electrically conductive fiber core or on an inner electrical conductor in turn disposed on an insulative fiber. A strip 750 of transparent polymer coated with a layer of ITO, which has been platinized, is wrapped in a helical pattern about the core 727 with the platinized side of the strip 750 in contact with the wire 705 and the charge carrier material of the core 727.

Figure 8:
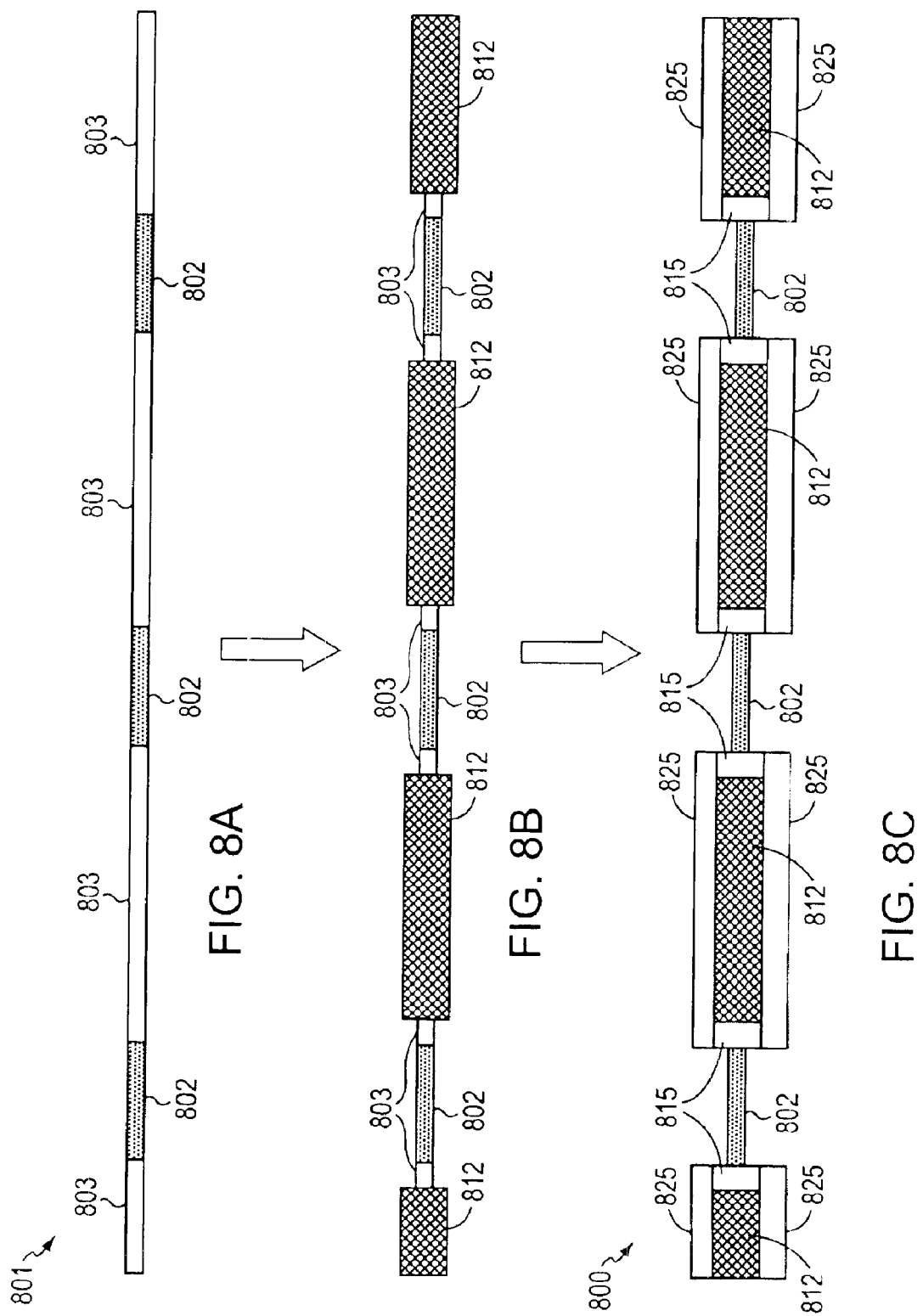
FIGS. 8A–8C show various illustrative embodiments that demonstrate the electrical connection of photovoltaic fibers to form a flexible fabric, according to the invention.

FIGS. 8A–8C depict another illustrative embodiment of a photovoltaic material 800, constructed in accordance with the invention. The photovoltaic material 800 includes a metal-textile fiber 801, which has metallic electrically conductive portions 802 and textile portions 803. The textile portions 803 may be electrically conductive or may be insulative and coated with an electrical conductor. Referring to FIG. 8B, a dispersion of titanium dioxide nanoparticles is coated on the outer surface of portions of the textile portions 803 of the metal-textile fiber 801. The particles are then interconnected preferably by contacting the nanoparticles with a reactive polymeric linking agent such as poly(n-butyl titanate), which is further described below. The interconnected titanium dioxide nanoparticles are then contacted with a photosensitizing agent, such as a N3 dye solution, for 1 hour to form a photosensitized nanomatrix material 812.

Referring to FIG. 8C, a charge carrier material 815 including a solid electrolyte is then coated on the textile portions 803. A strip 825 of PET coated with ITO, that in turn has been platinized, is disposed on the photosensitized nanomatrix material 812 and the charge carrier material 815. The platinized ITO is in contact with the charge carrier material 815.

As indicated above, the photovoltaic fibers 100, 200, 300, and 400 may be utilized to form a photovoltaic fabric. The resultant photovoltaic fabric may be a flexible, semi-rigid, or rigid fabric. The rigidity of the photovoltaic fabric may be selected, for example, by varying the tightness of the weave, the thickness of the strands of the photovoltaic materials used, and/or the rigidity of the photovoltaic materials used. The photovoltaic materials may be, for example, woven with or without other materials to form the photovoltaic fabric. In addition, strands of the photovoltaic material, constructed according to the invention, may be welded together to form a fabric.

Figure 9:
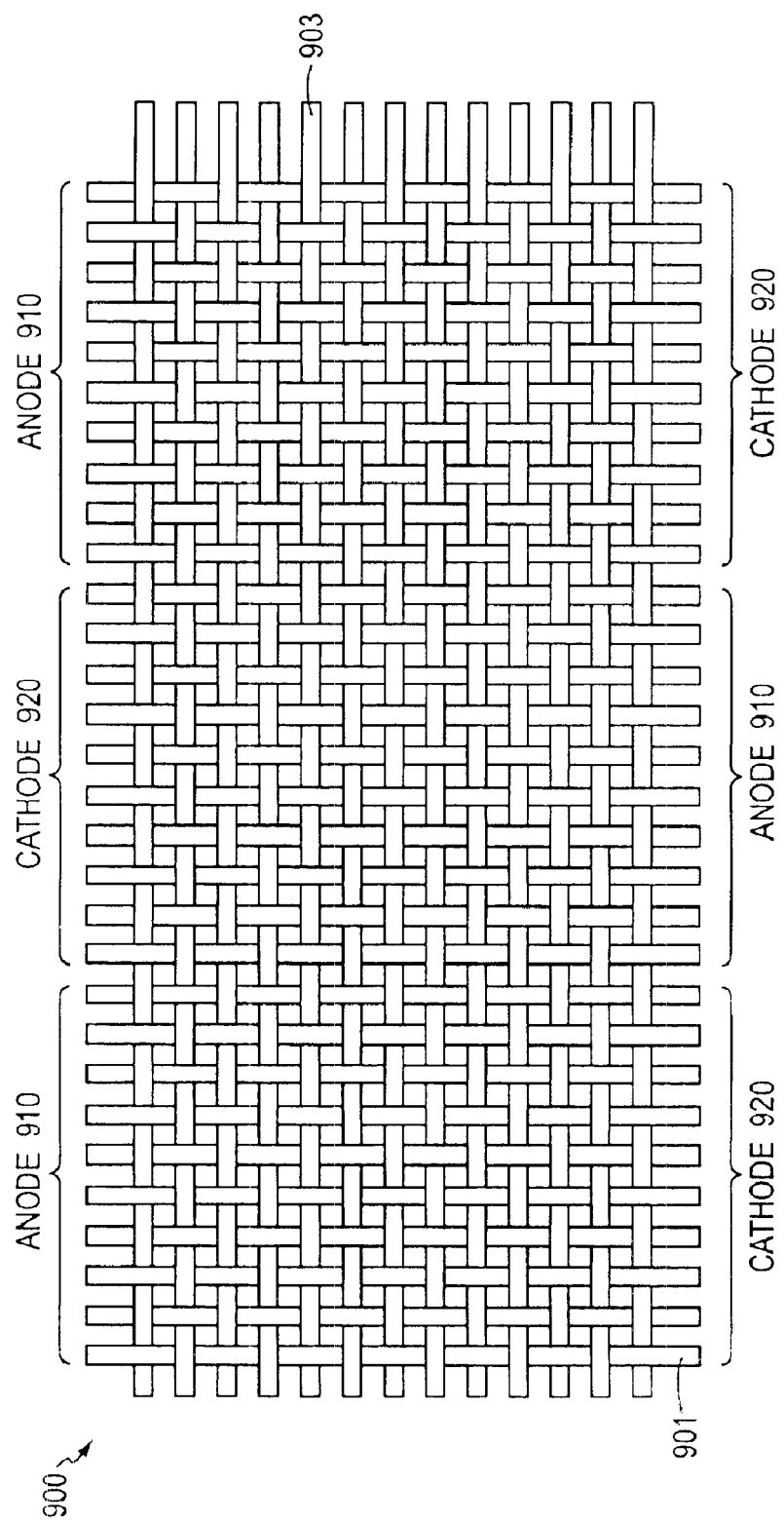
FIG. 9 shows an exemplary photovoltaic fabric formed from photovoltaic materials, according to an illustrative embodiment of the invention.

FIG. 9 depicts one illustrative embodiment of a photovoltaic fabric 900 that includes photovoltaic fibers 901, according to the invention. As illustrated, the photovoltaic fabric 900 also includes non-photovoltaic fibers 903. In various illustrative embodiments, the non-photovoltaic fibers 903 may be replaced with photovoltaic fibers. FIG. 9 also illustrates anodes 910 and cathodes 920 that are formed on the photovoltaic fabric 900 and that may be connected to an external load to form an electrical circuit. The anodes 910 may be formed by a conductive fiber core or an electrical conductor on an insulative fiber, and the cathodes 920 may be formed by significantly light transmitting electrical conductors. In FIG. 9, each edge of the photovoltaic fabric 900 is constructed in an alternating fashion with the anodes 910 and cathodes 920 formed from photovoltaic fibers 901. In another illustrative embodiment, each edge of photovoltaic fabric 900 is constructed from just one anode or just one cathode, both of which are formed from either photovoltaic fibers, non-photovoltaic fibers, or a combination of both.

Figure 10:
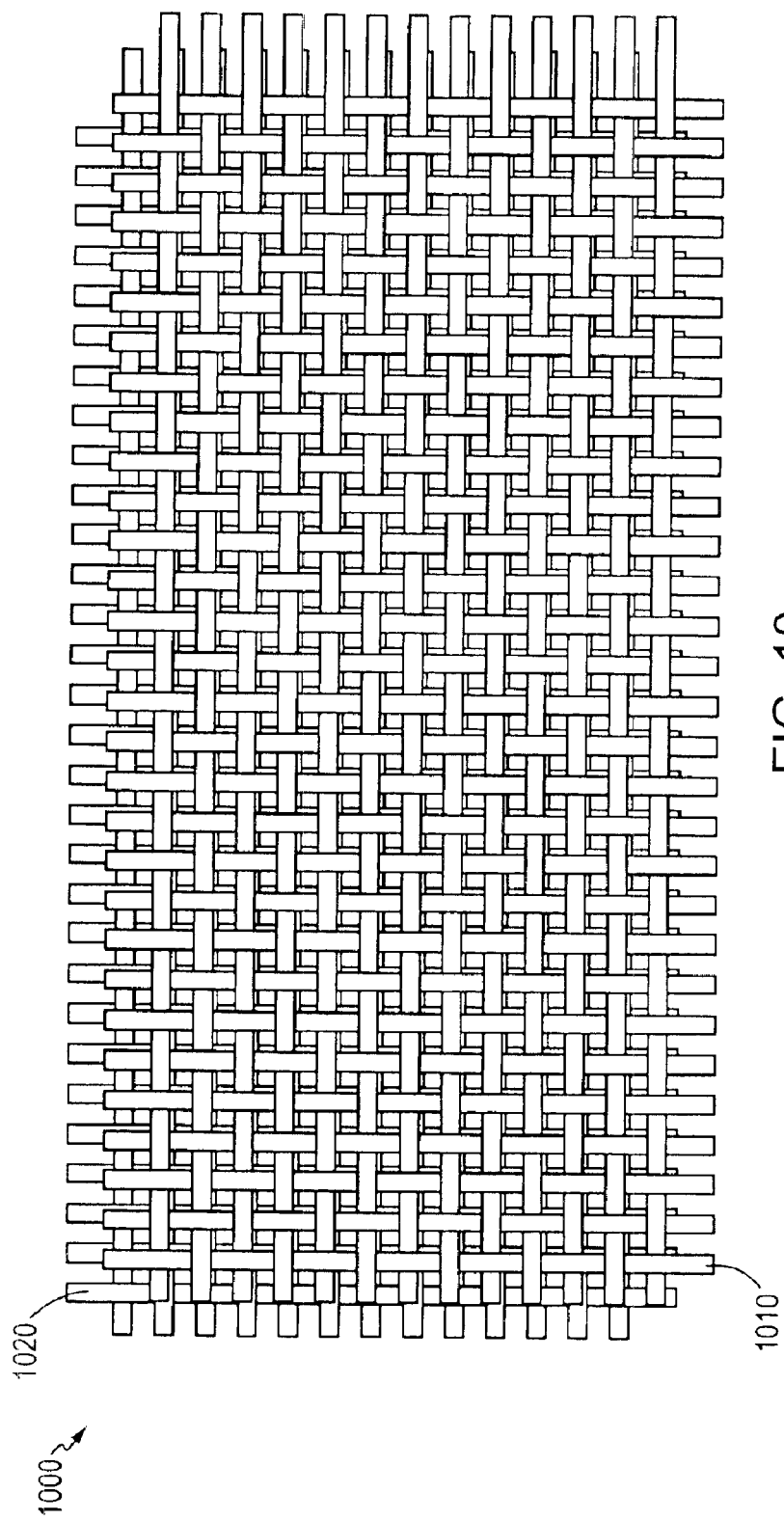
FIG. 10 depicts an illustrative embodiment of a two-component photovoltaic mesh, according to the invention.

FIG. 10 shows a photovoltaic fabric 1000 formed by a two-component photovoltaic material. According to the illustrative embodiment, each component is formed by a mesh, where one mesh serves as the anode 1010 and the other as the cathode 1020. Each mesh (or component) is connected to a different busbar, which in turn may be connected to opposite terminals of an external load. Hence, a single large-area, fabric-like photovoltaic cell is produced.

According to the illustrated embodiment, the mesh material may be any material suitable as a fiber material. For example, the mesh material may include electrically conductive fiber cores, electrically insulative fiber cores coated with an electrical conductor, or a combination of both. In one embodiment, the anode mesh is made of a metal fiber with a redox potential approximately equal to that of ITO. In another embodiment, the mesh is composed of a plastic fiber, e.g., nylon that is metalized by, for example, vacuum deposition or electroless deposition.

In one illustrative embodiment, the anode 1010 mesh of the photovoltaic fabric 1000 is formed by coating the mesh with a dispersion of titanium dioxide nanoparticles by, for example, dipping or slot coating in a suspension. The titanium dioxide nanoparticles are interconnected, for example, by a sintering, or preferably by a reactive polymeric linking agent, such as poly(n-butyl titanate) described in more detail below. After coating with the titania suspension, but prior to either sintering or crosslinking, an air curtain can be used to remove excess titania from the spaces between the fibers of the mesh. Likewise, this, or some other functionally equivalent method, may be used to clear these spaces of excess material after each of the subsequent steps in the preparation of the final photovoltaic fabric. Subsequently, the mesh is slot coated or dipped in a photosensitizing agent solution, such as N3 dye, followed by washing and drying. A charge carrier including a solid electrolyte (e.g., a thermally-reversible polyelectrolyte) is applied to the mesh to from the anode 1010 mesh. In another illustrative embodiment, the cathode 1020 mesh of the photovoltaic fabric 1000 is formed as a platinum-coated mesh, such as, for example, a platinum-coated conductive fiber core mesh or a platinum-coated plastic mesh.

To form the photovoltaic fabric 1000, the anode 1010 mesh and cathode 1020 mesh are brought into electrical contact and aligned one over the other, so that the strands of each mesh are substantially parallel to one another. Perfect alignment is not critical. In fact, it may be advantageous from the standpoint of photon harvesting to slightly misalign the two meshes. The photovoltaic fabric 1000 may be coated with a solution of a polymer that serves as a protective, transparent, flexible layer.

One of the advantages of the photovoltaic fabric 1000 is its relative ease of construction and the ease with which the anode 1010 and cathode 1020 may be connected to an external circuit. For example, the edges of each mesh, one edge, multiple edges, or all edges may be left uncoated when the coating operations described above are performed. The anode 1010 and cathode 1020 are each electrically connected to its own metal busbar. An advantage of this illustrative embodiment is the elimination of the possibility that severing one wire would disable the entire photovoltaic fabric.

Figure 11:
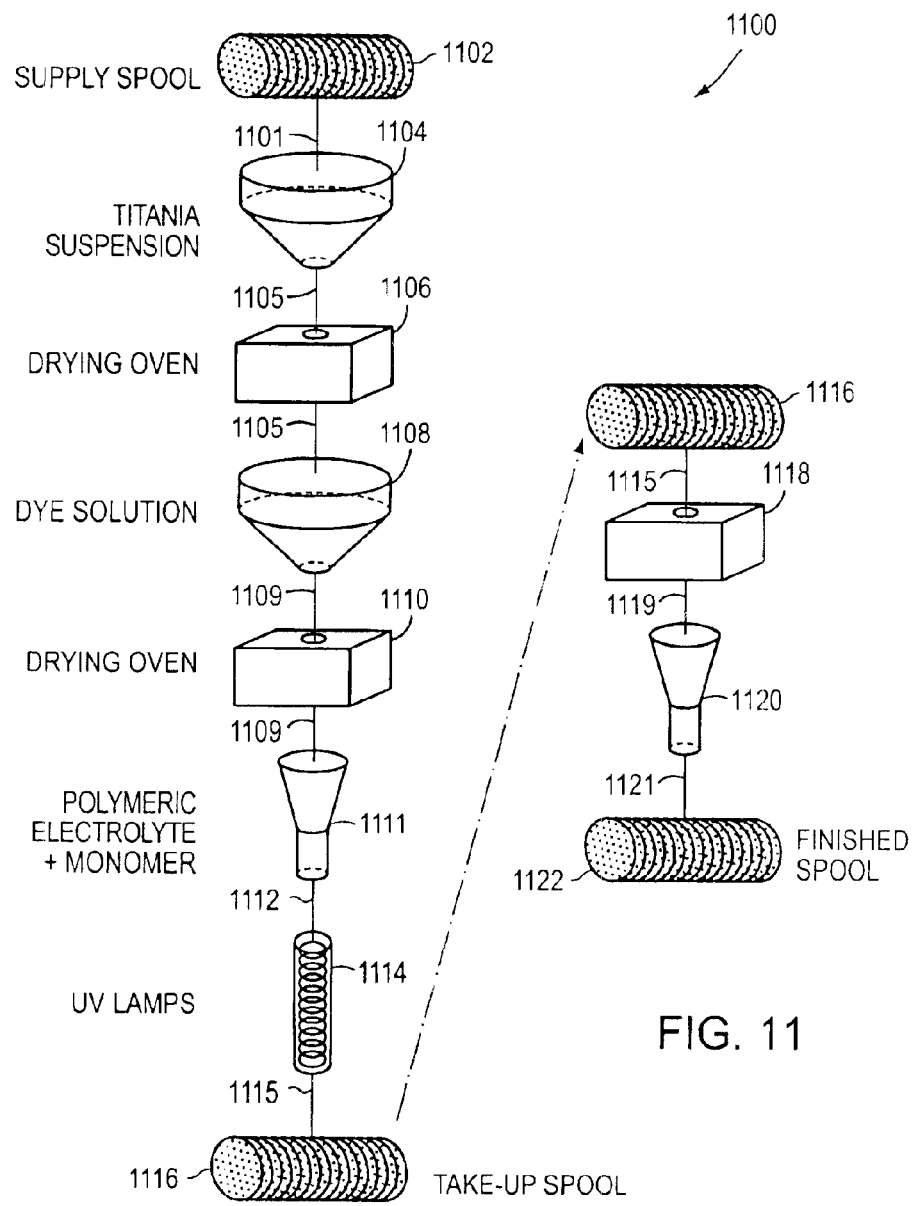
FIG. 11 shows an exemplary method for forming a flexible fiber including a photovoltaic material using a continuous manufacturing process, according to an illustrative embodiment of the invention.

FIG. 11 shows a method 1100 for forming a photovoltaic material in the form of a fiber using a continuous manufacturing process. Referring to FIG. 11, a fiber 1101 is provided, for example, by a supply spool 1102. The fiber 1101 may be an electrically insulative fiber corecoated with an electrical conductor, an electrically conductive fiber core, or a combination of both. According to the illustrative embodiment, the fiber 1101 is coated with a suspension of titanium dioxide nanoparticles and poly(n-butyl titanate) (serving as a reactive polymeric linking agent) by passing it into such a fluid suspension contained in a cup 1104 with a small hole in its bottom. Upon exiting the cup 1104, the interconnected nanoparticle-coated fiber 1105 enters an oven 1106 to remove excess suspending medium (e.g., water or other solvent). The interconnected nanoparticle-coated fiber 1105 enters a dye bath 1108 to photosensitize the interconnected nanoparticles. The photosensitized nanoparticle-coated fiber 1109 thereupon enters a drying oven 1110 and/or a wash bath to remove excess solvent.

Next, the photosensitized nanoparticle-coated fiber 1109 passes through a solution 1111 that includes an electrolyte, preferably, a solid state, polymeric electrolyte. The solvent for this polymer solution 1111 may be a non-reactive solvent, in which case it can be removed by heating in a subsequent step, or it may be a reactive solvent such as a monomer. If the solvent for the polyelectrolyte is a monomer, it is preferably chosen such that it can be photopolymerized and such that the resulting polymer structure does not detract from the electrical properties of the polyelectrolyte. Hence, in the illustrative embodiment where the solvent includes a monomer, the photoconversion materialcoated fiber 1112 is passed through a chamber containing UV lamps 1114, which initiate photopolymerization of the monomer. The resultant fiber 1115 is then coated with the photoconversion material including a solid state electrolyte, and may be readily spooled onto a take-up spool 1116.

The photoconversion material-coated fiber 1115 then passes through or is placed in a vacuum chamber 1118 where a very thin layer of platinum, followed by a transparent, conductive coating of ITO, are deposited on the fiber. The platinum may be, for example, between about 15 Å and about 50 Å thick. The ITO serves as the significant light transmitting electrical conductor. The completed photovoltaic fiber 1119 may then be passed through a polymer solution 1120 to provide a transparent, protective coating, such as by wire extrusion or other means known to the art. Thus a flexible photovoltaic material 1121 is taken up on a finished spool 1122 and is ready for subsequent use, for example, in a weaving or matting operation.

B. Low Temperature Interconnection of Nanoparticles

As briefly discussed above, the invention provides methods of forming a layer of interconnected nanoparticles on a fiber or an electrical conductor disposed on a fiber at temperatures significantly lower than 400° C. In one illustrative embodiment, a polymeric linking agent (hereinafter a "polylinker") enables the fabrication of photovoltaic fibers at relatively low "sintering" temperatures (<about 300° C.). Although the term "sintering" conventionally refers to high temperature (> about 400° C.) processes, as used herein, the term "sintering" is not temperature specific, but instead refers generally to the process of interconnecting nanoparticles at any temperature.

Figure 12:
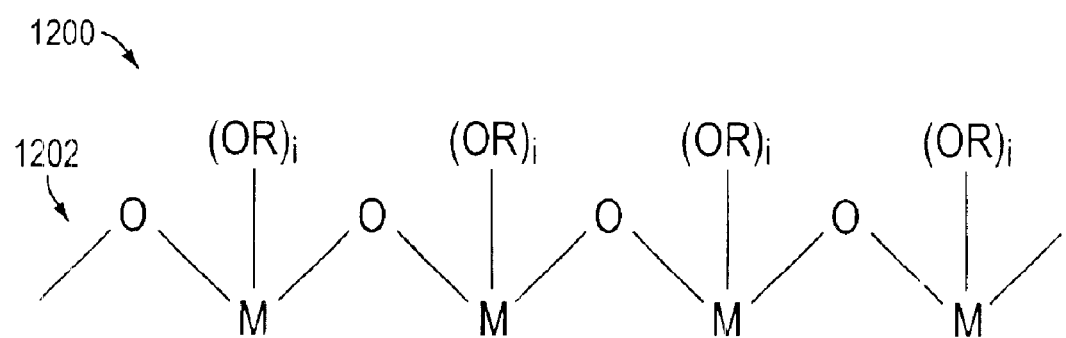
FIG. 12 depicts an exemplary chemical structure of an illustrative embodiment of a polylinker for nanoparticles of an oxide of metal M, in accordance with the invention.
Figure 13:
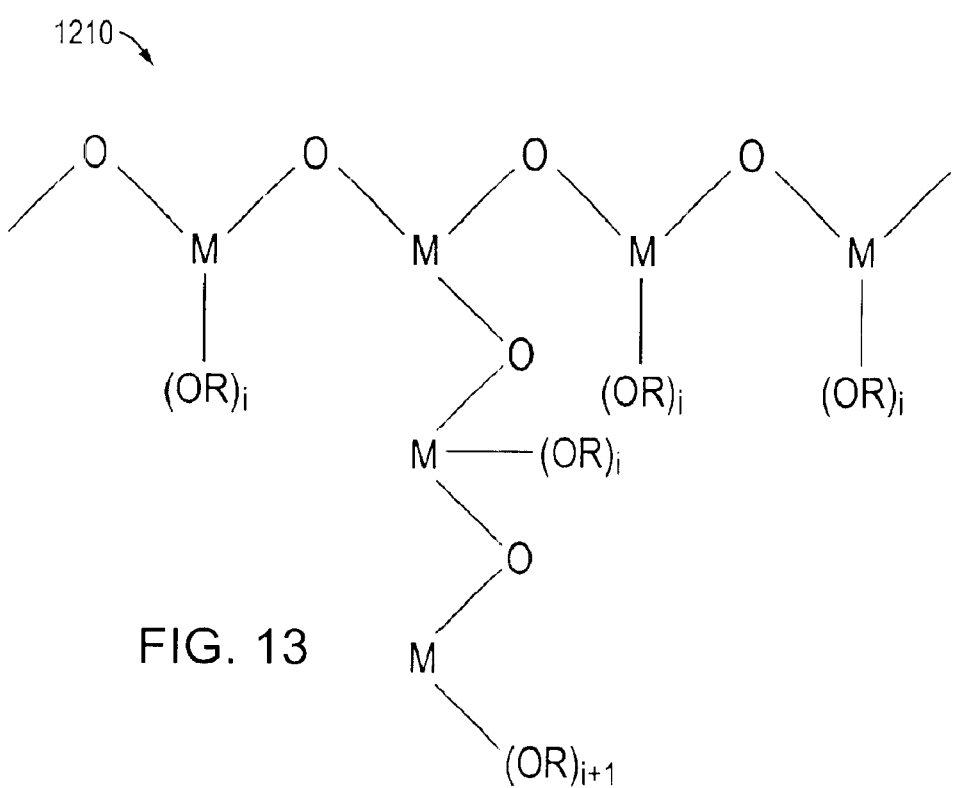
FIG. 13 depicts another exemplary chemical structure of an illustrative embodiment of a polylinker, according to the invention, for nanoparticles of an oxide of metal M.

FIGS. 12 and 13 schematically depict chemical structures of illustrative polylinkers, according to the invention. The particular polylinker structures depicted are for use with nanoparticles of the formula $M_xO_y$, where M may be, for example, titanium (Ti), zirconium (Zr), tungsten (W), niobium (Nb), lanthanum (La), tantalum (Ta), terbium (Tb), or tin (Sn) and x and y are integers greater than zero. According to the illustrative embodiment of FIG. 12, the polylinker 1200 includes a backbone structure 1202, which is similar in structure to the metal oxide nanoparticles, and $(OR)_i$ reactive groups, where R may be, for example, acetate, an alkyl, alkene, alkyne, aromatic, or acyl group; or a hydrogen atom and i is an integer greater than zero. Suitable alkyl groups include, but are not limited to, ethyl, propyl, butyl, and pentyl groups. Suitable alkenes include, but are not limited to, ethene, propene, butene, and pentene. Suitable alkynes include, but are not limited to, ethyne, propyne, butyne, and pentyne. Suitable aromatic group include, but are not limited to, phenyl, benzyl, and phenol. Suitable acyl groups include, but are not limited to, acetyl and benzoyl. In addition, a halogen including, for example, chlorine, bromine, and iodine may be substituted for the $(OR)_i$ reactive groups.

Referring to FIG. 13, the polylinker 1210 has a branched backbone structure that includes two —M—O—M—O—M—O— backbone structures, which include $(OR)_i$ reactive groups and $(OR)_{i+1}$ reactive groups, where R may be, for example, one of the atoms, molecules, or compounds listed above and i is an integer greater than zero. The two backbone structures have similar structures to the metal oxide nanoparticles. Collectively, the structure depicted in FIG. 13 can be represented by $—M(OR)_i—O—(M(OR)_i—O)_n—M(OR)_{i+1}$, where i and n are integers greater than zero.

Figure 14A:
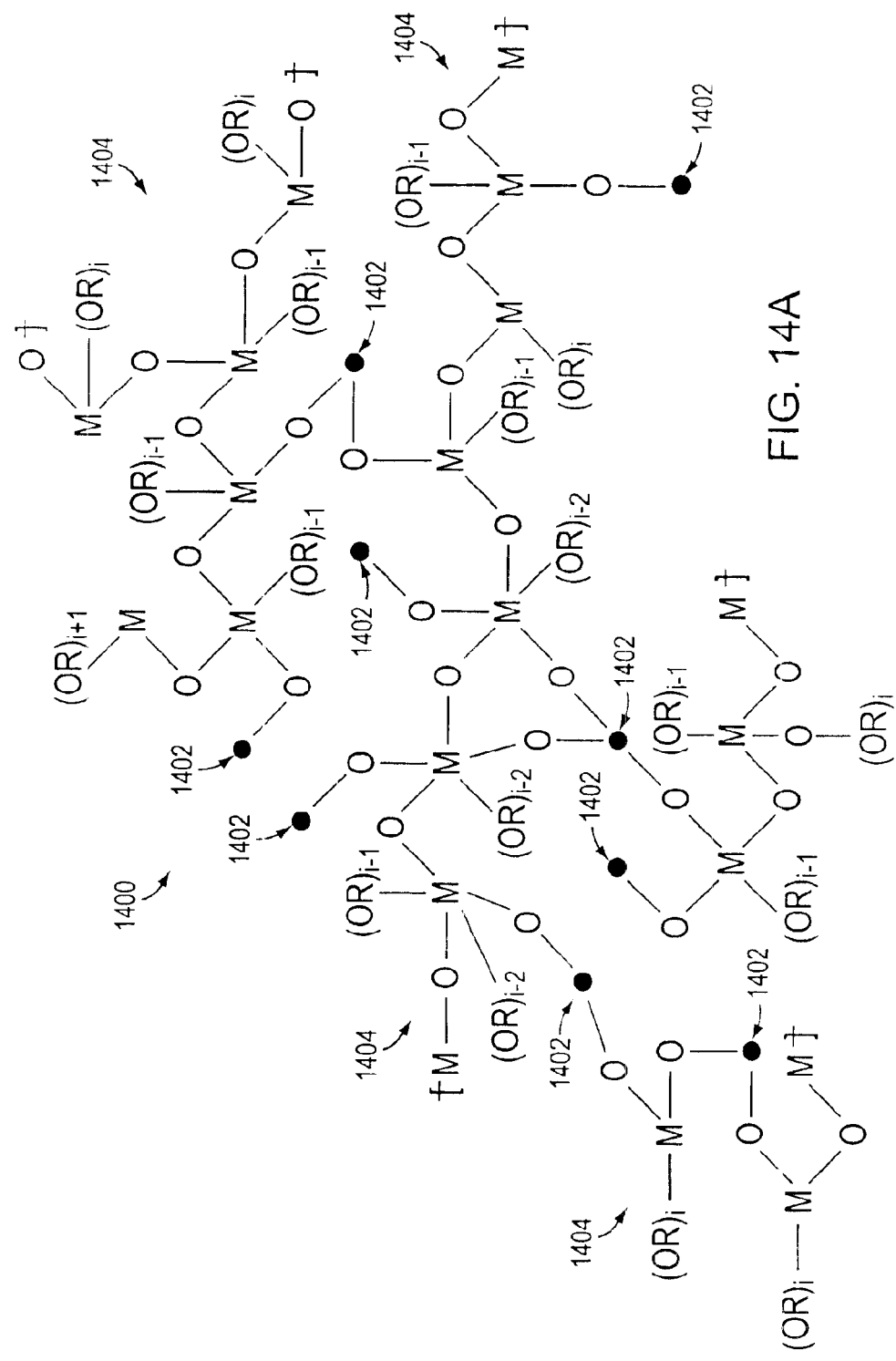
FIG. 14A shows an exemplary chemical structure for an interconnected nanoparticle film with a polylinker, according to an illustrative embodiment of the invention.

FIG. 14A depicts schematically the chemical structure 1400 resulting from interconnecting the $M_xO_y$ nanoparticles 1402 with a polylinker 1404. In various embodiments, the polylinker 1404 has the chemical structure of the polylinkers 1200 and 1210 depicted in FIGS. 12 and 13, respectively. According to the illustrative embodiment, the nanoparticles 1402 are interconnected by contacting the nanoparticles 1402 with a polylinker 1404 at or below room temperature or at elevated temperatures that are less than about 300° C. Preferably, the polylinker 1404 is dispersed in a solvent to facilitate contact with the nanoparticles 1402. Suitable solvents include, but are not limited to, various alcohols, chlorohydrocarbons (e.g., chloroform), ketones, cyclic and linear chain ether derivatives, and aromatic solvents among others. It is believed that the reaction between surface hydroxyl groups of the nanoparticles 1402 with alkoxy groups on the polymer chain of the polylinker 1404 leads to bridging (or linking) the many nanoparticles 1402 together through highly stable covalent links, and as a result, to interconnecting the nanoparticles 1402. It also is believed that since the polylinker 1404 is a polymeric material with a chemical structure similar to that of the nanoparticles 1402, even a few binding (or linking) sites between the nanoparticles 1402 and the polylinker 1404 leads to a highly interconnected nanoparticle film with a combination of electrical and mechanical properties superior to those of a non-sintered or non-interconnected nanoparticle film. The electrical properties include, for example, electron and/or hole conducting properties that facilitate the transfer of electrons or holes from one nanoparticle to another through, for example, π-conjugation. The mechanical properties include, for example, improved flexibility.

Still referring to FIG. 14A, at low concentrations of the polylinker 1404, a single polylinker 1404 polymer can link many nanoparticles 1402 forming a cross-linked nanoparticle network. However, by increasing the concentration of the polylinker 1404 polymer, more polylinker 1404 molecules may be attached to the surface of the nanoparticles 1402 forming polymer-coated nanoparticles 1400. Such polymer-coated nanoparticles 1400 may be processed as thin films due to the flexibility of the polymer. It is believed that the electronic properties of the polymer-coated nanoparticles are not affected to a significant extent due to the similar electronic and structural properties between the polylinker polymer and the nanoparticles.

Figure 14B:
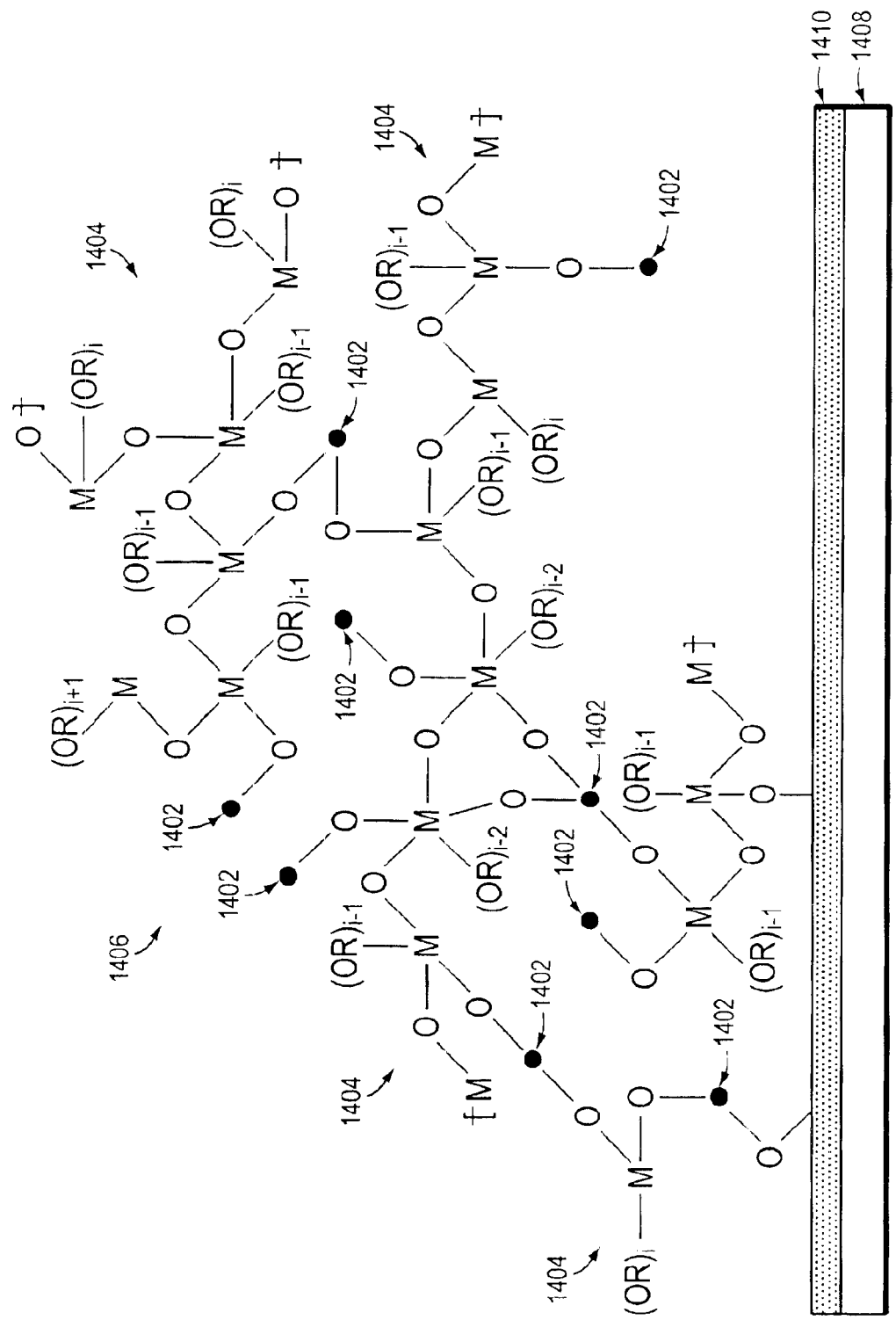
FIG. 14B shows the interconnected nanoparticle film of FIG. 14A attached to a substrate oxide layer, according to an illustrative embodiment of the invention.

FIG. 14B depicts the chemical structure 1406 of an illustrative embodiment of the interconnected nanoparticle film 1400 from FIG. 14A formed on a flexible substrate 1408 that includes an oxide layer coating 1410, which is an electrical conductor. In particular, the polylinkers may be used to facilitate the formation of such nanoparticle films 1400 on flexible, significantly light transmitting substrates 1408. As used herein, the term "significantly light transmitting substrate" refers to a substrate that transmits at least about 60% of the visible light incident on the substrate in a wavelength range of operation. Examples of flexible substrates 1408 include polyethylene terephthalates (PETs), polyimides, polyethylene naphthalates (PENs), polymeric hydrocarbons, cellulosics, combinations thereof, and the like. PET and PEN substrates may be coated with one or more electrical conducting, oxide layer coatings 1410 of, for example, indium tin oxide (ITO), a fluorine-doped tin oxide, tin oxide, zinc oxide, and the like.

According to one preferred embodiment, by using the illustrative polylinkers, the methods of the invention interconnect nanoparticles 1402 at temperatures significantly below 400° C., and preferably below about 300° C. Operating in such a temperature range enables the use of the flexible substrates 1408, which would otherwise be destructively deformed by conventional high temperature sintering methods. In one illustrative embodiment, the exemplary structure 1406 is formed by interconnecting the nanoparticles 1402 using a polylinker 1404 on a substrate 1408 at temperatures below about 300° C. In another embodiment, the nanoparticles 1402 are interconnected using a polylinker 1404 at temperatures below about 100° C. In still another embodiment, the nanoparticles 1402 are interconnected using a polylinker 1404 at about room temperature and room pressure, from about 18 to about 22° C. and about 760 mm Hg, respectively.

In embodiments where the nanoparticles are deposited on a substrate, the reactive groups of the polylinker bind with the substrate, substrate coating and/or substrate oxide layers. The reactive groups may bind to the substrate, substrate coating and/or substrate oxide layers by, for example, covalent, ionic and/or hydrogen bonding. It is believed that reactions between the reactive groups of the polylinker with oxide layers on the substrate result in connecting nanoparticles to the substrate via the polylinker.

According to various embodiments of the invention, metal oxide nanoparticles are interconnected by contacting the nanoparticles with a suitable polylinker dispersed in a suitable solvent at or below room temperature or at elevated temperatures below about 300° C. The nanoparticles may be contacted with a polylinker solution in many ways. For example, a nanoparticle film may be formed on a substrate and then dipped into a polylinker solution. A nanoparticle film may be formed on a substrate and the polylinker solution sprayed on the film. The polylinker and nanoparticles may be dispersed together in a solution and the solution deposited on a substrate. To prepare nanoparticle dispersions, techniques such as, for example, microfluidizing, attributing, and ball milling may be used. Further, a polylinker solution may be deposited on a substrate and a nanoparticle film deposited on the polylinker.

In embodiments where the polylinker and nanoparticles are dispersed together in a solution, the resultant polylinker-nanoparticle solution may be used to form an interconnected nanoparticle film on a substrate in a single step. In various versions of this embodiment, the viscosity of the polylinker-nanoparticle solution may be selected to facilitate film deposition using printing techniques such as, for example, screen-printing and gravure-printing techniques. In embodiments where a polylinker solution is deposited on a substrate and a nanoparticle film deposited on the polylinker, the concentration of the polylinker can be adjusted to achieve a desired adhesive thickness. In addition, excess solvent may be removed from the deposited polylinker solution prior to deposition of the nanoparticle film.

The invention is not limited to interconnection of nanoparticles of a material of formula $M_xO_y$. Suitable nanoparticle materials include, but are not limited to, sulfides, selenides, tellurides, and oxides of titanium, zirconium, lanthanum, niobium, tin, tantalum, terbium, and tungsten, and combinations thereof. For example, $TiO_2$, $SrTiO_3$, $CaTiO_3$, $ZrO_2$, $WO_3$, $La_2O_3$, $Nb_2O_5$, $SnO_2$, sodium titanate, and potassium niobate are suitable nanoparticle materials.

The polylinker may contain more than one type of reactive group. For example, the illustrative embodiments of FIGS. 12–14B depict one type of reactive group OR. However, the polylinker may include several types of reactive groups, e.g., OR, OR', OR", etc.; where R, R' and R" are one or more of a hydrogen, alkyl, alkene, alkyne, aromatic, or acyl group or where one or more of OR, OR', and OR" are a halide. For example, the polylinker may include polymer units of formulas such as, —[O—M(OR)$_i$(OR')$_j$—]—, and —[O—M(OR)$_i$(OR')$_j$(OR")$_k$—]—, where i, j and k are integers greater than zero.

Figure 15:
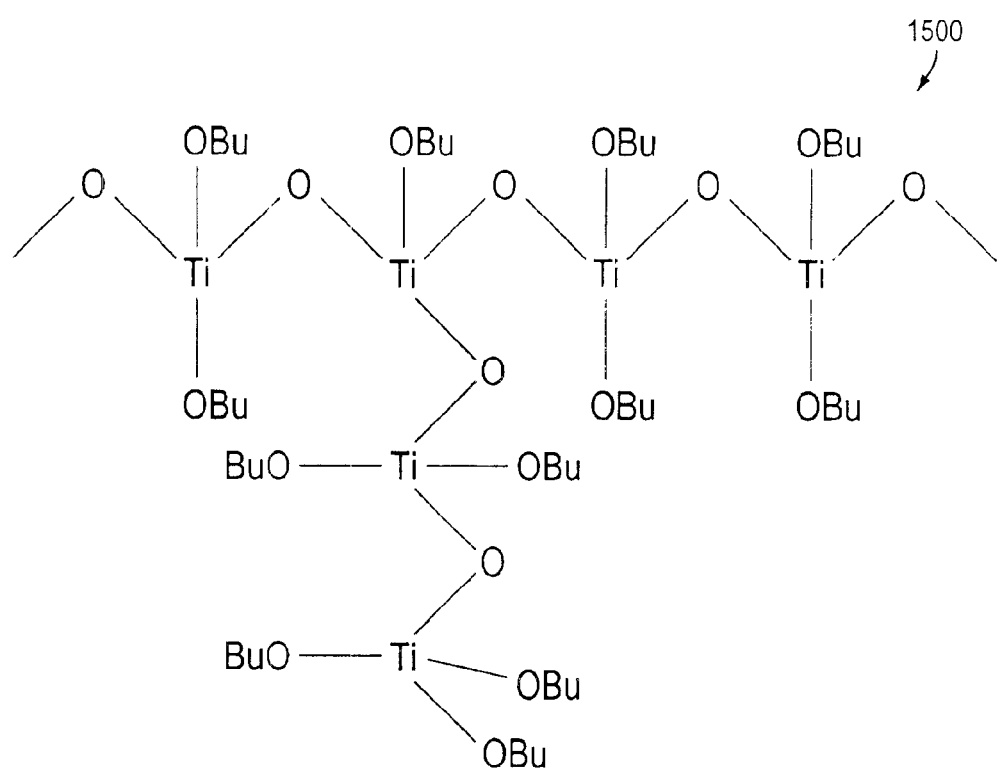
FIG. 15 depicts the chemical structure of poly(n-butyl titanate)

FIG. 15 depicts the chemical structure of a representative polylinker, poly(n-butyl titanate) 1500 for use with titanium dioxide ($TiO_2$) nanoparticles. Suitable solvents for poly(n-butyl titanate) 1500 include, but are not limited to, various alcohols, chlorohydrocarbons (e.g., chloroform), ketones, cyclic and linear chain ether derivatives, and aromatic solvents among others. Preferably, the solvent is n-butanol. The poly(n-butyl titanate) polylinker 1500 contains a branched —Ti—O—Ti—O—Ti—O— backbone structure with butoxy (OBu) reactive groups.

Figure 16A:
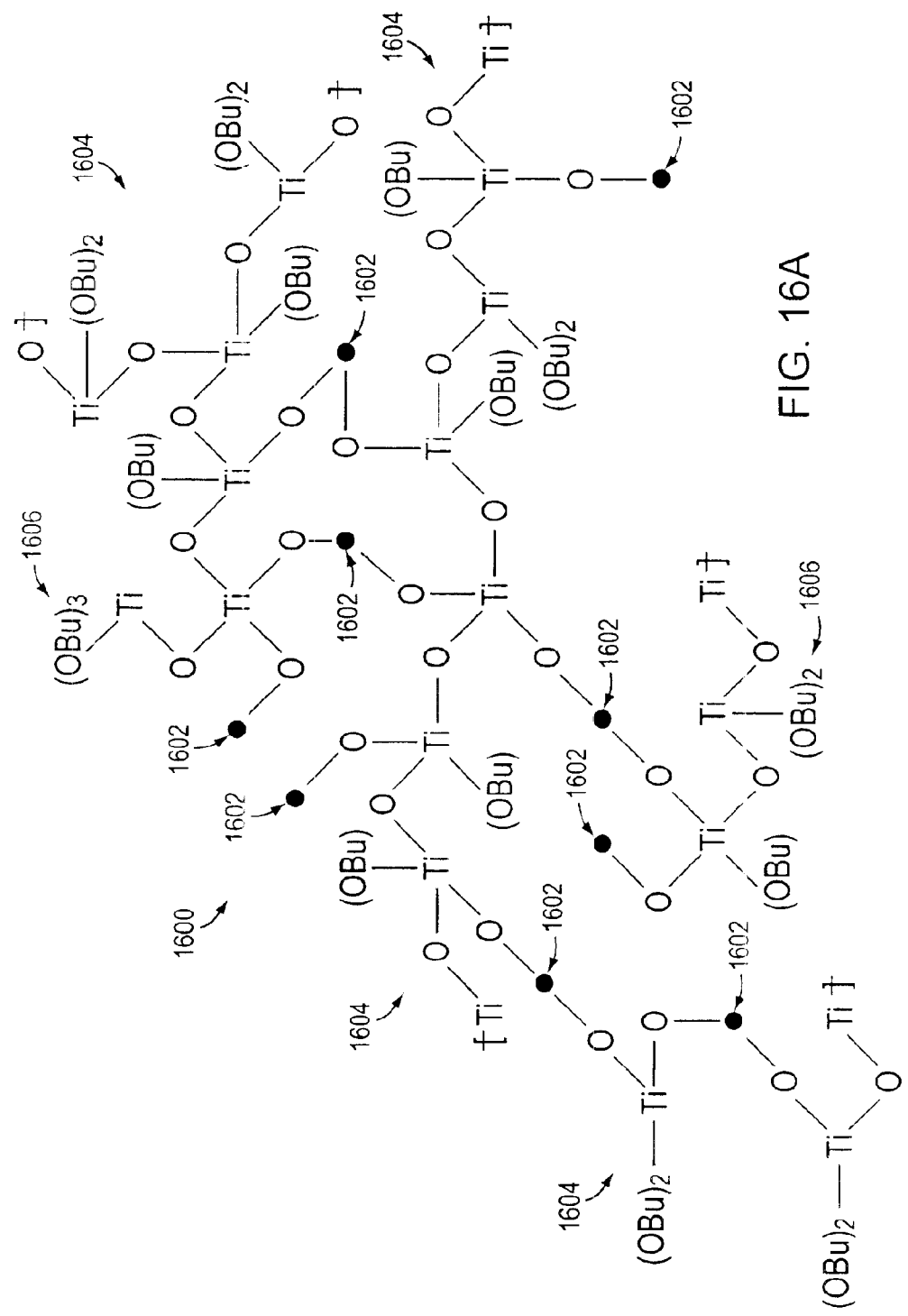
FIG. 16A shows the chemical structure of a titanium dioxide nanoparticle film interconnected with poly(n-butyl titanate), according to the invention.

FIG. 16A depicts the chemical structure of a nanoparticle film 1600, which is constructed from titanium dioxide nanoparticles 1602 interconnected by poly(n-butyl titanate) polylinker molecules 1604. It is believed that the reaction between surface hydroxyl groups of the $TiO_2$ nanoparticles 1602 with butoxy groups 1606 (or other alkoxy groups) of the polylinker 1604 leads to the bridging (or linking) of many nanoparticles 1602 together through highly stable covalent links, and as a result, interconnecting the nanoparticles 1602. Furthermore, it is believed that since the polylinker 1604 is a polymeric material with a chemical structure similar to that of $TiO_2$, even a few binding (or linking) sites between nanoparticles 1602 and polylinker 1604 will lead to a highly interconnected nanoparticle film 1600, with electronic and mechanical properties superior to those of a non-sintered or non-interconnected nanoparticle film.

Figure 16B:
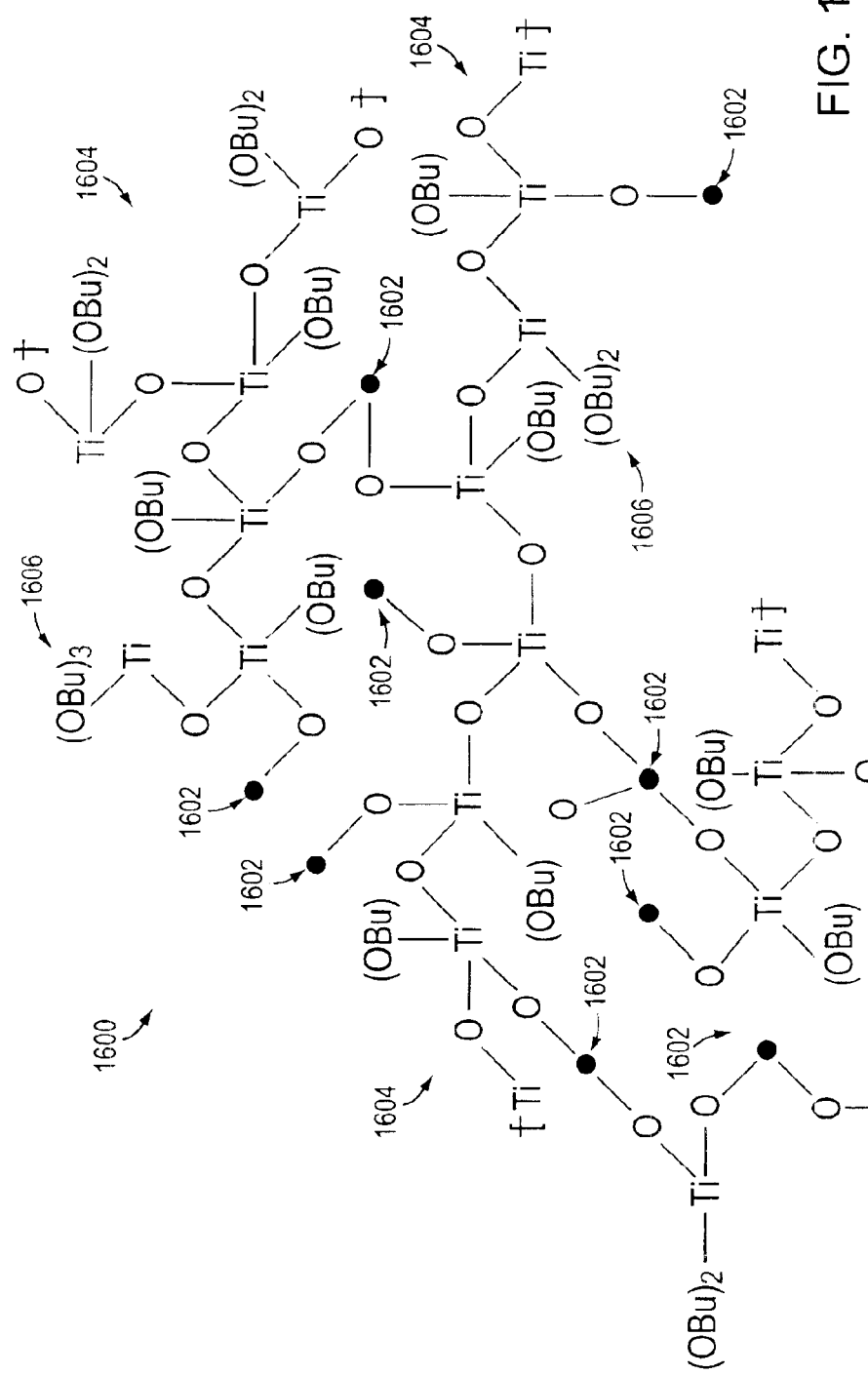
FIG. 16B shows the interconnected titanium dioxide nanoparticle film of FIG. 16A attached to a substrate oxide layer, according to an illustrative embodiment of the invention.

FIG. 16B depicts the chemical structure 1608 of the nanoparticle film 1600 from FIG. 16A formed on a substrate 1610, which includes an electrically-conducting oxide layer coating 1612, by applying the polylinker solution to the substrate 1610 and then depositing the nanoparticles 1602 on the polylinker 1604. In the illustrative example using titanium dioxide nanoparticles 1602, a polylinker solution including poly(n-butyl titanate) 1604 is dissolved in n-butanol and applied to the substrate 1610. The concentration of the polylinker 1604 can be adjusted to achieve a desired adhesive thickness for the polylinker solution. A titanium dioxide nanoparticulate film 1600 is then deposited on the polylinker coated substrate 1610. Reaction between the surface hydroxyl groups of the $TiO_2$ nanoparticles with reactive butoxy groups 1606 (or other alkoxy groups) of poly(n-butyl titanate) 1604 results in interconnecting the nanoparticles 1602, as well as connecting nanoparticles 1602 with the oxide layers 1612 on the substrate 1610.

EXAMPLE 1

Dip-Coating Application of Polylinker

In this illustrative example, a DSSC was formed as follows. A titanium dioxide nanoparticle film was coated on a $SnO_2$:F coated glass slide. The polylinker solution was a 1% (by weight) solution of the poly(n-butyl titanate) in n-butanol. In this embodiment, the concentration of the polylinker in the solvent was preferably less than 5% by weight. To interconnect the particles, the nanoparticle film coated slide was dipped in the polylinker solution for 15 minutes and then heated at 150° C. for 30 minutes. The polylinker treated $TiO_2$ film was then photosensitized with a $3 \times 10^{-4}$ N3 dye solution for 1 hour. The polylinker treated $TiO_2$ film coated slide was then fabricated into a 0.6 cm$^2$ photovoltaic cell by sandwiching a triiodide based liquid redox electrolyte between the $TiO_2$ film coated slide a platinum coated $SnO_2$:F glass slide using 2 mil SURLYN 1702 hot melt adhesive available from DuPont. The platinum coating was approximately 60 nm thick. The cell exhibited a solar conversion efficiency of as high as 3.33% at AM 1.5 solar simulator conditions (i.e., irradiation with light having an intensity of 1000 W/m$^2$). The completed solar cells exhibited an average solar conversion efficiency ("η") of 3.02%; an average open circuit voltage ("$V_{oc}$") of 0.66 V; an average short circuit current ("$I_{oc}$") of 8.71 mA/cm$^2$, and an average fill factor of 0.49 (0.48 to 0.52).

EXAMPLE 2

Polylinker-Nanoparticle Solution Application

In this illustrative example, a 5.0 mL suspension of titanium dioxide (P25, which is a titania that includes approximately 80% anatase and 20% rutile crystalline $TiO_2$ nanoparticles and which is available from Degussa-Huls) in n-butanol was added to 0.25 g of poly(n-butyl titanate) in 1 mL of n-butanol. In this embodiment, the concentration of the polylinker in the polylinker-nanoparticle solution was preferably less than about 50% by weight. The viscosity of the suspension changed from milk-like to toothpaste-like with no apparent particle separation. The paste was spread on a patterned $SnO_2$:F coated glass slide using a Gardner knife with a 60 μm thick tape determining the thickness of wet film thickness. The coatings were dried at room temperature forming the films. The air-dried films were subsequently heat treated at 150° C. for 30 minutes to remove solvent, and sensitized overnight with a $3 \times 10^4$ M N3 dye solution in ethanol. The sensitized photoelectrodes were cut into desired sizes and sandwiched between a platinum (60 nm thick) coated $SnO_2$:F coated glass slide and a tri-iodide based liquid electrolyte. The completed solar cells exhibited an average η of 2.9% (2.57% to 3.38%) for six cells at AM 1.5 conditions. The average $V_{oc}$ was 0.68 V (0.66 to 0.71 V); the average $I_{sc}$ was 8.55 $mA/cm^2$ (7.45 to 10.4 $mA/cm^2$); and the average fill factor was 0.49 (0.48 to 0.52).

EXAMPLE 3

DSSC Cells Formed Without Polylinker

In this illustrative example, an aqueous titanium dioxide suspension (P25) containing about 37.5% solid content was prepared using a microfluidizer and was spin coated on a fluorinated $SnO_2$ conducting electrode (15 $\Omega/cm^2$) that was itself coated onto a coated glass slide. The titanium dioxide coated slides were air dried for about 15 minutes and heat treated at 150° C. for 15 minutes. The slides were removed from the oven, cooled to about 80° C., and dipped into $3 \times 10^{-4}$ M N3 dye solution in ethanol for about 1 hour. The sensitized titanium dioxide photoelectrodes were removed from dye solution rinsed with ethanol and dried over a slide warmer at 40° C. The sensitized photoelectrodes were cut into small pieces (0.7 cm×0.5–1 cm active area) and sandwiched between platinum coated $SnO_2$:F-transparent conducting glass slides. A liquid electrolyte containing 1 M LiI, 0.05 M iodine, and 1 M t-butyl pyridine in 3-methoxybutyronitrile was applied between the photoelectrode and platinized conducting electrode through capillary action. Thus constructed photocells exhibited an average solar conversion efficiency of about 3.83% at AM 1.5 conditions. The η at AM 1.5 conditions and the photovoltaic characteristics $I_{sc}$, $V_{oc}$, voltage at maximum power output ("$V_m$"), and current at maximum power output ("$I_m$") of these cells are listed in Table 1 under column A.

EXAMPLE 4

DSSC Cells Formed With Various Concentrations of Polylinker Solution

In this illustrative example, a P25 suspension containing about 37.5% solid content was prepared using a microfluidizer and was spin coated on fluorinated $SnO_2$ conducting electrode (15 $\Omega/cm^2$) coated glass slide. The titanium dioxide coated slides were air dried for about 15 minutes and heat treated at 150° C. for 15 minutes. The titanium dioxide coated conducting glass slide were dipped into a polylinker solution including poly(n-butyl titanate) in n-butanol for 5 minutes in order to carry out interconnection (polylinking) of nanoparticles. The polylinker solutions used were 0.1% wt poly(n-butyl titanate), 0.4 wt % poly(n-butyl titanate), 1 wt % poly(n-butyl titanate), and 2 wt % poly(n-butyl titanate). After 5 minutes, the slides were removed from the polylinker solution, air dried for about 15 minutes and heat treated in an oven at 150° C. for 15 minutes to remove solvent. The slides were removed from the oven, cooled to about 80° C., and dipped into $3 \times 10^{-4}$ M N3 dye solution in ethanol for about 1 hour. The sensitized titanium dioxide photoelectrodes were removed from dye solution, rinsed with ethanol, and dried over a slide warmer at 40° C. The sensitized photoelectrodes were cut into small pieces (0.7 cm×0.5–1 cm active area) and sandwiched between platinum coated $SnO_2$:F-transparent conducting glass slides. A liquid electrolyte containing 1 M LiI, 0.05 M iodine, and 1 M t-butyl pyridine in 3-methoxybutyronitrile was applied between the photoelectrode and platinized conducting electrode through capillary action. The η at AM 1.5 conditions and the photovoltaic characteristics $I_{sc}$, $V_{oc}$, $V_m$, and $I_m$ of the constructed cells are listed in Table 1 for the 0.1 wt % solution under column B, for the 0.4 wt % solution under column C, for the 1 wt % solution under column D, and for the 2 wt % solution under column E.

EXAMPLE 5

Modifier Solutions

In this illustrative example, titanium dioxide coated transparent conducting oxide coated glass slides were prepared by spin coating process as described in Example 4. The titanium oxide coated conducting glass slides were treated with polylinker solution including a 0.01 M poly(n-butyl titanate) solution in n-butanol for 5 minutes to interconnect the nanoparticles. The slides were air dried for about 5 minutes after removing from the polylinker solution. The slides were later dipped into a modifier solution for about 1

TABLE 1

|  | A<br>Untreated | B<br>0.1% poly-<br>mer soln. | C<br>0.4% poly-<br>mer soln. | D<br>1% poly-<br>mer soln. | E<br>2% poly-<br>mer soln. |
| --- | --- | --- | --- | --- | --- |
| η (%) | Avg = 3.83<br>(3.37–4.15) | Avg. = 4.30<br>(4.15–4.55) | Avg = 4.55<br>(4.4–4.82) | Avg = 4.15<br>(3.48–4.46) | Avg = 4.15<br>(3.7–4.58) |
| $I_{sc}$<br>($mA/cm^2$) | Avg = 10.08<br>(8.88–10.86) | Avg = 10.96<br>(10.44–11.5) | Avg = 10.60<br>(9.79–11.12) | Avg = 11.00<br>(10.7–11.28) | Avg = 11.24<br>(10.82–11.51) |
| $V_{oc}$ (V) | Avg = 0.65<br>(0.65–0.66) | Avg = 0.66<br>(0.6–0.7) | Avg = 0.71<br>(0.69–0.74) | Avg = 0.7<br>(0.69–0.71) | Avg = 0.69<br>(0.68–0.71) |
| $V_m$ (V) | Avg = 0.454<br>(0.43–0.49) | Avg = 0.46<br>(0.43–0.477) | Avg = 0.50<br>(0.47–0.53) | Avg = 0.45<br>(0.4–0.47) | Avg = 0.44<br>(0.42–0.46) |
| $I_m$<br>($mA/cm^2$) | Avg = 8.4<br>(7.5–8.96) | Avg = 9.36<br>(8.75–9.71) | Avg = 9.08<br>(8.31–9.57) | Avg = 9.14<br>(8.70–9.55) | Avg = 9.28<br>(8.66–9.97) | minute. The modifier solutions used were 1:1 water/ethanol mixture, 1 M solution of t-butyl pyridine in 1:1 water/ethanol mixture, 0.05 M HCl solution in 1:1 water/ethanol mixture. One of the slides was treated with steam from humidifier for 15 seconds. The slides were air dried for 15 minutes and heat-treated at 150° C. for 15 minutes to remove solvent and then sensitized with a $3 \times 10^{-4}$ M N3 dye solution for 1 hour. The sensitized photoelectrodes were sandwiched between platinized $SnO_2$:F coated glass slides and studied for photovoltaic characteristics using a liquid electrolyte containing 1 M LiI, 0.05 M iodine, and 1 M t-butyl pyridine in 3-methoxybutyronitrile. Acid seems to help in increasing the photoconductivity and efficiency of these photocells. The $\eta$ at AM 1.5 conditions and the photovoltaic characteristics of the cells of this example are listed in Table 2 as follows: slides not dipped into a modifier solution and not treated with polylinker solution (column A); slides not dipped into a modifier, but treated with polylinker solution (column B); slides were first treated with polylinker solution and then dipped in 1:1 water/ethanol mixture (column C); slides were first treated with polylinker solution and then dipped in 1 M solution of t-butyl pyridine in 1:1 water/ethanol mixture (column D); slides were first treated with polylinker solution and then dipped in 0.05 M HCl solution in 1:1 water/ethanol mixture (column E); and slides were first treated with polylinker solution and then treated with steam from humidifier (column F).

EXAMPLE 7

Post-Interconnection Heating to 70° C.

In this illustrative example, a titanium-dioxide-coated, transparent-conducting-oxide-coated glass slide was prepared by a spin coating process as described in Example 4. The slide was dipped into 0.01 M poly(n-butyl titanate) in n-butanol for 30 seconds and was air-dried for 15 minutes. The slide was later heat treated at 70° C. for 10 minutes in an oven. The heat-treated titanium oxide layer was sensitized with N3 dye solution for 1 hour, washed with ethanol, and warmed on a slide warmer at 40° C. for 10 minutes. The sensitized photoelectrodes were cut into 0.7 cm×0.7 cm active area photocells and were sandwiched between platinized conducting electrodes. A liquid electrolyte containing 1 M LiI, 0.05 M iodine, and 1 M t-butyl pyridine in 3-methoxybutyronitrile was applied between the photoelectrode and platinized conducting electrode through capillary action. The photocells exhibited an average $\eta$ of 3.62% (3.55, 3.73 and 3.58), an average $V_{oc}$ of 0.75 V (0.74, 0.74 and 0.76 V), and average $I_{sc}$ of 7.96 mA/cm² (7.69, 8.22 and 7.97), all at AM 1.5 conditions.

EXAMPLE 8

Formation on a Flexible, Transparent Substrate

In this illustrative example, a PET substrate about 200 lm thick and about 5 inches by 8 feet square was coated with

TABLE 2

| | A Untreated | B Treated with 0.01 M TiBut | C Treated with 1:1 EtOH/H$_2$O | D Treated with 1 M t-BuPy/1:1 EtOH/H$_2$O | E Treated with 0.05 M HCl/1:1 EtOH/H$_2$O | F Steam from Humidifier for 15 sec. |
|---|---|---|---|---|---|---|
| $\eta$ (%) | Avg = 3.92 (3.75–4.15) | Avg = 4.41 (4.12–4.74) | Avg = 4.11 (4.06–4.15) | Avg = 4.34 (4.27–4.38) | Avg = 4.67 (4.61–4.73) | Avg = 4.41 (4.38–4.45) |
| $V_{oc}$ (V) | Avg = 0.66 (0.66–0.67) | Avg = 0.66 (0.65–0.66) | Avg = 0.65 (0.64–0.65) | Avg = 0.65 (0.64–0.66) | Avg = 0.66 (0.65–0.66) | Avg = 0.66 (0.66–0.67) |
| $I_{sc}$ (mA/cm²) | Avg = 9.97 (9.48–10.56) | Avg = 12.57 (11.7–13.22) | Avg = 11.85 (11.21–12.49) | Avg = 11.85 (11.21–12.49) | Avg = 12.51 (12.15–12.87) | Avg = 11.63 (11.25–12.01) |
| $V_m$ (V) | Avg = 0.468 (0.46–0.48) | Avg = 0.434 (0.4–0.457) | Avg = 0.44 (0.43–0.45) | Avg = 0.45 (0.44–0.456) | Avg = 0.457 (0.453–0.46) | Avg = 0.45 (0.44–0.46) |
| $I_m$ (mA/cm²) | Avg = 8.36 (7.85–8.89) | Avg = 10.08 (9.57–10.37) | Avg = 9.27 (9.01–9.53) | Avg = 9.52 (9.22–9.75) | Avg = 10.23 (10.17–10.29) | Avg = 9.67 (9.38–9.96) |

EXAMPLE 6

Post-Interconnection Heating to 150° C.

In this illustrative example, a titanium-dioxide-coated, transparent-conducting-oxide-coated glass slide was prepared by a spin coating process as described in Example 4. The slide was dipped into 0.01 M poly(n-butyl titanate) in n-butanol for 30 seconds and was air-dried for 15 minutes. The slide was later heat treated at 150° C. for 10 minutes in an oven. The heat-treated titanium oxide layer was sensitized with N3 dye solution for 1 hour, washed with ethanol, and warmed on a slide warmer at 40° C. for 10 minutes. The sensitized photoelectrodes were cut into 0.7 cm×0.7 cm active area photocells and were sandwiched between platinized conducting electrodes. A liquid electrolyte containing 1 M LiI, 0.05 M iodine, and 1 M t-butyl pyridine in 3-methoxybutyronitrile was applied between the photoelectrode and platinized conducting electrode through capillary action. The photocells exhibited an average $\eta$ of 3.88% (3.83, 3.9 and 3.92), an average $V_{oc}$ of 0.73 V (0.73, 0.74 and 0.73 V), and an average $I_{sc}$ of 9.6 mA/cm² (9.88, 9.65 and 9.26), all at AM 1.5 conditions.

ITO and loaded onto a loop coater. An 18.0 mL suspension of titanium dioxide (P25 with 25% solid content) in n-butanol and 0.5 g of poly(n-butyl titanate) in 10 mL of n-butanol were in-line blended and coated onto the ITO coated PET sheet. After deposition, the coating was heated at about 50° C. for about 1 minute. The interconnected nanoparticle layer was then dye-sensitized by coating with a $3 \times 10^{-4}$ M solution of N3 dye in ethanol.

C. Gel Electrolytes for DSSCs

According to further illustrative embodiments, the invention provides electrolyte compositions that include multi-complexable molecules (i.e., molecules containing 2 or more ligands capable of complexing) and redox electrolyte solutions, which are gelled using metal ions, such as lithium ions. The multi-complexable compounds are typically organic compounds capable of complexing with a metal ion at a plurality of sites. The electrolyte composition can be a reversible redox species that may be liquid by itself or solid components dissolved in a non-redox active solvent, which serves as a solvent for the redox species and does not participate in reduction-oxidation reaction cycle. Examples include common organic solvents and molten salts that do not contain redox active ions. Examples of redox species include, for example, iodide/triiodide, $Fe^{2+}/Fe^{3+}$, $Co^{2+}/Co^{3+}$, and viologens, among others. The redox components are dissolved in non-aqueous solvents, which include all molten salts. Iodide based molten salts, e.g., methylpropylimidazolium iodide, methylbutylimidazolium iodide, methylhexylimidazolium iodide, etc., are themselves redox active and can be used as redox active liquids by themselves or diluted with non-redox active materials like common organic solvents or molten salts that do not undergo oxidation-reduction reaction cycles. Multi-dendate inorganic ligands may also be a source of gelling compounds.

Figure 17:
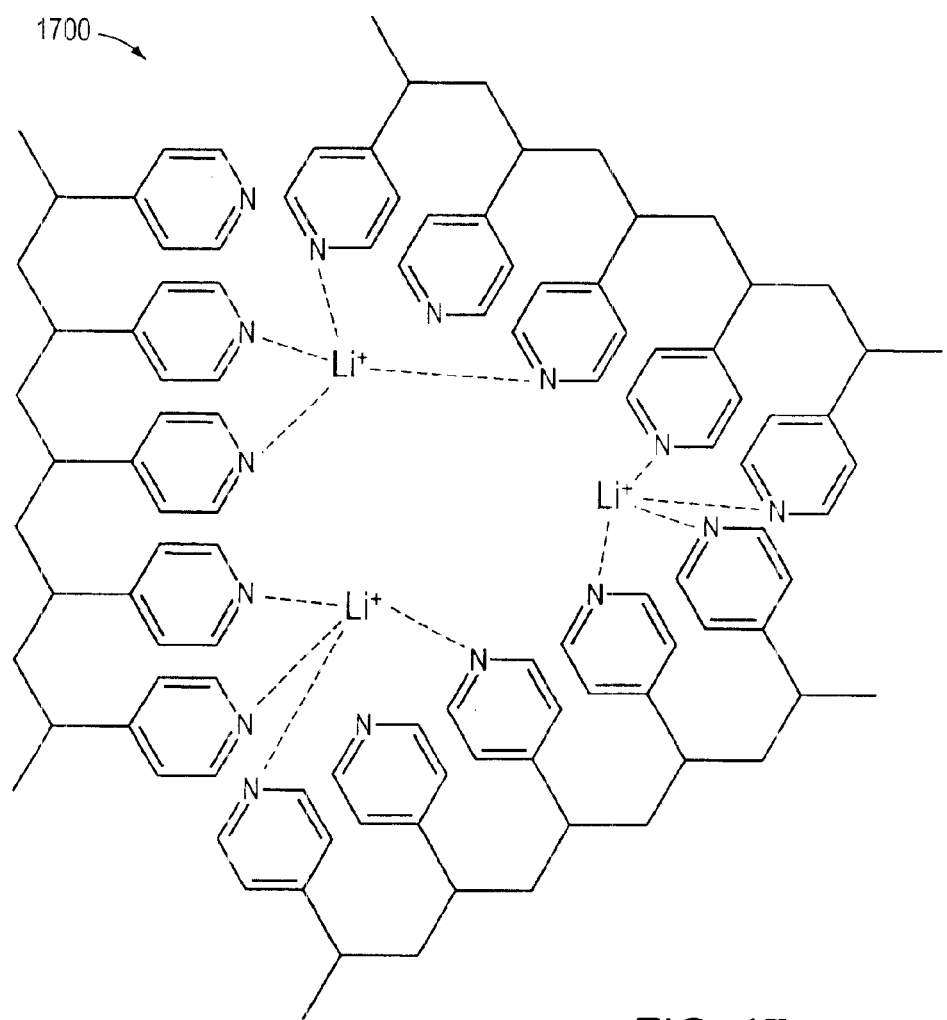
FIG. 17 depicts the chemical structure of gelation induced by a complexing reaction of $Li^+$ ions with complexable poly(4-vinyl pyridine) compounds, in accordance with an illustrative embodiment of the invention.

FIG. 17 depicts an illustrative embodiment 1700 of an electrolyte gelled using metal ions. Lithium ions are shown complexed with poly(4-vinyl pyridine). The lithium ions and the organic compounds, in this instance poly(4-vinyl pyridine) molecules capable of complexing at a plurality of sites with the lithium ions, can be used to gel a suitable electrolyte solution. An electrolyte composition prepared in accordance with the invention may include small amounts of water, molten iodide salts, an organic polymer, and other suitable compound gels upon the addition of a metal ion such as lithium. Gelled electrolytes may be incorporated into individual flexible photovoltaic cells, traditional solar cells, photovoltaic fibers, interconnected photovoltaic modules, and other suitable devices. The dotted lines shown in FIG. 17 represent the type of bonding that occurs in a photovoltaic gel electrolyte when the constituent electrolyte solution and organic compounds gel after the introduction of a suitable metal ion.

A non-exhaustive list of organic compounds that are capable of complexing with the metal ion at a plurality of sites, and which are suitable for use in the invention, include various polymers, starburst/dendrimeric molecules, and other molecules containing multiple functional groups, e.g., urethanes, esters, ethylene/propylene oxide/imines segments, pyridines, pyrimidines, N-oxides, imidazoles, oxazoles, triazoles, bipyridines, quinolines, polyamines, polyamides, ureas, β-diketones, and β-hydroxy ketones.

More generally, the multi-complexable molecules employed in various embodiments may be polymeric or small organic molecules that possess two or more ligand or ligating groups capable of forming complexes. Ligating groups are functional groups that contain at least one donor atom rich in electron density, e.g., oxygen, nitrogen, sulfur, or phosphorous, among others, and form monodentate or multidentate complexes with an appropriate metal ion. The ligating groups may be present in non-polymeric or polymeric material either in a side chain or part of the backbone, or as part of a dendrimer or starburst molecule. Examples of monodentate ligands include, for example, ethyleneoxy, alkyl-oxy groups, pyridine, and alkyl-imine compounds, among others. Examples of bi- and multidentate ligands include bipyridines, polypyridines, urethane groups, carboxylate groups, and amides.

According to various embodiments of the invention, dye-sensitized photovoltaic cells having a gel electrolyte 1700 including lithium ions are fabricated at or below room temperature or at elevated temperatures below about 300° C. The temperature may be below about 100° C., and preferably, the gelling of the electrolyte solution is performed at room temperature and at standard pressure. In various illustrative embodiments, the viscosity of the electrolyte solution may be adjusted to facilitate gel electrolyte deposition using printing techniques such as, for example, screen-printing and gravure-printing techniques. The complexing of lithium ions with various ligands can be broken at higher temperatures, thereby permitting the gel electrolyte compositions to be easily processed during DSSC based photovoltaic module fabrication. Other metal ions may also be used to form thermally reversible or irreversible gels. Examples of suitable metal ions include: $Li^+$, $Cu^{2+}$, $Ba^{2+}$, $Zn^{2+}$, $Ni^{2+}$, $Ln^{3+}$ (or other lanthanides), $Co^{2+}$, $Ca^{2+}$, $Al^{3+}$, $Mg^{2+}$, and any metal ion that complexes with a ligand.

Figure 18:
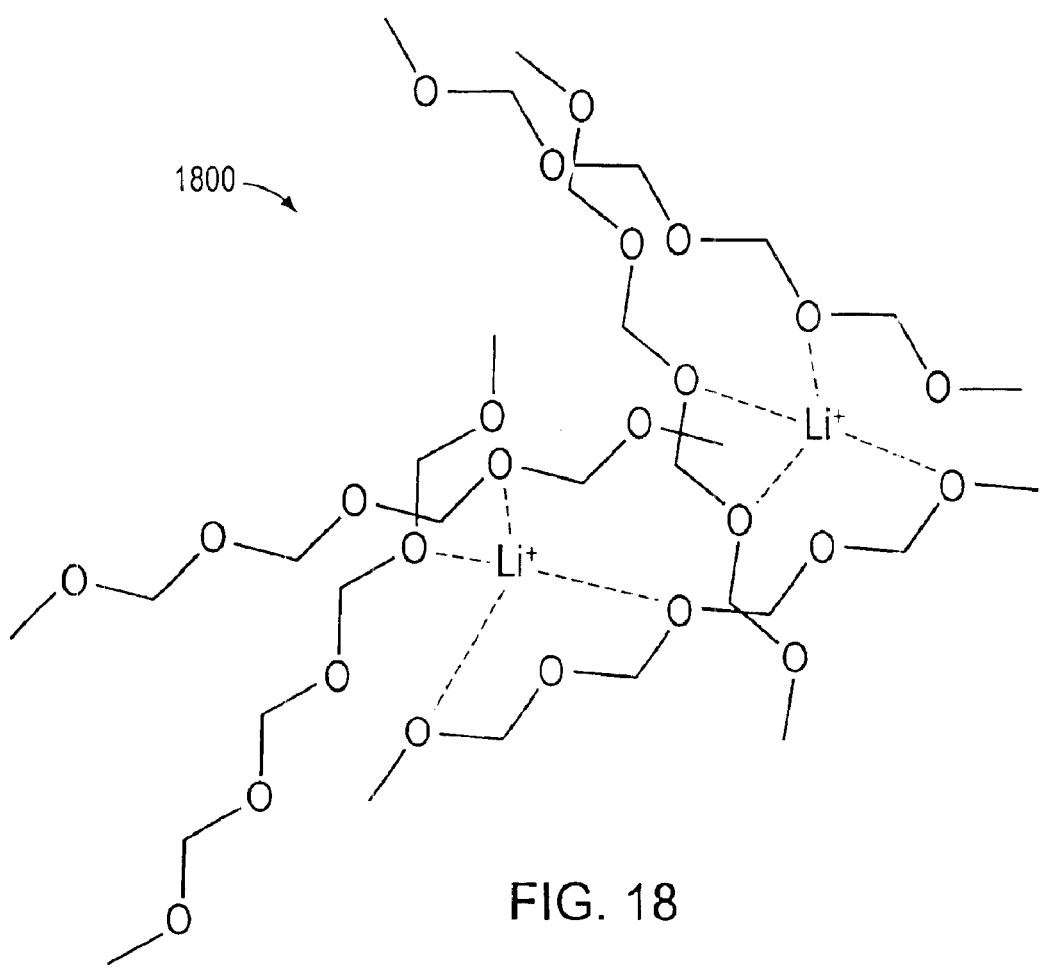
FIG. 18 shows the chemical structure of a lithium ion complexing with polyethylene oxide segments, according to another illustrative embodiment of the invention.

FIG. 18 depicts a gel electrolyte 1800 formed by the complexing of an organic polymer, polyethylene oxide (PEO), by lithium ions. The PEO polymer segments are shown as being complexed about the lithium ions and crosslinked with each other. In another embodiment, the metal ion complexed with various polymer chains can be incorporated into a reversible redox electrolyte species to promote gelation. The gel electrolyte composition that results from the combination is suitable for use in various photovoltaic cell embodiments such as photovoltaic fibers, photovoltaic cells, and electrically interconnected photovoltaic modules.

Referring back to FIGS. 1-4, the charge carrier material 115, 215, 315, and 415 can include an electrolyte composition having an organic compound capable of complexing with a metal ion at a plurality of sites; a metal ion such as lithium; and an electrolyte solution. These materials can be combined to produce a gelled electrolyte composition suitable for use in the charge carrier material 115, 215, 315, and 415 layer. In one embodiment, the charge carrier material 115, 215, 315, and 415 includes a redox system. Suitable redox systems may include organic and/or inorganic redox systems. Examples of such systems include, but are not limited to, cerium(III) sulfate/cerium(IV), sodium bromide/bromine, lithium iodide/iodine, $Fe^{2+}/Fe^{3+}$, $Co^{2+}/Co^3$, and viologens.

Further illustrative examples of the invention in the context of a DSSC having a gel electrolyte composition are provided below. The photoelectrodes used in the following illustrative examples were prepared according to the following procedure. An aqueous, titania suspension (P25, which was prepared using a suspension preparation technique with total solid content in the range of 30–37%) was spun cast on $SnO_2$:F coated glass slides (15 $\Omega cm^2$). The typical thickness of the titanium oxide coatings was around 8 μm. The coated slides were air dried at room temperature and sintered at 450° C. for 30 minutes. After cooling the slides to about 90 DC, the slides were immersed into $3 \times 10^{-4}$ M N3 dye solution in ethanol for 1 hour. The slides were removed and rinsed with ethanol and dried over slide a warmer at 40° C. for about 10 minutes. The slides were cut into about 0.7 cm×0.7 cm square active area cells. The prepared gels were applied onto photoelectrodes using a glass rod and were sandwiched between platinum-coated, $SnO_2$:F coated, conducting glass slides. The cell performance was measured at AM 1.5 solar simulator conditions (i.e., irradiation with light having an intensity of 1000 $W/m^2$).

EXAMPLE 9

Effect of Lithium Iodide in Standard Ionic Liquid Based Electrolyte Composition

In this illustrative example, the standard, ionic, liquid-based redox electrolyte composition that was used contained a mixture containing 99% (by weight) imidazolium iodide based ionic liquid and 1% water (by weight), combined with 0.25 M iodine and 0.3 M methylbenzimidazole. In various experimental trials, electrolyte solutions with at least a 0.10

M iodine concentration exhibit the best solar conversion efficiency. In a standard composition, butylmethylimidazolium iodide (MeBuImI) was used as the ionic liquid. Photovoltage decreased with increases in iodine concentration, while photoconductivity and conversion efficiency increased at least up to 0.25 M iodine concentration. Adding lithium iodide to the standard composition enhanced the photovoltaic characteristics $V_{oc}$ and $I_{sc}$ and the η. Therefore, in addition to lithium's use as a gelling agent, it may serve to improve overall photovoltaic efficiency. Table 3 summarizes the effect of LiI on photovoltaic characteristics.

TABLE 3

|  | Standard | Standard + 1 wt % LiI | Standard + 2 wt % LiI | Standard + 3 wt % LiI | Standard + 5 wt % LiI |
|---|---|---|---|---|---|
| η (%) | 2.9% | 3.75 | 3.75 | 3.70 | 3.93 |
| $V_{oc}$ (V) | 0.59 | 0.61 | 0.6 | 0.6 | 0.61 |
| $I_{sc}$ (mA/cm$^2$) | 10.08 | 11.4 | 11.75 | 11.79 | 12.62 |
| $V_m$ (V) | 0.39 | 0.4 | 0.39 | 0.4 | 0.39 |
| Im (mA/cm$^2$) | 7.44 | 9.02 | 9.64 | 9.0 | 10.23 |

The fill factor ("FF") is referenced below and can be calculated from the ratio of the solar conversion efficiency to the product of the open circuit voltage and the short circuit current, i.e., $FF=\eta/[V_{oc}*I_{sc}]$.

EXAMPLE 10

The Effect of Cations on the Enhancement in Photovoltaic Characteristics

In order to ascertain whether the enhancement in photovoltaic characteristics was due to the presence of lithium or iodide, controlled experimental trials using various iodides in conjunction with cations including lithium, potassium, cesium and tetrapropylammonium iodide were conducted. The iodide concentration was fixed at 376 μmols/gram of standard electrolyte composition. The standard composition used was a mixture containing 99% MeBuImI and 1% water, combined with 0.25 M iodine and 0.3 M methylbenzimidazole. 376 μmols of various iodide salts per gram of electrolyte composition were dissolved in the electrolyte. The complete dissolution of LiI was observed. The other salts took a long time to dissolve and did not dissolve completely over the course of the experimental trial. DSSC-based photovoltaic cells were fabricated using prepared electrolytes containing various cations. Table 4 shows the effect of the various cations on the photovoltaic characteristics. It is apparent from the second column of Table 4 that Li$^+$ ion shows enhanced photovoltaic characteristics compared to the standard formula, while the other cations do not appear to contribute to the enhancement of the photovoltaic characteristics.

TABLE 4

|  | Standard | Standard + LiI | Standard + NPR$_4$I | Standard + KI | Standard + CsI |
|---|---|---|---|---|---|
| η (%) | 3.23 | 4.39 | 2.69 | 3.29 | 3.23 |
| $V_{oc}$ (V) | 0.58 | 0.65 | 0.55 | 0.58 | 0.6 |
| $I_{sc}$ (mA/cm$^2$) | 10.96 | 12.03 | 9.8 | 9.91 | 10.14 |
| $V_m$ (V) | 0.36 | 0.44 | 0.36 | 0.4 | 0.4 |
| $I_m$ (mA/cm$^2$) | 8.96 | 9.86 | 7.49 | 8.25 | 8.32 |

EXAMPLE 11

Effect of Ionic Liquid Type

In one aspect of the invention, MeBuImI-based electrolyte compositions have been found to perform slightly better than MePrImI based electrolytes. In addition, experimental results demonstrate that a 1/1 blend of MeBuImI and MePrImI exhibit better performance than MeBuImI, as shown in Table 5.

TABLE 5

|  | 376 μmoles of LiI per 1 gram of MeBuImI based standard electrolyte composition. | 376 μmoles of LiI per 1 gram of MeBuImI/MePrImI based standard electrolyte composition. |
|---|---|---|
| η (%) | 3.64 | 3.99 |
| $V_{oc}$ (V) | 0.63 | 0.63 |
| $I_{sc}$ (mA/cm$^2$) | 11.05 | 11.23 |
| $V_m$ (V) | 0.42 | 0.42 |
| $I_m$ (mA/cm$^2$) | 8.69 | 9.57 |

EXAMPLE 12

Using Li-Induced Gelling in Composition A Instead of a Dibromocompound

In this illustrative example, a Composition A was prepared by dissolving 0.09 M of iodine in a mixed solvent consisting of 99.5% by weight of 1-methyl-3-propyl imidazolium iodide and 0.5% by weight of water. Then, 0.2 g of poly(4-vinylpyridine) ("P4VP"), a nitrogen-containing compound, was dissolved in 10 g of the Composition A Further, 0.2 g of 1,6-dibromohexane, an organic bromide, was dissolved in the resultant Composition A solution, so as to obtain an electrolyte composition, which was a precursor to a gel electrolyte.

Gelling occurred quickly when 5 wt % of lithium iodide (376 μmols of lithium salt per gram of standard electrolyte composition) was used as the gelling agent in an electrolyte composition containing (i) 2 wt % P4VP and (ii) a mixture containing 99.5% MePrImI and 0.5% water. The gel did not flow when a vial containing the Li-induced gel was tilted upside down. One approach using a dibromo compound produced a phase-segregated electrolyte with cross-linked regions suspended in a liquid, which flows (even after gelling at 100° C. for 30 minutes). A comparison of the photovoltaic characteristics of Composition A, with and without LiI, is presented in the following Tables 6 and 7. The results demonstrate that functional gels suitable for DSSC-based photovoltaic cell fabrication can be obtained using lithium ions, while also improving the photovoltaic characteristics.

TABLE 6

|  | Composition A with dibromohexane | Composition A with 2 wt. % P4VP | MeBuImI based electrolyte + 2 wt. % P4VP + 5 wt. % LiI |
|---|---|---|---|
| η (%) | 2.6 | 3.04 | 3.92 |
| $V_{oc}$ (V) | 0.59 | 0.58 | 0.65 |
| $I_{sc}$ (mA/cm$^2$) | 9.73 | 10.0 | 11.45 |
| $V_m$ (V) | 0.38 | 0.38 | 0.42 |
| $I_m$ (mA/cm$^2$) | 6.82 | 8.04 | 9.27 |

TABLE 7

| | (a) Composition A where MePrImI:water is 99.5:0.5 and with 2% P4VP and 0.09 M Iodine | (b) Same composition as (a), but with 5 wt % of LiI |
|---|---|---|
| Physical Properties | Reddish fluid; flows well | Non-scattering Gel; does not flow; can be thinned by applying force using a glass rod. |
| Efficiency | 2.53% | 3.63% |
| $V_{oc}$ | 0.55 V | 0.62 V |
| $I_{sc}$ | 9.82 mA/cm$^2$ | 12.29 mA/cm$^2$ |
| $V_m$ | 0.343 V | 0.378 V |
| FF | 0.47 | 0.47 |

EXAMPLE 13

Effect of Anions of Lithium Salts on the Efficiency and Photovoltage of DSSCs

Experiments were performed to study the effect of counter ions on lithium, given lithium's apparent role in enhancing the overall efficiency of DSSCs. 376 μmols of LiI, LiBr, and LiCl were used per gram of the electrolyte composition containing MePrImI, 1% water, 0.25 M iodine and 0.3 M methylbenzimidazole in order to study the photovoltaic characteristics of the cells. The photovoltaic characteristics of cells containing these electrolytes are presented in Table 8.

TABLE 8

| | Electrolyte composition with LiI | Electrolyte composition with LiBr | Electrolyte composition with LiCl |
|---|---|---|---|
| Efficiency | 3.26% | 3.64% | 3.71% |
| $V_{oc}$ | 0.59 V | 0.62 V | 0.65 V |
| $I_{sc}$ | 10.98 mA/cm$^2$ | 11.96 mA/cm$^2$ | 11.55 mA/cm$^2$ |
| $V_m$ | 0.385 V | 0.4 V | 0.40 V |
| FF | 0.5 | 0.49 | 0.49 |

EXAMPLE 14

Passivation and Improved Efficiency and Photovoltage of DSSCs

In the field of photovoltaic cells, the term passivation refers to the process of reducing electron transfer to species within the electrolyte of a solar cell. Passivation typically includes treating a nanoparticle layer by immersion in a solution of t-butylpyridine in methoxypropionitrile or other suitable compound. After the nanomatrix layer, such as a titania sponge, of a photovoltaic cell has been treated with a dye, regions in the nanomatrix layer where the dye has failed to adsorb may exist. A passivation process is typically performed on a DSSC to prevent the reversible electron transfer reaction from terminating as result of reducing agents existing at the undyed regions. The typical passivation process does not appear to be necessary when ionic liquid compositions containing various lithium salts and/or other alkali metal salts are used in the DSSCs. A photovoltage greater than 0.65 V was achieved using a chloride salt of lithium without a passivation process.

In this illustrative example, a DSSC was passivated by immersing it in a solution containing 10 wt % of t-butylpyridine in methoxypropionitrile for 15 minutes. After passivation, the DSSC was dried on a slide warmer maintained at 40° C. for about 10 minutes. Electrolyte compositions containing MePrImI, 1% water, 0.3 M methylbenzimidazole, and 0.25 M iodine were gelled using 376 Emotes of LiI, LiBr, and LiCl per gram of standard electrolyte composition used during this study. Adding a t-butylpyridine-based passivation agent to the electrolyte enhanced the DSSC's photovoltage, but decreased the efficiency of the DSSC by decreasing the photoconductivity. Table 9 summarizes the effects of passivation on photovoltaic characteristics of electrolytes containing various lithium halides.

TABLE 9

| | Electrolyte gelled with LiI | Electrolyte gelled with LiBr | Electrolyte gelled with LiCl |
|---|---|---|---|
| Efficiency | 3.5% | 3.65% | 3.85% |
| $V_{oc}$ | 0.61 V | 0.63 V | 0.65 V |
| $I_{sc}$ | 10.96 mA/cm$^2$ | 11.94 mA/cm$^2$ | 11.75 mA/cm$^2$ |
| $V_m$ | 0.395 V | 0.4 V | 0.405 V |
| FF | 0.52 | 0.49 | 0.5 |

EXAMPLE 15

Lithium's Role in Gelling the Electrolyte Compositions Containing Polyvinylpyridine and the Effect of Other Alkali Metal Ions on Gelability Lithium cation appears to have a unique effect in gelling ionic liquid composition containing complexable polymers, e.g., P4VP, in as small an amount as 2 wt %. Other alkali metal ions such as sodium, potassium, and cesium were used to carry out gelling experiments. Alkali metal salts such as lithium iodide, sodium chloride, potassium iodide, cesium iodide were added to portions of electrolyte composition containing propylmethylimidazolium iodide (MePrImI), 1% water, 0.25 M iodine, and 0.3 M methylbenzimidazole. Only compositions containing lithium iodide gelled under the experimental conditions used. The remaining three compositions containing sodium, potassium, and cesium did not gel at the experimental conditions used. Divalent metal ions, such as calcium, magnesium, and zinc, or trivalent metals, such as aluminum or other transition metal ions, are other potential gelling salts.

EXAMPLE 16

Effect of Iodine and Lithium Concentration on Ionic Liquid Electrolyte Gels

In this illustrative example, gels were prepared by adding lithium salts to an electrolyte composition containing MeBuImI, iodine, and 2 wt % P4VP. The photovoltaic characteristics of the gels were tested using high-temperature sintered, N3 dye sensitized titanium-oxide photoelectrodes and platinized SnO$_2$:F coated glass slides. Both LiI and LiCl gelled the ionic liquid-based compositions that contained small amounts (2% was sufficient) of complexable polymers like P4VP. In compositions lacking methylbenzimidazole, the lithium did not effect the photovoltage. 5 wt % corresponds to a composition including about 376 μmoles of lithium salt per gram of ionic liquid and a mixture of 99 wt % butylmethylimidazolium iodide, 1 wt % water, 0.3 M methyl benzimidazole, and 0.25 M iodine. Therefore, 1 wt % corresponds to a 376/5≅75 μmoles of lithium salt per gram of ionic liquid composition. The photovoltaic characteristics are summarized in Table 10.

TABLE 10

| | 5% LiI | 2.5% LiI | 5% LiCl | 2.5% LiCl |
|---|---|---|---|---|
| 0.05 M Iodine | $\eta$ = 1.6% $V_{oc}$ = 0.6 V $I_{sc}$ = 4.89 mA FF = 0.54 $V_m$ = 0.445 V | $\eta$ = 1.23% $V_{oc}$ = 0.59 V $I_{sc}$ = 4.21 mA FF = 0.495 $V_m$ = 0.415 V | $\eta$ = 0.64% $V_{oc}$ = 0.59 V $I_{sc}$ = 2.95 mA FF = 0.36 $V_m$ = 0.4 V | $\eta$ = 1.19% $V_{oc}$ = 0.58 V $I_{sc}$ = 3.87 mA FF = 0.53 $V_m$ = 0.426 V |
| 0.1 M Iodine | $\eta$ = 1.22% $V_{oc}$ = 0.48 V $I_{sc}$ = 6.46 mA FF = 0.39 $V_m$ = 0.349 V | $\eta$ = 1.29% $V_{oc}$ = 0.56 V $I_{sc}$ = 5.12 mA FF = 0.45 $V_m$ = 0.386 V | $\eta$ = 2.83% $V_{oc}$ = 0.57 $I_{sc}$ = 9.04 mA FF = 0.55 $V_m$ = 0.422 V | $\eta$ = 2.06% $V_{oc}$ = 0.58 $I_{sc}$ = 7.14 mA FF = 0.5 $V_m$ = 0.42 V |
| 0.25 M Iodine | $\eta$ = 2.58% $V_{oc}$ = 0.55 V $I_{sc}$ = 11.49 mA FF = 0.41 $V_m$ = 0.338 V | $\eta$ = 3.06% $V_{oc}$ = 0.55 V $I_{sc}$ = 10.78 mA FF = 0.52 $V_m$ = 0.36 V | $\eta$ = 3.4% $V_{oc}$ = 0.56 V $I_{sc}$ = 11.32 mA FF = 0.54 $V_m$ = 0.369 V | $\eta$ = 2.6% $V_{oc}$ = 0.56 V $I_{sc}$ = 10.18 mA FF = 0.46 $V_m$ = 0.364 V |

EXAMPLE 17

Effect of Polymer Concentration on Gelability and Photovoltaic Characteristics of Redox Electrolyte Gels In this illustrative example, polymer concentration was varied to study its effect on gel viscosity and photovoltaic characteristics. The electrolyte composition used for this study was a mixture containing 99% MeBuImI, 1% water, 0.25 M iodine, 0.6 M LiI, and 0.3 M methylbenzimidazole. The concentration of the polymer, P4VP was varied from 1% to 5%. The electrolyte composition with 1% P4VP did flow slowly when the vial containing the gel was tilted down. The gels with 2%, 3%, and 5% did not flow. The gel with 5% P4VP appeared much more solid when compared to the 2% P4VP preparation. Table 11 summarizes the photovoltaic characteristics of the gels containing the various P4VP contents that were studied.

The results show that the photovoltaic characteristics do not vary with the increases in viscosity achieved by increasing the P4VP content. Therefore, the viscosity of the gel can be adjusted without causing degradation to the photovoltaic characteristics. Methylbenzimidazole may be necessary to achieve high TI. Increasing the iodine concentration up to 0.25 M also increased the efficiency. Beyond 0.25 M, the photovoltage decreased drastically, reducing the overall efficiency. Other metal ions or cations like cesium, sodium, potassium or tetraalkylammonium ions were not found to contribute to the efficiency enhancement and did not cause gelling of the electrolyte solutions. Furthermore, chloride anion was found to enhance the efficiency along with lithium, by improving the photovoltage without causing decreased photoconductivity in compositions containing methylbenzimidazole.

TABLE 11

| Photovoltaic Characteristics | 1% P4VP | 2% P4VP | 3% P4VP | 5% P4VP |
|---|---|---|---|---|
| $\eta$ (%) | 3.23 | 3.48 | 3.09 | 3.19 |
| $I_{sc}$ (mA/cm$^2$) | 10.74 | 10.42 | 12.03 | 10.9 |
| $V_{oc}$ (V) | 0.59 | 0.59 | 0.6 | 0.61 |
| $V_m$ (V) | 0.39 | 0.4 | 0.38 | 0.40 |
| $I_m$ (mA/cm$^2$) | 8.27 | 8.69 | 8.07 | 8.03 |
| FF | 0.51 | 0.57 | 0.43 | 0.48 |

D. Co-Sensitizers

According to one illustrative embodiment, the photosensitizing agent described above includes a first sensitizing dye and second electron donor species, the "co-sensitizer." The first sensitizing dye and the co-sensitizer may be added together or separately to form the photosensitized interconnected nanoparticle material 112, 212, 312, and 412 shown in FIGS. 1–4. As mentioned above with respect to FIGS. 1–4, the sensitizing dye facilitates conversion of incident visible light into electricity to produce the desired photovoltaic effect. In one illustrative embodiment, the co-sensitizer donates electrons to an acceptor to form stable cation radicals, which improves the efficiency of charge transfer from the sensitizing dye to the semiconductor oxide nanoparticle material and reduces back electron transfer to the sensitizing dye or co-sensitizer. The co-sensitizer preferably includes (1) conjugation of the free electron pair on a nitrogen atom with the hybridized orbitals of the aromatic rings to which the nitrogen atom is bonded and, subsequent to electron transfer, the resulting resonance stabilization of the cation radicals by these hybridized orbitals; and (2) a coordinating group, such as a carboxy or a phosphate, the function of which is to anchor the co-sensitizer to the semiconductor oxide. Examples of suitable co-sensitizers include, but are not limited to, aromatic amines (e.g., such as triphenylamine and its derivatives), carbazoles, and other fused-ring analogues.

Once again referring back to FIGS. 1–4, the co-sensitizer is electronically coupled to the conduction band of the photosensitized interconnected nanoparticle material 112, 212, 312, and 412. Suitable coordinating groups include, but are not limited to, carboxylate groups, phosphate groups, or chelating groups, such as, for example, oximes or alpha keto-enolates.

Tables 12–18 below present results showing the increase in photovoltaic cell efficiency when co-sensitizers are co-adsorbed along with sensitizing dyes on the surface of high temperature sintered or low temperature interconnected titania. In Tables 12–16, characterization was conducted using AM 1.5 solar simulator conditions (i.e., irradiation with light having an intensity of 1000 W/m$^2$). A liquid electrolyte including 1 M LiI, 1 M t-butylpyridine, 0.5 M I$_2$ in 3-methoxypropanitrile was employed. The data shown in the tables indicates an enhancement of one or more operating cell parameters for both low-temperature-interconnected (Tables 15, 17 and 18) and high-temperature-sintered (Tables 12, 13, 14 and 16) titania nanoparticles. The solar cells characteristics listed include $\eta$, $V_{oc}$, $I_{sc}$, FF, $V_m$, and $I_m$. The ratios of sensitizer to co-sensitizer are based on the concentrations of photosensitizing agents in the sensitizing solution.

In particular, it was discovered that aromatic amines enhance cell performance of dye sensitized titania solar cells if the concentration of the co-sensitizer is below about 50 mol % of the dye concentration. An example of the general molecular structure of the preferred aromatic amines is shown in FIGS. 19 and 20. Preferably, the concentration of the co-sensitizer is in the range of about 1 mol % to about 20 mol %, and more preferably in the range of about 1 mol % to about 5 mol %.

Figure 19A:
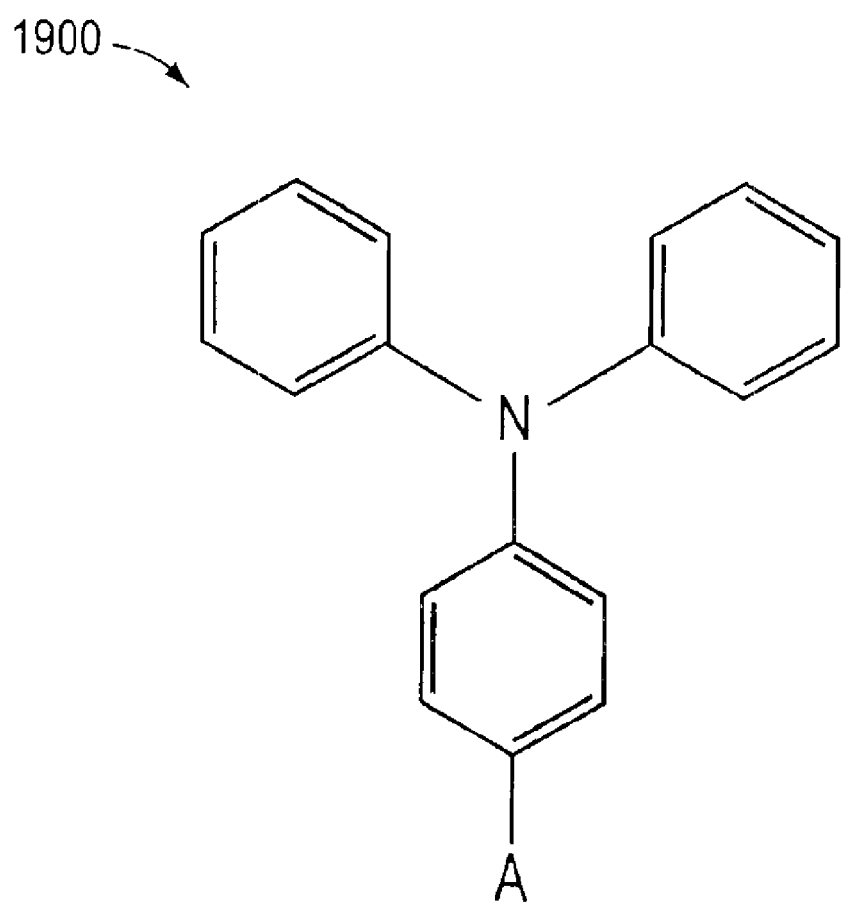
FIGS. 19A–19C depict chemical structures for exemplary co-sensitizers, according to illustrative embodiments of the invention.
Figure 19B:
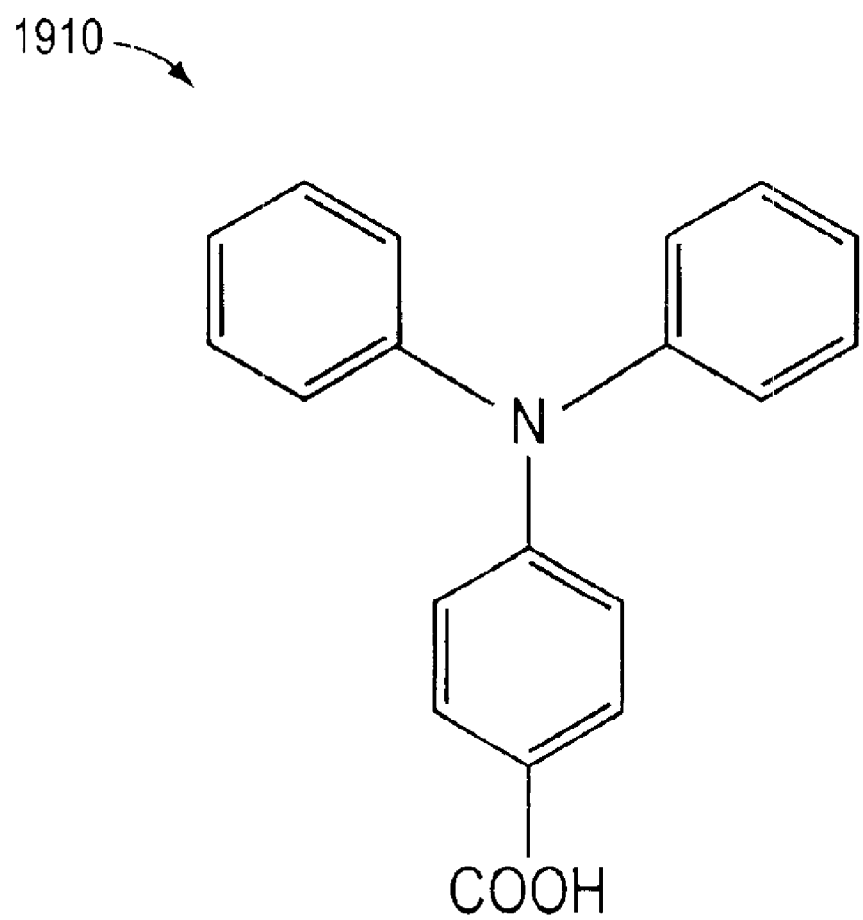
Figure 19C:
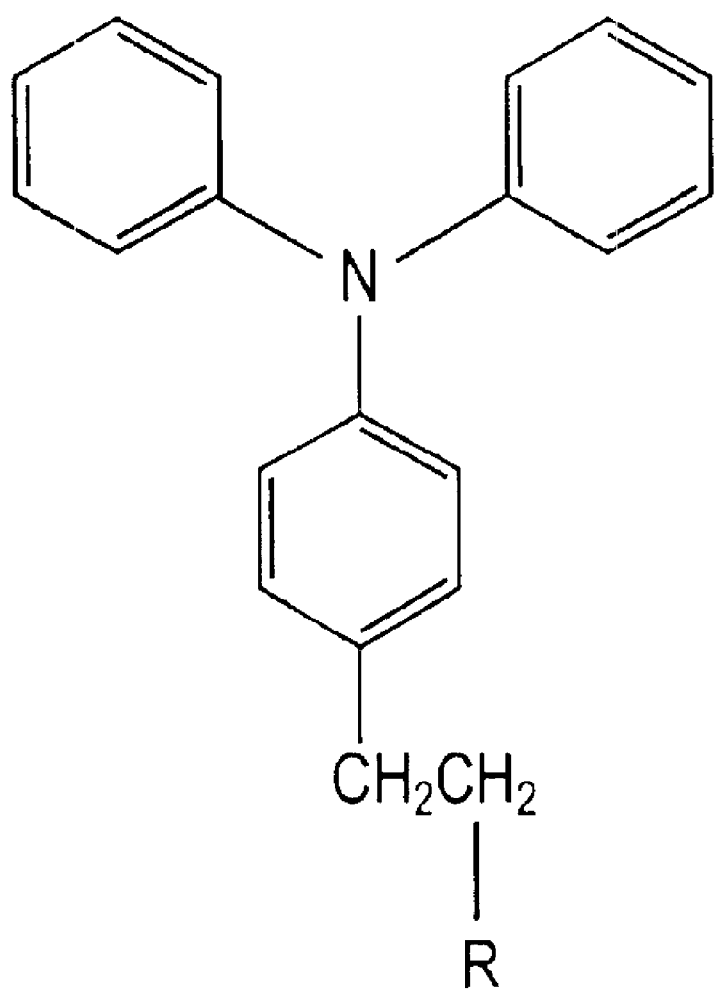

FIG. 19A depicts a chemical structure 1900 that may serve as a co-sensitizer. The molecule 1900 adsorbs to the surface of a nanoparticle layer via its coordinating group or chelating group, A. A may be a carboxylic acid group or derivative thereof, a phosphate group, an oxime or an alpha ketoenolate, as described above. FIG. 19B depicts a specific embodiment 1910 of the structure 1900, namely DPABA (diphenylaminobenzoic acid), where A=COOH. FIG. 19C depicts another specific amine 1920 referred to as DEAPA (N', N-diphenylaminophenylpropionic acid), with A as the carboxy derivative COOH.

Figure 20A:
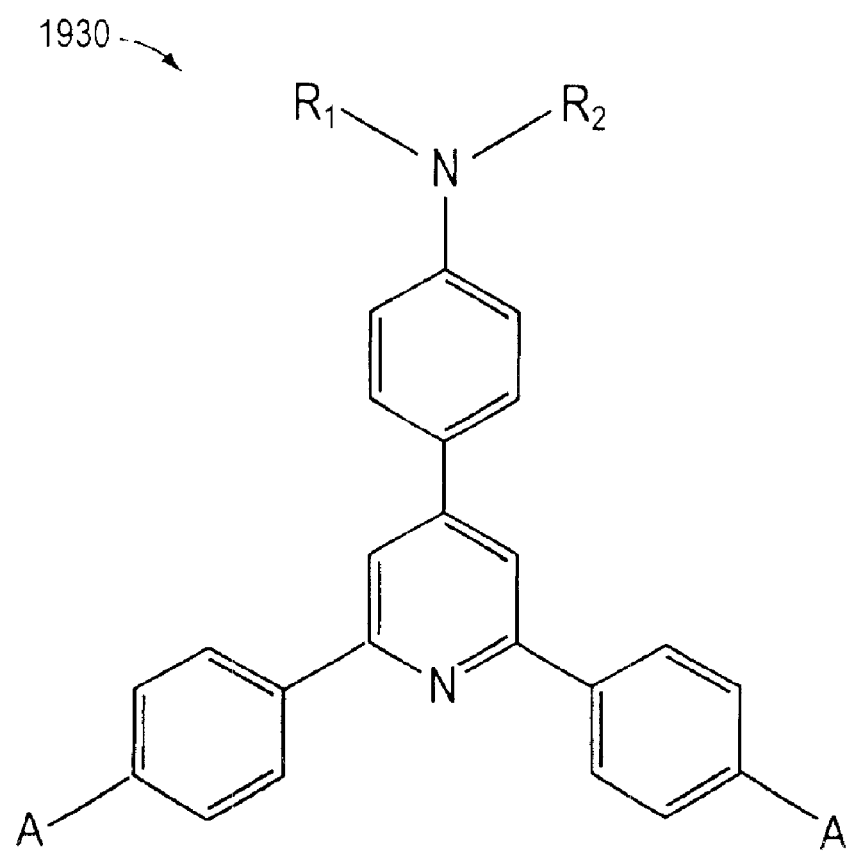
FIGS. 20A–20B depict additional exemplary chemical structures of co-sensitizers, according to illustrative embodiments of the invention.
Figure 20B:
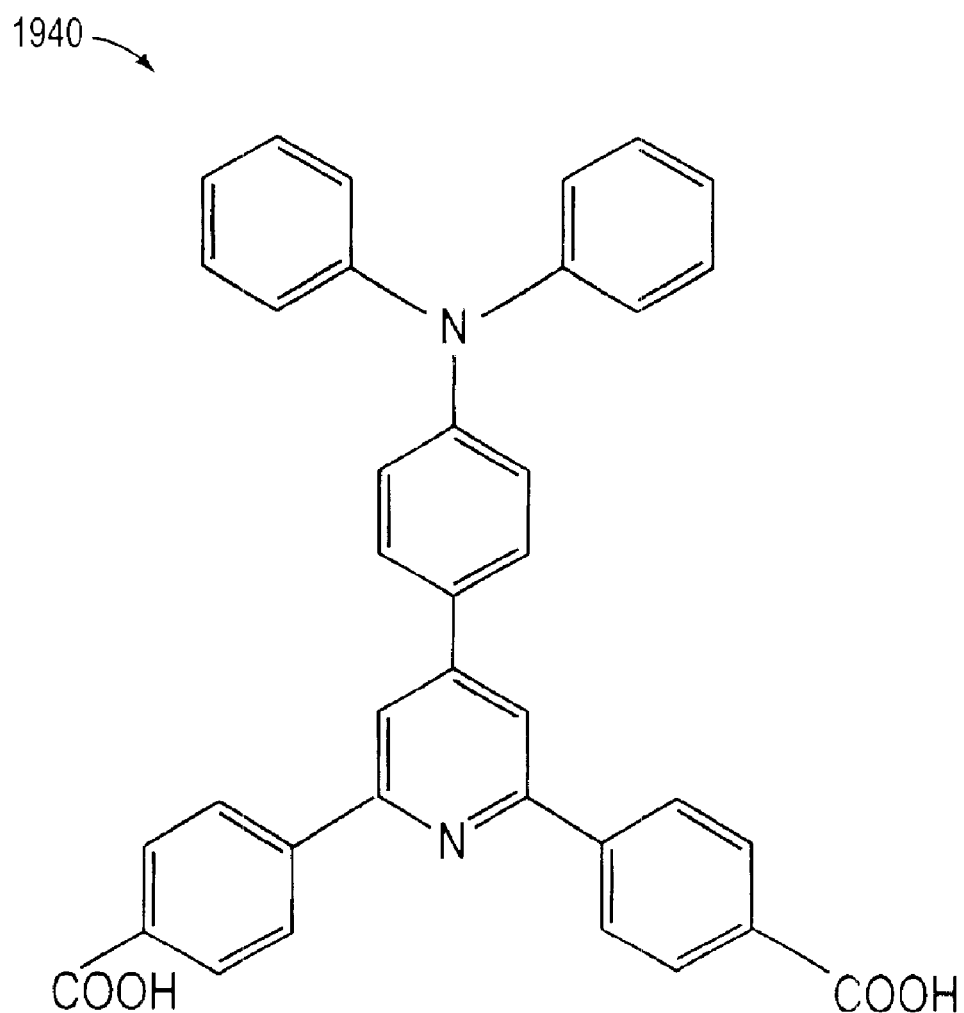

FIG. 20A shows a chemical structure 1930 that may serve as either a co-sensitizer, or a sensitizing dye. The molecule does not absorb radiation above 500 nm, and adsorbs to a surface of the nanoparticle layer via its coordinating or chelating groups, A. A may be a carboxylic acid group or derivative thereof, a phosphate group, an oxime or an alpha ketoenolate. $R_1$ and $R_2$ may each be a phenyl, alkyl, substituted phenyl, or benzyl group. Preferably, the alkyl may contain between 1 and 10 carbons. FIG. 20B depicts a specific embodiment 1940 of the structure 1930, namely DPACA (2,6 bis (4-benzoicacid)-4-(4-N,N-diphenylamino) phenylpyridine carboxylic acid), where $R_1$ and $R_2$ are phenyl and A is COOH.

DPACA 1940 may be synthesized as follows. 1.49 g (9.08 mmol) of 4-acetylbenzoic acid, 1.69 g (6.18 mmol) of 4-N,N-diphenylbenzaldehyde, and 5.8 g (75.2 mmol) of ammonium acetate were added to 60 ml of acetic acid in a 100 ml round bottom flask equipped with a condenser and stirring bar. The solution was heated to reflux with stirring under nitrogen for 5 hours. The reaction was cooled to room temperature and poured into 150 ml of water, which was extracted with 150 ml of dichloromethane. The dichloromethane was separated and evaporated with a rotary evaporator, resulting in a yellow oil. The oil was then eluted on a silica gel column with 4% methanol/dichloromethane to give the product, an orange solid. The solid was washed with methanol and vacuum dried to give 0.920 g of DPACA. The melting point was 199°–200° C., the $\lambda_{max}$ was 421 nm, and the molar extinction coefficient, E was 39,200 L mole$^{-1}$ cm$^{-1}$. The structure was confirmed by NMR spectroscopy. The solar cells characteristics listed include $\eta$, $V_{oc}$, $I_{sc}$, FF, $V_m$, and $I_m$. The ratios of sensitizer to co-sensitizer are based on the concentrations of photosensitizing agents in the sensitizing solution.

Table 12 shows the results for high-temperature-sintered titania; photosensitized by overnight soaking in solutions of 1 mM N3 dye and three concentrations of DPABA. Table 12 also shows that the average $\eta$ is greatest for the preferred 20/1 (dye/co-sensitizer) ratio.

TABLE 12

| | | I-V CHARACTERIZATION | | | | | | | |
|---|---|---|---|---|---|---|---|---|---|
| General conditions | Conditions | Cell area cm$^2$ | $V_{oc}$ V | $I_m$ mA/cm$^2$ | $V_m$ V | $I_{sc}$ mA/cm$^2$ | FF | $\eta$ % | $\sigma$ |
| Adsorption Temp. RT ° C. Solvent of Dye EtOH | 1 mM N3/EtOH, Overnight CONTROL Average | 0.44 0.52 0.54 0.50 | 0.62 0.64 0.63 0.63 | 6.69 6.81 6.95 6.82 | 0.44 0.43 0.41 0.43 | 8.38 8.59 8.72 8.56 | 0.56 0.54 0.52 0.54 | 2.91 2.94 2.84 2.90 | 0.05 |
| Dye Concen. N3, DPABA Sintering Temp 450° C., 30 minutes | 1 mM N3, 0.05 mM DPABA in EtOH for Overnight; 20/1 Average | 0.50 0.53 0.50 0.51 | 0.64 0.64 0.64 0.64 | 7.70 7.40 7.70 7.60 | 0.45 0.45 0.45 0.45 | 9.31 9.30 9.38 9.33 | 0.58 0.56 0.57 0.57 | 3.43 3.31 3.44 3.39 | 0.07 |
| Thickness of Film TiO$_2$, ~10$\mu$m | 1 mM N3, 1 mM DPABA in EtOH for Overnight; 1/1 Average | 0.53 0.50 0.42 0.48 | 0.63 0.63 0.63 0.63 | 7.21 6.75 7.11 7.02 | 0.41 0.44 0.44 0.43 | 8.58 8.23 8.67 8.49 | 0.55 0.57 0.57 0.56 | 2.96 2.97 3.13 3.02 | 0.10 |
| Electrolyte AM 1.5D, 1.1 Sun | 1 mM N3, 10 mM DPABA in EtOH for Overnight; 1/10 | 0.33 0.52 0.49 | 0.58 0.60 0.60 | 4.95 5.51 5.53 | 0.42 0.42 0.42 | 6.02 6.67 6.72 | 0.60 0.58 0.58 | 2.08 2.31 2.32 | |
| Film pretreatment | Average | 0.45 | 0.59 | 5.33 | 0.42 | 6.47 | 0.58 | 2.24 | 0.14 |

Figure 21:
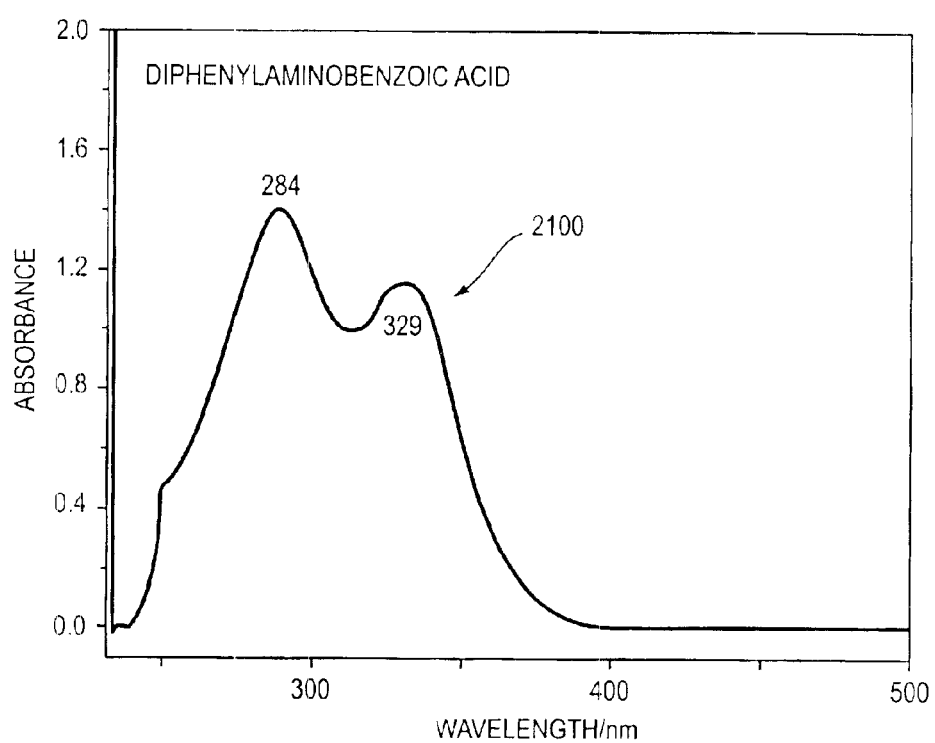
FIG. 21 shows a graph of the absorbance of diphenylaminobenzoic acid.

Table 13 shows the results of using a cut-off filter (third and fourth entries) while irradiating a cell to test its I-V characteristics. Table 13 also shows that the efficiency of the cell still improves when DPABA is present, indicating that its effect when no filter is present is not simply due to absorption of UV light by DPABA followed by charge injection. FIG. 21 shows a plot 2100 of the absorbance versus wavelength for DPABA, which absorbs below 400 nm. Because the absorbance of the cut-off is large, little light reaches the absorption bands of DPABA.

TABLE 13

| | I-V CHARACTERIZATION | | | | | | | |
|---|---|---|---|---|---|---|---|---|
| Conditions | Cell area cm$^2$ | $V_{oc}$ V | $I_m$ mA/cm$^2$ | $V_m$ V | $I_{sc}$ mA/cm$^2$ | FF | $\eta$ % | $\sigma$ |
| 1 mM N3 in EtOH Overnight control | 0.49 0.49 0.49 | 0.70 0.70 0.73 | 8.62 8.13 7.93 | 0.46 0.45 0.51 | 11.02 10.20 9.69 | 0.51 0.51 0.57 | 3.97 3.66 4.04 | |

TABLE 13-continued

| Conditions | Cell area cm$^2$ | $V_{oc}$ V | $I_m$ mA/cm$^2$ | $V_m$ V | $I_{sc}$ mA/cm$^2$ | FF | η % | σ |
|---|---|---|---|---|---|---|---|---|
| Average | 0.49 | 0.71 | 8.23 | 0.47 | 10.30 | 0.53 | 3.89 | 0.20 |
| 1 mM N3 | 0.49 | 0.71 | 9.05 | 0.46 | 11.53 | 0.51 | 4.16 | |
| 0.05 mM | 0.49 | 0.71 | 9.24 | 0.46 | 11.56 | 0.52 | 4.25 | |
| DPABA in EtOH, 20/1 Overnight | 0.49 | 0.71 | 9.39 | 0.46 | 11.50 | 0.53 | 4.32 | |
| Average | 0.49 | 0.71 | 9.23 | 0.46 | 11.53 | 0.52 | 4.24 | 0.08 |
| 1 mM N3 in | 0.49 | 0.69 | 6.35 | 0.47 | 7.83 | 0.55 | 4.26 | 455 nm cut |
| EtOH | 0.49 | 0.69 | 6.05 | 0.46 | 7.44 | 0.54 | 3.98 | off filter |
| Overnight control | 0.49 | 0.72 | 5.74 | 0.52 | 6.94 | 0.60 | 4.27 | used, 70 mW/cm$^2$ |
| Average | 0.49 | 0.70 | 6.05 | 0.48 | 7.40 | 0.56 | 4.17 | 0.17 |
| 1 mM N3 | 0.49 | 0.70 | 6.73 | 0.47 | 8.21 | 0.55 | 4.52 | 455 nm cut |
| 0.05 mM | 0.49 | 0.70 | 6.74 | 0.47 | 8.19 | 0.55 | 4.53 | off filter |
| DPABA in EtOH, 20/1 Overnight | 0.49 | 0.70 | 6.74 | 0.49 | 8.25 | 0.57 | 4.72 | used, 70 mW/cm$^2$ |
| Average | 0.49 | 0.70 | 6.74 | 0.48 | 8.22 | 0.56 | 4.59 | 0.11 |

Table 14 shows that the addition of triphenylamine itself (i.e., no titania complexing groups such as carboxy) does not significantly enhance efficiency under the stated conditions.

TABLE 14

| Conditions | Cell area cm$^2$ | $V_{oc}$ V | $I_m$ mA/cm$^2$ | $V_m$ V | $I_{sc}$ mA/cm$^2$ | FF | η % | σ |
|---|---|---|---|---|---|---|---|---|
| 0.5 mM N3 in EtOH, Overnight | 0.49 | 0.70 | 7.96 | 0.45 | 9.82 | 0.52 | 3.58 | |
| | 0.49 | 0.71 | 8.09 | 0.48 | 9.58 | 0.57 | 3.88 | |
| | 0.49 | 0.70 | 7.47 | 0.48 | 8.83 | 0.58 | 3.59 | |
| Average | 0.49 | 0.70 | 7.84 | 0.47 | 9.41 | 0.56 | 3.68 | 0.17 |
| 0.5 mM N3, 0.025 mM TPA in EtOH Overnight 20/1 | 0.49 | 0.69 | 7.44 | 0.45 | 9.21 | 0.53 | 3.35 | |
| | 0.49 | 0.69 | 7.61 | 0.47 | 9.75 | 0.53 | 3.58 | |
| | 0.49 | 0.69 | 6.98 | 0.45 | 8.56 | 0.53 | 3.14 | |
| Average | 0.49 | 0.69 | 7.34 | 0.46 | 9.17 | 0.53 | 3.36 | 0.22 |
| 0.5 mM N3, 2.0 mM TPA in EtOH Overnight ¼ | 0.49 | 0.68 | 4.62 | 0.44 | 5.66 | 0.53 | 2.03 | |
| | 0.49 | 0.66 | 4.18 | 0.45 | 5.38 | 0.53 | 1.88 | |
| | 0.49 | 0.66 | 4.51 | 0.45 | 5.82 | 0.53 | 2.03 | |
| Average | 0.49 | 0.67 | 4.44 | 0.45 | 5.62 | 0.53 | 1.98 | 0.09 |

Table 15 shows that the effect is present using low temperature interconnected titania and that the 20/1 (dye/co-sensitizer) ratio is preferred.

TABLE 15

| Conditions | Cell area cm$^2$ | $V_{oc}$ V | $I_m$ mA/cm$^2$ | $V_m$ V | $I_{sc}$ mA/cm$^2$ | FF | η % | σ |
|---|---|---|---|---|---|---|---|---|
| 0.5 mM N3/EtOH, overnight, control | 0.49 | 0.73 | 8.32 | 0.50 | 10.56 | 0.54 | 4.16 | |
| | 0.51 | 0.72 | 8.13 | 0.49 | 10.30 | 0.54 | 3.98 | |
| | 0.50 | 0.72 | 8.56 | 0.47 | 10.65 | 0.52 | 4.02 | |
| Average | 0.50 | 0.72 | 8.34 | 0.49 | 10.50 | 0.53 | 4.06 | 0.09 |
| 0.5 mM N3, 0.0125 mM DPABA in EtOH, 40/1, overnight | 0.49 | 0.73 | 8.55 | 0.51 | 10.48 | 0.57 | 4.36 | |
| | 0.53 | 0.72 | 8.53 | 0.50 | 11.00 | 0.54 | 4.27 | |
| | 0.49 | 0.74 | 8.08 | 0.54 | 10.96 | 0.54 | 4.36 | |
| Average | 0.50 | 0.73 | 8.39 | 0.52 | 10.81 | 0.55 | 4.33 | 0.06 |
| 0.5 mM N3, 0.017 mM DPABA in EtOH, 30/1, overnight | 0.49 | 0.73 | 9.07 | 0.49 | 11.31 | 0.54 | 4.44 | |
| | 0.49 | 0.75 | 8.64 | 0.52 | 10.97 | 0.55 | 4.49 | |
| | 0.52 | 0.73 | 8.19 | 0.52 | 10.88 | 0.54 | 4.26 | |
| Average | 0.50 | 0.74 | 8.63 | 0.51 | 11.05 | 0.54 | 4.40 | 0.12 |
| 0.5 mM N3, 0.025 mM DPABA in EtOH, 20/1 overnight | 0.50 | 0.75 | 8.57 | 0.52 | 11.56 | 0.51 | 4.46 | |
| | 0.49 | 0.74 | 8.88 | 0.52 | 11.45 | 0.54 | 4.62 | |
| | 0.53 | 0.74 | 9.01 | 0.51 | 12.08 | 0.51 | 4.60 | |
| Average | 0.51 | 0.74 | 8.82 | 0.52 | 11.70 | 0.52 | 4.56 | 0.09 |
| 0.5 mM N3, 0.5 mM DPABA in EtOH, 1/1, overnight | 0.49 | 0.72 | 8.85 | 0.48 | 10.78 | 0.55 | 4.25 | |
| | 0.51 | 0.74 | 8.62 | 0.47 | 10.37 | 0.53 | 4.05 | |
| | 0.50 | 0.75 | 8.38 | 0.49 | 10.02 | 0.55 | 4.11 | |
| Average | 0.50 | 0.74 | 8.62 | 0.48 | 10.39 | 0.54 | 4.14 | 0.10 |
| 0.5 mM N3, 5 mM DPABA in EtOH, 1/10, overnight | 0.49 | 0.68 | 7.56 | 0.44 | 9.09 | 0.54 | 3.33 | |
| | 0.51 | 0.69 | 7.62 | 0.46 | 9.34 | 0.54 | 3.51 | |
| | 0.49 | 0.67 | 7.25 | 0.45 | 8.84 | 0.55 | 3.26 | |
| Average | 0.50 | 0.68 | 7.48 | 0.45 | 9.09 | 0.54 | 3.36 | 0.13 |

Table 16 shows results for high-temperature-sintered titania sensitized with a high concentration of N3 dye while maintaining a 20/1 ratio of dye to co-sensitizer. Entries 1 and 2 show the increase in cell performance due to co-sensitizer. Entry 3 shows the effect of DPABA alone as a sensitizer, demonstrating that this material acts as a sensitizer by itself when irradiated with the full solar spectrum, which includes low-intensity UV radiation.

TABLE 16

I–V CHARACTERIZATION

| General conditions | Conditions | Cell area cm² | $V_{oc}$ V | $I_m$ mA/cm² | $V_m$ V | $I_{sc}$ mA/cm² | FF | η % | σ |
|---|---|---|---|---|---|---|---|---|---|
| Adsorption Temp. RT °C. Solvent of Dye | 8 mM N3/aprotic polar solvent, 1 hour CONTROL | 0.49 0.49 0.49 | 0.68 0.67 0.68 | 8.51 8.28 9.16 | 0.44 0.44 0.42 | 10.07 9.75 10.80 | 0.55 0.56 0.52 | 3.74 3.64 3.85 | |
| Aprotic polar solvent | average | 0.49 | 0.68 | 8.65 | 0.43 | 10.21 | 0.54 | 3.74 | 0.10 |
| | 8 mM N3, 0.4 mM DPABA in aprotic polar solvent, 20/1 1 hour | 0.49 0.49 0.49 | 0.68 0.68 0.65 | 9.52 9.96 9.81 | 0.44 0.44 0.42 | 11.18 11.59 12.13 | 0.55 0.56 0.52 | 4.19 4.38 4.12 | |
| | average | 0.49 | 0.67 | 9.76 | 0.43 | 11.63 | 0.54 | 4.23 | 0.14 |
| | 5 mM DPABA in aprotic polar solvent Overnight | 0.49 0.49 0.49 | 0.55 0.55 0.58 | 1.02 0.94 0.89 | 0.42 0.41 0.44 | 1.22 1.13 1.07 | 0.64 0.62 0.63 | 0.43 0.39 0.39 | |
| | | 0.49 | 0.56 | 0.95 | 0.42 | 1.14 | 0.63 | 0.40 | 0.02 |

Table 17 shows results for low-temperature-interconnected titania. Entry 5 shows the affect of DPACA alone as a sensitizer, demonstrating that this material acts as a sensitizer by itself when irradiated with the full solar spectrum, which includes low-intensity UV radiation.

TABLE 17

I–V CHARACTERIZATION

| Conditions | Cell area cm² | $V_{oc}$ V | $I_m$ mA/cm² | $V_m$ V | $I_{sc}$ mA/cm² | FF | η % | σ |
|---|---|---|---|---|---|---|---|---|
| 0.5 mM N3/EtOH, overnight, control | 0.51 0.53 0.50 | 0.73 0.72 0.72 | 8.40 8.13 8.77 | 0.50 0.49 0.47 | 10.84 10.30 10.87 | 0.53 0.54 0.53 | 4.20 3.98 4.12 | |
| Average | 0.51 | 0.72 | 8.43 | 0.49 | 10.67 | 0.53 | 4.10 | 0.11 |
| 0.5 mM N3, 0.01 mM DPACA in EtOH, 50/1, overnight | 0.49 0.50 0.49 | 0.73 0.74 0.72 | 8.10 7.95 8.10 | 0.51 0.50 0.50 | 10.39 10.01 9.85 | 0.54 0.54 0.57 | 4.13 3.98 4.05 | |
| Average | 0.49 | 0.73 | 8.05 | 0.50 | 10.08 | 0.55 | 4.05 | 0.08 |
| 0.5 mM N3, 0.02 mM DPACA in EtOH, 25/1, overnight | 0.49 0.52 0.49 | 0.74 0.73 0.76 | 8.38 8.18 8.08 | 0.50 0.48 0.54 | 10.48 9.74 9.45 | 0.54 0.55 0.61 | 4.19 3.93 4.36 | |
| Average | 0.50 | 0.74 | 8.21 | 0.51 | 9.89 | 0.57 | 4.16 | 0.22 |
| 0.5 mM N3, | 0.49 | 0.73 | 9.07 | 0.46 | 11.31 | 0.51 | 4.17 | |

TABLE 17-continued

I–V CHARACTERIZATION

| Conditions | Cell area cm² | $V_{oc}$ V | $I_m$ mA/cm² | $V_m$ V | $I_{sc}$ mA/cm² | FF | η % | σ |
|---|---|---|---|---|---|---|---|---|
| 0.5 mM DPACA in EtOH, 1/1, overnight | 0.49 0.52 | 0.75 0.76 | 7.41 7.93 | 0.53 0.52 | 9.24 9.12 | 0.57 0.59 | 3.93 4.12 | |
| Average | 0.50 | 0.75 | 8.14 | 0.50 | 9.89 | 0.56 | 4.07 | 0.13 |
| 0.5 mM N3, 5.0 mM DPACA in EtOH, 1/10, overnight | 0.56 0.52 0.50 | 0.73 0.73 0.72 | 6.36 6.63 6.53 | 0.49 0.49 0.49 | 7.59 7.84 7.59 | 0.56 0.57 0.59 | 3.12 3.25 3.20 | |
| Average | 0.53 | 0.73 | 6.51 | 0.49 | 7.67 | 0.57 | 3.19 | 0.07 |
| 5.0 mM DPACA in EtOH, overnight | 0.43 0.45 0.49 | 0.65 0.65 0.66 | 3.12 2.93 2.83 | 0.49 0.49 0.49 | 3.77 3.51 3.40 | 0.62 0.63 0.62 | 1.53 1.44 1.39 | |
| Average | 0.46 | 0.65 | 2.96 | 0.49 | 3.56 | 0.62 | 1.45 | 0.07 |

Table 18 shows results for low-temperature-interconnected titania. Entry 6 shows the affect of DEAPA alone as a sensitizer, demonstrating that this material acts as a sensitizer by itself when irradiated with the full solar spectrum, which includes low-intensity UV radiation.

TABLE 18

I–V CHARACTERIZATION

| General conditions | Conditions | Cell area cm² | $V_{oc}$ V | $I_m$ mA/cm² | $V_m$ V | $I_{sc}$ mA/cm² | FF | η % | σ |
|---|---|---|---|---|---|---|---|---|---|
| Adsorption Temp. RT °C. Solvent of Dye EtOH | 0.5 mM N3/EtOH, overnight, control | 0.51 0.49 0.49 | 0.72 0.75 0.74 | 8.67 8.15 8.74 | 0.49 0.47 0.44 | 10.60 10.50 10.63 | 0.56 0.49 0.49 | 4.25 3.83 3.85 | |
| | average | 0.50 | 0.74 | 8.52 | 0.47 | 10.58 | 0.51 | 3.97 | 0.24 |

TABLE 18-continued

| | | | I–V CHARACTERIZATION | | | | | | |
|---|---|---|---|---|---|---|---|---|---|
| General conditions | Conditions | Cell area cm² | V$_{oc}$ V | I$_m$ mA/cm² | V$_m$ V | I$_{sc}$ mA/cm² | FF | η % | σ |
| Dye Concen. N3, DEAPA Sintering Temp 120° C., 10 minutes | 0.5 mM N3, 0.01 mM DEAPA in EtOH, 50/1 overnight average | 0.49 0.52 0.50 0.50 | 0.70 0.71 0.72 0.71 | 8.68 8.57 8.40 8.55 | 0.44 0.45 0.45 0.45 | 11.00 11.11 10.61 10.91 | 0.50 0.49 0.49 0.49 | 3.82 3.86 3.78 3.82 | 0.04 |
| Thickness of Film TiO₂, 7 µm | 0.5 mM N3, 0.02 mM DEAPA in EtOH, 25/1 overnight average | 0.51 0.53 0.49 0.51 | 0.74 0.73 0.73 0.73 | 8.90 8.76 8.40 8.69 | 0.44 0.44 0.45 0.44 | 10.92 10.51 10.21 10.55 | 0.48 0.50 0.51 0.50 | 3.92 3.85 3.78 3.85 | 0.07 |
| Liquid Electrolyte AM 1.5D, 1 Sun | 0.5 mM N3, 0.5 mM DEAPA in EtOH, 1/1, overnight average | 0.49 0.51 0.50 0.50 | 0.71 0.71 0.70 0.71 | 8.94 8.83 8.18 8.65 | 0.43 0.44 0.42 0.43 | 10.78 10.37 9.71 10.29 | 0.50 0.53 0.51 0.51 | 3.84 3.89 3.44 3.72 | 0.25 |
| Film pretreatment | 0.5 mM N3, 5.0 mM DEAPA in EtOH, 1/10, overnight average | 0.52 0.49 0.49 0.50 | 0.60 0.59 0.59 0.59 | 0.88 0.71 0.75 0.78 | 0.45 0.44 0.44 0.44 | 1.08 0.85 0.91 0.95 | 0.61 0.62 0.61 0.62 | 0.40 0.31 0.33 0.35 | 0.04 |
| | 5.0 mM DEAPA in CHCl3, overnight average | 0.49 0.49 0.51 0.50 | 0.54 0.54 0.52 0.53 | 0.41 0.35 0.45 0.40 | 0.42 0.39 0.40 0.40 | 0.49 0.46 0.52 0.49 | 0.65 0.55 0.67 0.62 | 0.17 0.14 0.18 0.16 | 0.02 |

E. Semiconductor Oxide Formulations

In a further illustrative embodiment, the invention provides semiconductor oxide formulations for use with DSSCs formed using a low temperature semiconductor oxide nanoparticle interconnection, as described above. The semiconductor oxide formulations may be coated at room temperature and, upon drying at temperatures between about 50° C. and about 150° C., yield mechanically stable semiconductor nanoparticle films with good adhesion to the transparent conducting oxide (TCO) coated plastic substrates. In one embodiment, the nanoparticle semiconductor of the photosensitized interconnected nanoparticle material 112, 212, 312, and 412 is formed from a dispersion of commercially available TiO₂ nanoparticles in water, a polymer binder, with or without acetic acid. The polymer binders used include, but are not limited to, polyvinylpyrrolidone (PVP), polyethylene oxide (PEO), hydroxyethyl cellulose (HOEC), hydroxypropyl cellulose, polyvinyl alcohol (PVA) and other water-soluble polymers. The ratio of semiconductor oxide particles, e.g., TiO₂, to polymer can be between about 100:0.1 to 100:20 by weight, and preferably is between about 100:1 to 100:10 by weight. The presence of acetic acid in the formulation helps to improve the adhesion of the coating to the TCO coated substrate. However, acetic acid is not essential to this aspect of the invention and semiconductor oxide dispersions without acetic acid perform satisfactorily. In another embodiment, the TiO₂ nanoparticles are dispersed in an organic solvent, such as, e.g., isopropyl alcohol, with polymeric binders such as, e.g., PVP, butvar, ethylcellulose, etc.

In another illustrative embodiment, the mechanical integrity of the semiconductor oxide coatings and the photovoltaic performance of the dye sensitized cells based on these coatings can be further improved by using a crosslinking agent to interconnect the semiconductor nanoparticles. The polylinkers described above may be used for this purpose. These crosslinking agents can be applied, e.g., in the titania coating formulation directly or in a step subsequent to drying the titania coating as a solution in an organic solvent such as ethanol, isopropanol or butanol. For example, subsequent heating of the films to temperatures in the range of about 70° C. to about 140° C. leads to the formation of TiO₂ bridges between the TiO₂ nanoparticles. Preferably, the concentration of the polylinker in this example ranges from about 0.01 to about 20 weight % based on titania.

F. Semiconductor Primer Layer Coatings

Figure 22:
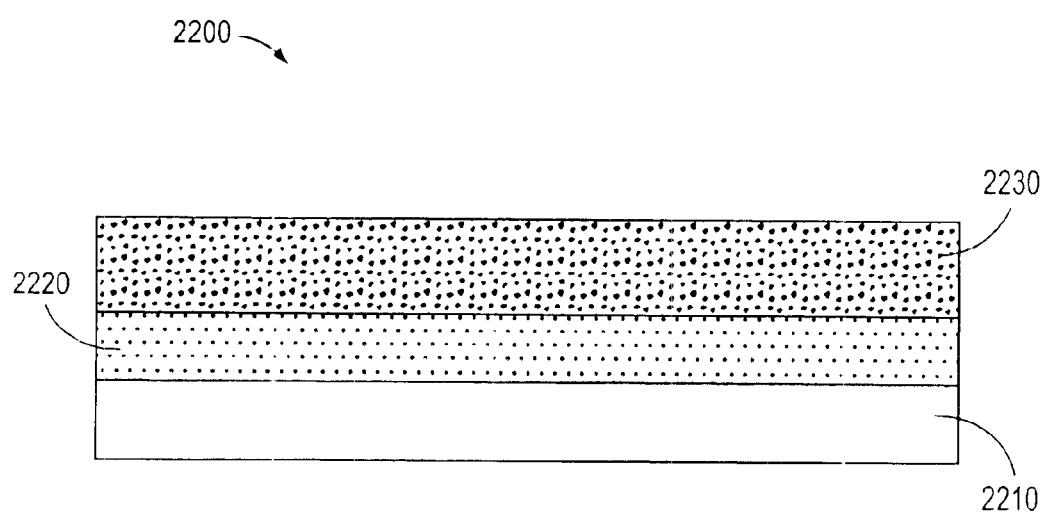
FIG. 22 depicts an illustrative embodiment of the coating of a semiconductor primer layer coating, according to the invention.

In another illustrative embodiment, the invention provides semiconductor oxide materials and methods of coating semiconductor oxide nanoparticle layers on a base material to form DSSCs. FIG. 22 depicts an illustrative embodiment 2200 of the coating process, according to the invention. In this illustrative embodiment a base material 2210 is coated with a first primer layer 2220 of a semiconductor oxide, and then a suspension of nanoparticles 2230 of the semiconductor oxide is coated over the primer layer 2220. The primer layer 2220 may include a vacuum-coated semiconductor oxide film (e.g., a TiO₂ film). Alternatively, the primer layer 2220 may include a thin coating with fine particles of a semiconductor oxide (e.g. TiO₂, SnO₂). The primer layer 2220 may also include a thin layer of a polylinker or precursor solution, one example of which is the titanium (IV) butoxide polymer 1500 shown in FIG. 15 above. According to one illustrative embodiment of the invention, the base material 2210 is the electrically conductive fiber core 102 or 202 or the inner electrical conductor 304 or 404 shown in FIGS. 1–4. Additionally, the base material 2210 is a transparent, conducting, plastic substrate. According to this illustrative embodiment, the suspension of nanoparticles 2230 is the photosensitized interconnected nanoparticle material 112, 212, 312, and 412 of FIGS. 1–4. Numerous semiconducting metal oxides, including $SnO_2$, $TiO_2$, $Ta_2O_5$, $Nb_2O_5$, and ZnO, among others, in the form of thin films, fine particles, or precursor solutions may be used as primer layer coatings using vacuum coating, spin coating, blade coating or other coating methods.

The primer layer 2220 improves the adhesion of nanostructured semiconductor oxide films, like layer 2230, to the base material 2210. Enhancements in the performance of DSSCs with such primer layers have been observed and will be described below. The enhancement arises from an increase in the adhesion between the semiconductor oxide nanoparticles (or photoelectrodes) and the transparent conducting oxide coated plastic substrates, as well as from higher shunt resistance.

Examples of various illustrative embodiments of this aspect of the invention, in the context of a DSSC including a titanium dioxide nanoparticle layer, are as follows.

EXAMPLE 18

Vacuum Coated $TiO_2$ as Prime Layers for Nanoparticle $TiO_2$ Photoelectrodes

In this illustrative example, thin $TiO_2$ films with thicknesses ranging from 2.5 nm to 100 nm were sputter-coated under vacuum on an ITO layer coated on a polyester (here, PET) substrate. A water based $TiO_2$ (P25, with an average particle size of 21 nm) slurry was spin-coated on both the ITO/PET with sputter-coated thin $TiO_2$ and on the plain ITO/PET (i.e., the portion without sputter-coated thin $TiO_2$). The coated films were soaked in poly [$Ti(OBu)_4$] solution in butanol and then heat treated at 120° C. for 2 minutes. The low-temperature reactively interconnected films were placed into an aprotic, polar solvent-based N3 dye solution (8 mM) for 2 minutes. Photovoltaic cells were made with platinum (Pt) counter-electrodes, an $I^-/I_3^-$ liquid electrolyte, 2 mil SURLYN, and copper conducting tapes. I-V characterization measurements were performed with a solar simulator.

Adhesion of nanostructured $TiO_2$ films from the P25 slurry coated on the ITO/PET with sputter-coated, thin $TiO_2$ was superior to films on the plain ITO/PET. Better photovoltaic performance was also observed from the PV cells prepared on the ITO/PET with sputter-coated, thin $TiO_2$ as compared to those on the plain ITO/PET. Improvement on the fill-factor was achieved as well. A FF as high as 0.67 was measured for the photovoltaic cells made on the ITO/PETs with sputter-coated, thin $TiO_2$. For the photovoltaic cells made on the plain ITO/PET, the FF observed was not greater than 0.60. Higher photovoltaic conversion efficiencies (about 17% higher than the photoelectrodes made from the plain ITO/PET) were measured for the photoelectrodes prepared on the ITO/PET with thin sputter-coated $TiO_2$. Improvement in shunt resistance was also observed for the photovoltaic cells made on the ITO/PET with thin sputter-coated $TiO_2$.

EXAMPLE 19

Fine Particles of $TiO_2$ as Primer Layer for $TiO_2$ Suspensions

In this illustrative example, fine particles of $TiO_2$, small enough such that they would stick in the valleys between spikes of ITO on the PET substrate, were prepared by hydrolyzing titanium (IV) isopropoxide. The fine particles were then spin coated at 800 rpm onto the ITO layer. A 37% $TiO_2$ (P25) suspension of approximately 21 nm average particle size was then spin coated at 800 rpm onto the fine particle layer. The coated $TiO_2$ was low temperature interconnected by dipping in 0.01 molar Ti (IV) butoxide polymer in butanol for 15 minutes followed drying on a slide warmer at 50° C. before heating at 120° C. for 2 minutes. The interconnected coating was dyed with N3 dye by dipping into an 8 mM aprotic polar solvent solution for 2 minutes, then rinsed with ethanol and dried on a slide warmer at 50° C. for 2 minutes. Control coatings were prepared in the same way, except without the fine particle prime coat. The cells' performance characteristics were measured using a solar simulator. Results for test and control are listed below in Table 19. Fine particles of tin oxide as primer coating for $TiO_2$ suspensions yielded similar improvements.

TABLE 19

|  | $V_{oc}$ | $I_{sc}$ | η | FF |
|---|---|---|---|---|
| Control | 0.64 | 4.86 | 1.67% | 0.54 |
| Invention | 0.66 | 6.27 | 2.36% | 0.57 |

EXAMPLE 20

Titanium (IV) Butoxide Polymer in Butanol (Precursor Solution) as Primer Layer for $TiO_2$ In another test titanium (IV) butoxide polymer in butanol at 0.01 molar was spin coated on an ITO/PET plastic base at 800 rpm. A 43% $TiO_2$ (P25) suspension of approximately 21 nm average particle size was spin coated at 800 rpm. The coated $TiO_2$ was interconnected at low temperature by dipping in 0.01 M titanium (IV) butoxide polymer in butanol for 15 minutes and then drying on a slide warmer at 50° C. before heating at 120° C. for 2 minutes. The sintered coating was dyed with N3 dye by dipping into an 8 mM aprotic, polar solvent solution for 2 minutes, then rinsed with ethanol and dried on a slide warmer at 50° C. for 2 minutes. Control coatings were prepared in the same way only without the primer layer coating. The I-V properties of the cells were measured with a solar simulator. Results for test and control are listed below in Table 20.

TABLE 20

|  | $V_{oc}$ | $I_{sc}$ | η | FF |
|---|---|---|---|---|
| Control | 0.66 | 7.17 | 2.62% | 0.56 |
| Invention | 0.70 | 8.11 | 3.38% | 0.59 |

EXAMPLE 21

Photovoltaic fiber

Figure 23:
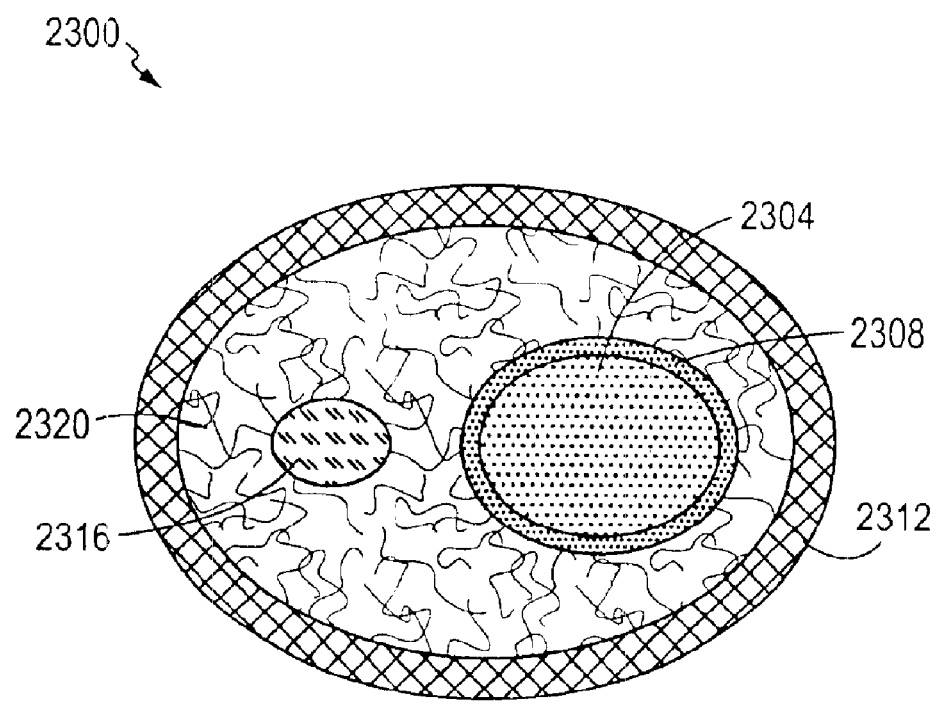
FIG. 23 depicts a cross-sectional view of an exemplary photovoltaic fiber, according to the invention.

FIG. 23 depicts an exemplary photovoltaic fiber 2300. A titanium wire 2304, cleaned in a mixture of hydrofluoric and nitric acids resulting in a micro-grained surface, was coated with a dispersion of $TiO_2$ nanoparticles 2308 (isopropanol-based, 34.9% solids, to which 1 part in 480 of a 0.073% polybutoxytitanate solution in butanol was added). The dispersion was applied to the titanium wire 2304 using a tapered glass applicator of approximately 10 milli inches ("mil") orifice diameter. To improve the integrity of the $TiO_2$ coating 2308 and the ability to handle the coated wire, the $TiO_2$ coating 2308 was sintered at relatively high temperatures (about 450° C.) for 30 minutes. The $TiO_2$ coating 2308 was dye sensitized by immersion in an 8 mM N3-dye solution for two minutes at room temperature, dipping in ethanol for 45 seconds, and air-drying. The titanium wire 2304 with the $TiO_2$ coating 2308 was inserted into a protective layer 2312, which was a TEFLON (available from DuPont) micro-tubing (available from Zeus Industrial Products). A fine platinum wire was also inserted into the protective layer 2312 to serve as the counter electrode 2316. The protective layer 2312 was filled with a liquid electrolyte 2320 to complete the photovoltaic fiber 2300.

A typical dry coverage of $TiO_2$ 2308 on the titanium wire 2304 was 10 mil. The diameter of the titanium wire 2304 was 7.7 mil. The TEFLON micro-tubing protective layer 2312 was 16 mil, although 20 mil tubing also can be used. The platinum wire counter electrode 2316 was 3 mil in diameter. The liquid electrolyte 2320 was a solution of 1 M LiI, 0.05 M iodine, and 1 M t-butylpyridine in methoxypropionitrile. The photovoltaic characteristics were measured in a solar simulator. The range of open circuit voltage, $V_{oc}$ was 0.70 V to 0.73 V, and the range of short circuit current, $I_{sc}$ was 4.1 $mA/cm^2$ to 4.6 $mA/cm^2$. The solar efficiency for a typical cell was 1.53%. Photovoltaic fibers that were fabricated with anodized titanium wires had an average solar efficiency of 2.11%.

The protective layer 2312 is not limited to TEFLON. The protective layer may be any flexible, light-transmissive polymeric material including, but not limited to, mylar polyacrylates, polystyrenes, polyureas, polyurethane, epoxies, and the like. The protective layer 2312 may be coated on the photovoltaic fiber 2300, rather than inserting the elements into the protective layer 2312. Coating methods include, but are not limited to, spraying, dispersing, or dipping the fiber into a protective material to form the protective layer 2312.

While the invention has been particularly shown and described with reference to specific illustrative embodiments, it should be understood that various changes in form and detail may be made without departing from the spirit and scope of the invention as defined by the appended claims. By way of example, any of the disclosed features may be combined with any of the other disclosed features to form a photovoltaic cell, module, or fiber.

What is claimed is:

1. A photovoltaic fiber comprising:
   a fiber core having an outer surface;
   a photosensitized nanomatrix material applied to the outer surface of the fiber core;
   a protective layer, therein disposed the photosensitized nanomatrix material-coated fiber core, a charge carrier material, and a counter electrode,
   wherein the counter electrode comprises at least one electrically conductive wire.

2. The photovoltaic fiber of claim 1, wherein the fiber core is substantially electrically conductive.

3. The photovoltaic fiber of claim 1, wherein the fiber core is substantially electrically insulative and further comprises an inner electrical conductor disposed on the electrically insulative fiber core.

4. The photovoltaic fiber of claim 1, wherein the protective layer comprises a flexible polymeric material.

5. The photovoltaic fiber of claim 1, wherein the photosensitized nanomatrix material comprises nanoparticles.

6. The photovoltaic fiber of claim 5, wherein the nanoparticles are selected from the group consisting of titanium oxides, zirconium oxides, zinc oxides, tungsten oxides, niobium oxides, lanthanum oxides, tin oxides, terbium oxides, tantalum oxides, and one or more combinations thereof.

7. The photovoltaic fiber of claim 1, wherein the charge carrier material comprises a redox electrolyte.

8. The photovoltaic fiber of claim 1, wherein the at least one electrically conductive wire comprises a material selected from the group consisting of copper, silver, gold, platinum, nickel, palladium, iron, and alloys thereof.

9. The photovoltaic fiber of claim 1, wherein the at least one electrically conductive wire comprises platinum.

10. The photovoltaic fiber of claim 1, wherein the fiber core has a glass transition temperature less than about 300° C.

11. The photovoltaic fiber of claim 10, wherein the fiber core has a glass transition temperature ranging from about 25° C. to about 150° C.

12. The photovoltaic fiber of claim 1, wherein the fiber core has a diameter of less than about 250 $\mu$m.

13. The photovoltaic fiber of claim 12, wherein the fiber core has a diameter of less than about 125 $\mu$m.

14. The photovoltaic fiber of claim 1, wherein the fiber core comprises a flexible polymeric material.

15. The photovoltaic fiber of claim 14, wherein the fiber core comprises a polyethylene terephthalate.

16. The photovoltaic fiber of claim 1, wherein the fiber core comprises one or more materials selected from the group consisting of flax, cotton, wool, silk, nylon, and combinations thereof.

17. The photovoltaic fiber of claim 2, wherein the fiber core comprises a material selected from the group consisting of metals, metal oxides, metal alloys, conductive polymers, filled polymers, and combinations thereof.

18. The photovoltaic fiber of claim 1, wherein the photosensitized nanomatrix material further comprises a photosensitizing agent.

19. The photovoltaic fiber of claim 18, wherein the photosensitizing agent comprises a dye.

20. The photovoltaic fiber of claim 18, wherein the photosensitizing agent comprises an organic molecule selected from the group consisting of xanthines, cyanines, merocyanines, phthalocyanines, and pyrroles.

21. The photovoltaic fiber of claim 1, wherein the photosensitized nanomatrix material comprises particles with an average size in the range of about 2 nm to about 100 nm.

22. The photovoltaic fiber of claim 21, wherein the photosensitized nanomatrix material comprises particles with an average size in the range of about 10 nm to about 40 nm.

23. The photovoltaic fiber of claim 6, wherein the metal oxide comprises $TiO_2$.

24. The photovoltaic fiber of claim 6, wherein the metal oxide nanoparticles are interconnected by sintering.

25. The photovoltaic fiber of claim 6, wherein the metal oxide nanoparticles are interconnected by a polymeric linking agent.

26. The photovoltaic fiber of claim 25, wherein:
   the polymeric linking agent has the formula $-[O-M(OR)_i-]_m-$;
   M is selected from the group consisting of Ti, Zr, W, Nb, La, Ta, Tb, Sn, and Zn;
   R is selected from the group of chemical moieties consisting of acetate, alkyl, alkene, alkyne, aromatic, acyl, and hydrogen;
   i is an integer greater than 0; and
   m is an integer greater than 1.

27. The photovoltaic fiber of claim 26, wherein the polymeric linking agent comprises poly(n-butyl titanate).

28. An article of manufacture comprising the photovoltaic fiber of claim 1.

29. A flexible fabric comprising the photovoltaic fiber of claim 1.

30. A photovoltaic fiber comprising:
 a fiber core;
 a photosensitized nanomatrix material disposed over the fiber core;
 a protective layer, therein disposed the photosensitized nanomatrix material-coated fiber core, a charge carrier and a counter electrode,
 wherein the fiber core is substantially electrically insulative and further comprises an inner electrical conductor disposed on the electrically insulative fiber core.

* * * * *